(12) United States Patent
Hayashi et al.

(10) Patent No.: US 9,142,579 B2
(45) Date of Patent: Sep. 22, 2015

(54) PHOTOELECTRIC CONVERSION CELL AND ARRAY, RESET CIRCUIT AND ELECTRICAL SIGNAL SENSE CONTROL CIRCUIT THEREFOR

(75) Inventors: Yutaka Hayashi, Tsukuba (JP); Yasushi Nagamune, Tsukuba (JP); Toshitaka Ota, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 265 days.

(21) Appl. No.: 13/811,623

(22) PCT Filed: Jul. 22, 2011

(86) PCT No.: PCT/JP2011/066753
§ 371 (c)(1),
(2), (4) Date: Jan. 22, 2013

(87) PCT Pub. No.: WO2012/011585
PCT Pub. Date: Jan. 26, 2012

(65) Prior Publication Data
US 2013/0119240 A1 May 16, 2013

(30) Foreign Application Priority Data
Jul. 22, 2010 (JP) ................ 2010-164791

(51) Int. Cl.
*H01J 40/14* (2006.01)
*H01L 27/146* (2006.01)
(Continued)

(52) U.S. Cl.
CPC ...... *H01L 27/14609* (2013.01); *H01L 27/1446* (2013.01); *H01L 31/101* (2013.01); *H01L 31/103* (2013.01); *H04N 5/361* (2013.01)

(58) Field of Classification Search
CPC .......... H01L 27/146; H01L 31/101; H01L 27/14609; H01L 27/14636; H01L 27/1446; H01L 31/103; H01L 31/035227; H01L 31/075; H04N 5/37

USPC ........ 250/214 R, 214.1, 208.1; 348/302–311, 348/241, 294; 257/290–292, 440
See application file for complete search history.

(56) References Cited

U.S. PATENT DOCUMENTS 6,300,615 B1   10/2001   Shinohara et al.
6,507,519 B1   1/2003    Collins et al.
(Continued)

FOREIGN PATENT DOCUMENTS

JP   60-198959 A   10/1985
JP   1-288181 A    11/1989
(Continued)

OTHER PUBLICATIONS

J.S. Brugler et al., "Integrated Electronics for a Reading Aid for the Blind", IEEE Journal of Solid-State Circuits, vol. SC-4, No. 6, Dec. 1969, pp. 304-312.

(Continued)

*Primary Examiner* — Que T Le
(74) *Attorney, Agent, or Firm* — Westerman, Hattori, Daniels & Adrian, LLP

(57) ABSTRACT

In order to achieve a photoelectric conversion cell and an array of high sensitivity and high dynamic range, there is a need for a photoelectric conversion cell and an array in which combination of an amplified photoelectric conversion element and a selection element are resistant to external noise, and the combination is resistant to effects from address selection pulse noise at array readout time. In the present invention, in order to solve the problem, a photoelectric conversion cell has been configured with a combination of an amplified photoelectric conversion element (100) and a selection element (10 and the like) which are resistant to external noise, and various means of solution of the combination are provided which are resistant to the effects of address selection pulse noise at array readout time. As a result, a dynamic range of 6 to 7 orders of magnitude for light detection has become possible.

23 Claims, 24 Drawing Sheets

(51) Int. Cl.
  *H01L 27/144* (2006.01)
  *H01L 31/103* (2006.01)
  *H04N 5/361* (2011.01)
  *H01L 31/101* (2006.01)

(56) References Cited

U.S. PATENT DOCUMENTS

| | | | |
|---|---|---|---|
| 7,592,576 B1 * | 9/2009 | Hayashi et al. | 250/208.1 |
| 2001/0015404 A1 | 8/2001 | Takada et al. | |

FOREIGN PATENT DOCUMENTS

| | | |
|---|---|---|
| JP | 2-121580 A | 5/1990 |
| JP | 2-155363 A | 6/1990 |
| JP | 5-102453 A | 4/1993 |
| JP | 8-191143 A | 7/1996 |
| JP | 11-266399 A | 9/1999 |
| JP | 2000-77644 A | 3/2000 |
| JP | 2001-230399 A | 8/2001 |
| JP | 2003-526957 A | 9/2003 |
| JP | 2010-34872 A | 2/2010 |

OTHER PUBLICATIONS

P.K. Weimer et al., "Phototransistor Arrays of Simplified Design", IEEE Journal of Solid-State Circuits, Jun. 1971, pp. 135-136.
International Search Report for PCT/JP2011/066753, mailing date of Aug. 23, 2011.
Japanese Office Action dated Feb. 12, 2014, issued in corresponding Japanese Patent Application No. 2010-164791 with English translation (5 Pages).
Extended European Search Report dated Feb. 21, 2014, issued in corresponding European Patent Application No. 11809755.9 (7 pages).
Communication pursuant to Article 94(3) EPC dated Jun. 30, 2015, issued in counterpart European Patent Application No. 11 809 755.9 (7 pages).

* cited by examiner

PHOTOELECTRIC CONVERSION CELL AND ARRAY, RESET CIRCUIT AND ELECTRICAL SIGNAL SENSE CONTROL CIRCUIT THEREFOR

TECHNICAL FIELD

The present invention relates to a photoelectric conversion cell that converts light into an electrical signal, and an array that employs the cells. The present invention also relates to a reading method of the cells and array.

BACKGROUND ART

In order to read image information from a two-dimensional array of conventional phototransistors, each phototransistor serving as a pixel has an emitter connected to a word line, and a collector connected to a bit line and to a load resistor as illustrated in FIG. 1, and the image information is read from a change of a potential of the collector connected to a load resistor (FIG. 1 is quoted from FIG. 5 in Patent Document 1). A time delay in reading calculated from collector-base capacitance and a load resistance is increased due to the Miller effect, in which a collector potential changes in response to an output signal. A time delay in reading is further caused by stray capacitances between the collector and each of a substrate and an isolation region. A dark current of the phototransistor equivalently increases with a leak current flowing between the collector and each of the substrate and a leak current between the collector and the isolation region being added. A voltage change in the reading operation of a selected phototransistor connected to a bit line is directly applied to a collector of a deselected phototransistor connected to the same bit line, and the deselected phototransistor is disturbed each time another transistor connected to the same bit line is read. For this reason, there has been a limitation to precision detection free from mutual pixel interference and information detection at low illuminance level.

The structure that needs the collector to be isolated from the substrate in this way is hard to make the collector to be sufficiently thick in a direction of the depth of the collector. Then, it is very difficult to realize high sensitivity down to a wavelength corresponding to near the band gap energy of the semiconductor forming collector by using the semiconductor, such as silicon, having a small light-absorption coefficient in the infrared region.

On the other hand, a one-dimensional linear array technique has been disclosed where each of collectors of an one-dimensional bipolar transistor switch array 48 is connected to turns on and off each of collectors of the phototransistors comprising pixels of an one-dimensional phototransistor array 49 as illustrated in FIG. 2, and a series of photocurrents are read from the emitters of the phototransistors commonly connected within the one-dimensional array (FIG. 5 of Patent Document 1 is quoted, and the reference numerals thereof not necessary in the discussion here are deleted). In this related art example, the collector of the phototransistor is in a floating potential state while being connected to the switch in an off state. If the collector of another phototransistor is connected to the collector, a floating potential interacts with a storage state of optical information of the other phototransistor, causing a disturbance. If the array originally not intended for a two-dimensional array is attempted to be two-dimensional arrayed by merely connecting a plurality of collectors in a two-dimensional arrangement, a two-dimensional array with small mutual interference in pixel information is difficult to realize.

Patent Document 1 also discloses a one-dimensional sensor array technique as illustrated in FIG. 3 (FIG. 6 in Patent Document 1 is quoted, and reference numerals that are not necessary in the discussion herein are omitted), where each collector of a bipolar transistor switch one-dimensional array that turn on and off individual emitter of the phototransistors serving as pixels of a phototransistor one-dimensional array 53 is respectively connected to each emitter of the phototransistors and a photocurrent is read from the collectors of the phototransistors commonly connected within the one-dimensional array. In this related art example, a two-dimensional array version is not originally intended. When the emitter of a phototransistor is connected to the switch that is in an off state, the emitter remains in a floating potential state. If an emitter of another phototransistor is connected to the emitter in an attempt to design a two-dimensional array, the floating potential interacts with a storage state of optical information of the other phototransistor, causing a disturbance. If a plurality of the emitters in the one-dimensional array merely connected, a two-dimensional array with small mutual interference in pixel information is difficult to realize.

Even if a two-dimensional array is designed in accordance with the technique disclosed in Patent Document 1, there is a limitation to precision detection free from mutual pixel interference and to pixel information detection at low illuminance level.

Furthermore, the collectors need to be isolated from a substrate at least on a per row basis or on a per column basis to connect loads to the collectors, or to drive the collectors individually, by row or by column. To this end, this technique needs many different-natured processes including a buried layer diffusion process, an epitaxial growth process, an isolation process, which are different from MOSLSI processes. If a peripheral circuit such as a address selection circuit is implemented using MOSLSI, the technique is not advantageous in terms of quality and number of the manufacturing processes.

An array structure as illustrated in FIG. 4 is disclosed. In the disclosed structure, a pixel is formed by coupling an electric capacitance with a base of an individual transistor, the address selection is performed by a pulse applied to the base via the electric capacitance and an emitter potential change, and the collector of a phototransistor is at a common potential (FIG. 4 is cited from FIG. 1(a) of Non-patent Document 2). However, this technique also causes a disturbance to all deselected pixels having the electric capacitance connected to the one address selection line. There is still a limitation on the detection of an image signal at low illuminance level.

The address selection method by the electric capacitance coupled with the base is also disclosed in FIG. 1, FIG. 2, FIG. 3, FIG. 12, FIG. 17, FIG. 20, FIG. 21, and FIG. 33 of Patent Document 2.

FIG. 5 illustrates a phototransistor one-dimensional array disclosed in FIG. 1 (reference numerals and the like not necessary in the discussion are deleted) of Patent Document 3. Emitters of phototransistors $1a$, $1b$, ..., $1f$ of the one-dimensional array are connected to drains of reading switch FET $2a$, $2b$, ..., $2f$, and charging switch FET $3a$, $3b$, ..., $3f$. Sources of the charging switch FETs are connected together to a re-charging voltage $V_{BB}$. As lines 3 through 5 on the lower portion of the left column on page 2 of the specification reads "the recharging switch is kept to elapse one clock time or longer after a reading operation", even the linear sensor needs two selection wiring lines for one pixel.

In the related art technique, noise by an address selection pulse to be applied to the gates of FET 2 and FET 3 is superposed to an image signal output terminal 4 via gate-source capacitance of the FETs in the same sign as that of the image signal, and a low-illuminance image signal is hidden in the noise. Patent Document 3 fails to disclose connection for a two-dimensional array, a combination of FETs, the number of wiring lines per pixel, a recharge switch operation phase, etc. If a two-dimensional array is assembled in accordance with the related art technique, the address selection noise gives a limitation on the detection of a low-illuminance level image signal.

FIG. 6 illustrates a phototransistor one-dimensional array having an analog switch for selection of each pixel disclosed in FIG. 1 (reference numerals not necessary in the discussion here are deleted) of Patent Document 4. The analog switch needs to apply to the gate thereof both a pulse transitioning in a positive direction and a pulse transitioning in a negative direction, a pulse noise having the same sign as a read signal is definitely applied via gate-source capacitance in the same sign as an image signal, and a low-illuminance level signal is hidden in the noise. Furthermore, if a potential of a signal output line changes, a potential in the pixel also changes. This not only restricts the operation of a circuit connected to the signal output line, but also causes the noise on the signal output line to enter into the pixel. Also, besides a signal reading line, two wiring lines become necessary on each pixel for cell selection. Since the disclosed phototransistor one-dimensional array does not have a pixel architecture that is intended to be applied into a two-dimensional array, the phototransistor one-dimensional array is not appropriate as a candidate for a pixel architecture for the two-dimensional array.

RELATED ART DOCUMENTS

Patent Documents

Patent Document 1: Japanese Unexamined Patent Application Publication No. 60-198959 "Image Sensor"
Patent Document 2: Japanese Unexamined Patent Application Publication No. 8-191143 "Photoelectric Conversion Device"
Patent Document 3: Japanese Unexamined Patent Application Publication No. 2-155363 "Image Sensor"
Patent Document 4: Japanese Unexamined Patent Application Publication No. 1-288181 "Semiconductor Image Sensor Device"

Non-Patent Documents

Non-patent Document 1: J. S. Brugler et al. "Integrated Electronics for a Reading Aid for the Blind", IEEE Journal of Solid-State Circuits, Vol. SC-4, No. 6, p. 304-312, December 1969.
Non-patent Document 2: P. K. Weimer et al. "Phototransistor Array of Simplified Design", p. 135, IEEE Journal of Solid-State Circuits, June 1971

SUMMARY OF INVENTION

Problems to be Solved by the Invention

The present invention addresses to solve at least one of the following issues in the related art:
A) Prevention of an increase in the reading delay caused by the collector-base capacitance and further by Miller effect of the collector-base capacitance
B) Improvements in the reading delay caused by stray capacitance between the collector and the isolation region and between the collector and the substrate
C) Reduction of the increase in an equivalent dark current caused by a leakage current between the collector and each of the isolation region and the substrate
D) Reduction of the number of manufacturing process steps and time involved in the manufacturing process In particular, reduction of the number of manufacturing process steps added to the MOSLSI process but different in nature from the MOSLSI process, such as isolation process of a buried layer and a collector region, when pixels or a two-dimensional array thereof are manufactured in the MOSLSI process
E) Improvements in the wavelength sensitivity close to band gap energy of the semiconductor forming the collector
F) High sensitivity pixels even at low illuminance level and a two-dimensional array thereof
G) Improvements in the effect of the selection pulse nose to a pixel of interest or another pixel in the two-dimensional array
H) Control of disturbances including a voltage variation given to a reading pixel or to another pixel in response to a noise and a voltage variation on the signal output line during reading
I) Prevention of disturbance in read information of the pixel caused by a reading history of another pixel
J) Two-dimensional array having improved dynamic range of the read signal Means for Solving the Problems According to the present invention, to solve the above issues, a photoelectric conversion cell is arranged in the present invention by the combination of a photoelectric conversion element and a selection element by which invasion of external noise into the photoelectric conversion cell is made difficult. By the above arrangements a variety of solving means insusceptible to address selection pulse nose during array reading will be provided. The present invention provides means satisfying at least one of 1) through 8) below or the combinations 1) through 8).

1) To solve at least one of the issues A)-E), a photoelectric conversion cell has an architecture where a first electrical signal output section of a photoelectric conversion element having the first electrical signal output section and second electrical signal output section is arranged in a common region, and the second electrical signal output section side performs address selection, and from the same output side, an electrical signal is taken out.

For example, if the photoelectric conversion element is a phototransistor, the photoelectric conversion cell is arranged such that the emitter side (the second electrical signal output section) performs the address selection, and the electrical signal is output from the emitter side. As a result, separation of collectors (the first electrical signal output sections) of the individual photoelectric conversion elements becomes unnecessary. If the photoelectric conversion element is a phototransistor, the collectors may be formed in a common region by column or by row in a substrate. Depending on an array structure, the entire array portion excluding a peripheral circuit may be formed in the common region in a substrate. Since the thickness of the common region or the substrate may be increased, up to long wavelength light may be detected. If most of the collectors of the photoelectric conversion elements in the array are not isolated from each other, an array density can be increased. If the common region is formed by pn junction isolation or dielectric isolation from the substrate, blooming between pixels is reduced.

2) To solve the issue F), a photoelectric conversion element having an amplification function is used. For example, a photoelectric conversion element may be used which includes a phototransistor, or a phototransistor and an amplification element such as a transistor that amplifies an electrical output of the phototransistor.

3) To solve at least one of the issues F)-H), the photoelectric conversion cell is structured so that a cell selection element controlling the potential of the second electrical signal output section during reading is connected to the second electrical signal output section of the photoelectric conversion element. The word "connected" includes the case that the cell selection element is connected to the second electrical signal output section via another element. In the following discussion of the present invention, the photoelectric conversion cell is also simply referred to as the cell.

For example, if a bipolar transistor is used as a cell selection element and if the photoelectric conversion element is a phototransistor, the emitter of the bipolar transistor is connected to the emitter of the phototransistor. If the cell selection element is a field-effect transistor, the source thereof is connected to the emitter of the phototransistor.

With this cell architecture, a cell selection pulse as a field-through noise between the base and the collector or between the gate and the drain superimposing on a read electrical signal becomes opposite in sign to the read electrical signal. For this reason, drive noise and the read electrical signal are easily separated.

4) In this example, a cell includes a photoelectric conversion element (such as a phototransistor) and a cell selection element in the present invention. The cell corresponds to the pixel.

A two-dimensional array of the present invention is constructed by two-dimensionally arranging the cells of the present invention. An electrical signal reading line of the two-dimensional array connects to a collector or a drain of a selection element of each cell, and the disturbing effect of a voltage change in the electrical signal reading line on a cell internal potential is reduced.

5) The electrical signal corresponding to light intensity from the cell is read in the form of current. As a result, the dynamic range of the read electrical signal becomes larger (possible up to 6 to 7 orders of magnitude) than that in voltage reading such as of CMOS sensor. Even if the potential of the electrical signal reading line changes, a read current value is not affected greatly.

6) In summary, to solve the issue I), the electrical signal reading line connects to a reset circuit or an electrical signal sense control circuit that controls the potential of the electrical signal reading line when the electrical signal reading line is deselected or during latter half of the reading period.

7) To ensure a read speed at a low illuminance level (J), an array adopting a control method that concurrently reads signals from a plurality of electrical signal reading lines is provided.

8) To ensure a low-illuminance sensitivity F), a dark current compensation cell is arranged in the array of the present invention to compensate an electrical signal read from another cell.

More specifically, the means described below are provided.

A photoelectric conversion cell A1 is provided. The photoelectric conversion cell A1 includes, at least, a photoelectric conversion element having an amplification function, and a first transistor.

The photoelectric conversion element includes a first electrical signal output section and a second electrical signal output section.

The first transistor includes a first output section, a second output section, and a third control section that controls a current flowing between the first output section and the second output section or resistance between the first output section and the second output section.

The second electrical signal output section of the photoelectric conversion element has to the first electrical signal output section a potential difference polarity that permits conduction of an electrical signal current from or to the first electrical signal output section and another potential difference polarity that permits less conduction of the electrical signal current from or to the first electrical signal output section.

The current flowing between the first output section and the second output section or the resistance between the first output section and the second output section is mainly controlled by a voltage or a current between the third control section and the second output section.

The second electrical signal output section is connected to the second output section, and the first output section serves as a first cell output section.

The third control section serves as a first cell selection section.

An electrical signal of the photoelectric conversion cell is read from the first cell output section by driving the first cell selection section to a potential direction of the potential difference polarity that permits conduction of the electrical signal current, and the electrical signal of the photoelectric conversion cell is blocked from the first cell output section by driving the first cell selection section to a direction opposite to the potential direction of the potential difference polarity that permits conduction of the electrical signal current.

The sentence reading "the electrical signal of the photoelectric conversion cell is blocked from the first cell output section" in the present invention is intended to mean that the first transistor is set to be in a high resistance state so that an electrical signal of the photoelectric conversion cell is not read from the first cell output section. In that case, a leakage current through the first transistor not high enough to cause a large effect on the array operation to be discussed later is acceptable.

The first transistor serves as the cell selection element.

In case to make an array by this cell, the first output section is connected to the electrical signal reading line.

Employed in the present invention is a photoelectric conversion element that may amplify a photocurrent to achieve a high sensitivity at a low illuminance level or may read as a current a charge (accumulated charge) charged or discharged through the photocurrent. This photoelectric conversion element is referred to as "the photoelectric conversion element having the amplification function." For example, a phototransistor or the phototransistor with a bipolar transistor connected thereto to provide a current amplification function may be used. Further, a combination of a photoresistor having resistance varying in response to light irradiation and a diode or a bipolar transistor may be used. A combination of a photo field-effect transistor with a gate threshold voltage or a drain-source current changing in response to light irradiation may be used, or a combination of a field-effect transistor with a gate potential thereof changing with respect to a reference potential in response to light irradiation and, if necessary, a diode may be used.

"The potential direction of the potential difference polarity that permits conduction of the electrical signal current" in the present invention is described as below. If the photoelectric conversion element forming a cell is a phototransistor, the second electrical signal output section is the emitter of the phototransistor. In the present invention, a potential change that causes the emitter-base junction to be in a forward bias direction is referred to as "the potential direction of the potential difference polarity that permits conduction of the electrical signal current." Furthermore, if the second electrical signal output section of the photoelectric conversion element forming the cell is a diode, a potential change that causes the diode to be in a forward direction is referred to as "the potential direction of the potential difference polarity that permits conduction of the electrical signal current." If the second electrical signal output section of the photoelectric conversion element forming the cell is a source of a field-effect transistor, a potential change that changes in the same direction as the conductivity type of the source or channel (a negative direction in n-type) is referred to as "the potential direction of the potential difference polarity that permits conduction of the electrical signal current." The potential is meaningful in a change direction thereof rather than in an absolute value thereof.

FIG. 7 is a circuit diagram of the cell A1.

The second electrical signal output section 102 of a photoelectric conversion element 100 is connected to the second output section 12 of a first transistor 10, and a first output section 11 of the first transistor 10 becomes a first cell output section. When a two-dimensional array is constructed using the cell, a third control section 13 of the first transistor serving as a first cell selection section of the cell is connected to a first selection line 14, and the first cell output section is connected to a first output line 15 corresponding to the electrical signal reading line.

The second electrical signal output section 102 of the photoelectric conversion element 100 has to the first electrical signal output section 101 a potential difference polarity that permits conduction of a photocurrent or a current resulting from amplifying the photocurrent (hereinafter collectively referred to as an "electrical signal current") to the first electrical signal output section 101 and another potential difference polarity that permits less conduction of the electrical signal current from or to the first electrical signal output section 101. During cell selection, the cell A1 is read by driving the first cell selection section (=the third control section 13 of the first transistor 10) from a first selection potential to a second selection potential, i.e., a potential direction of the potential difference polarity that permits conduction of the electrical signal current, and the photoelectric conversion element 100 is electrically blocked from the first output line 15 (the first output line 15, a second output line 17 to be discussed later, and the third output line 18 being one of the "electrical signal reading lines") by driving the first cell selection section to the first direction, i.e., as the opposite direction (to the degree that a leakage current not high enough to cause a large effect on the array operation to be discussed later is acceptable). The first electrical signal output section 101 is connected to a first bias potential. The first electrical signal output section 101 is typically commonly shared by another cell.

When the third control section 13 of the first transistor 10 is driven to the second selection potential, the potential of the second electrical signal output section of the photoelectric conversion element 100 is read at a second cell potential determined by the second selection potential. A difference between the second cell potential and the second selection potential during reading is a base-emitter voltage Vbe1 if the first transistor 10 is a bipolar transistor, and is a gate-source voltage Vgs1 if the first transistor 10 is a field-effect transistor (FET). The value of the difference changes slightly depending on a read current, but is less susceptible to a voltage change of the first output line 15 that connects to the first cell output section. This advantage is particularly pronounced in the vicinity of a saturation region (a region of constant-current output characteristics) if the first transistor 10 is a field-effect transistor, and in the vicinity of an active region (a region of constant-current output characteristics) if the first transistor 10 is a bipolar transistor.

For this reason, the cell A1 having the architecture of the present invention or the reading method controls the second cell potential, thereby providing an excellent reading accuracy and being less susceptible to the effect of the voltage change on the first output line 15. During reading, the read value is less likely to suffer from disturbances from the first output line 15 including a noise superimposed on the first output line 15, a voltage variation in a sense circuit and the like connected to the first output line 15, and other factors. Since the electrical signal current of the photoelectric conversion element 100 flowing to the first output line 15 during the reading is opposite in direction to a feed through current flowing to the first output line 15 when the first selection line 14 is driven to the second selection potential (the feed through current is one of the selection pulse noises and a transient current flowing from the third control section 13 to the first output line 15 via parasitic capacitance therebetween in response to a pulse applied to the third control section 13), it is easy to separate the signal from the noise caused by the selection pulse.

When the read current of the electrical signal becomes lower, resistance of the first transistor 10 viewed from the second electrical signal output section 102 of the photoelectric conversion element 100 becomes higher. If the reading period is short, the reading operation ends before the potential of the second electrical signal output section 102 settles to a constant value, and the potential is not sufficiently reset to an initial value. For this reason, dynamic characteristics are degraded.

To solve this problem, a potential Vout1 of the first output line 15 (=a first cell output potential) is set to be "a potential closer to the first selection potential side than a voltage (Vselect2−Vth1)" at least at the end of the reading operation of each cell A1 or in the latter half of the reading operation if the first transistor 10 is a field-effect transistor. In this way, the potential is sufficiently reset each time the reading operation ends. Here, Vselect2 represents the second selection potential of the first selection line 14 (=a second selection potential of the first cell selection section), and Vth1 represents a gate threshold voltage of the first transistor, and is negative in a p-channel and positive in an n-channel.

It is noted that a current-reading type sense amplifier is connected to the first output line 15, that the sense amplifier has a signal input and a reference potential input, and that "the potential closer to the first selection potential side than a voltage (Vselect2−Vth1)" is connected to the reference potential input. In the voltage setting with the first transistor 10 being a field-effect transistor, an operating point of the transistor shifts from the saturation region to the triode region (non-saturation region). Even in such a case, the effect of a potential variation of the first output line 15 during the reading of the electrical signal on a potential change in the photoelectric conversion cell A1 is still small.

In order to construct a two-dimensional array from the photoelectric conversion cell A1, first cell selection sections of a plurality of, i.e., X photoelectric conversion cells A1 are connected to the first selection line 14 in a first direction, and a plurality of, i.e., Y first selection lines 14 extending in the first direction, each connected to the X photoelectric conversion cells A1, are arranged in a second direction intersecting the first direction. The first cell output sections of photoelectric conversion cells A1 adjacent to each other in the second direction are connected together in the second direction to one of the first output lines 15. To read the two-dimensional array, one of the first selection lines 14 extended in the first direction and arranged in the second direction is selected and one of the plurality of first output lines 15 is further selected to identify an address (x,y).

If one first selection line 14 is selected and is driven by the second selection potential subsequent to the first selection potential, electrical signals from all the photoelectric conversion cells A1 connected to that first selection line 14 are read via the plurality of first output lines 15 connected to those photoelectric conversion cells A1. Preferably, a plurality of sense amplifiers are respectively connected to all the first output lines 15 (to read in parallel), and the outputs thereof are scanned. If the sense amplifier is not a current-detecting type but a charge-detecting or voltage-detecting type, the first output lines 15 may be successively connected one by one to one or a small number of sense amplifiers, and a scanned output is obtained from the one or the small number of sense amplifiers.

In place of the above photoelectric conversion cell, the present invention provides photoelectric conversion cells B1 and B2 (the two photoelectric conversion cells are collectively referred to as a photoelectric conversion cell B). In the photoelectric conversion cell B, at least one or, if necessary, a plurality of second output lines 17 are successively connected to two-dimensional photoelectric conversion cells to read the two-dimensional photoelectric conversion cells.

The photoelectric conversion cell B1 further includes a second transistor in the photoelectric conversion cell A1.

The photoelectric conversion cell B1 includes, at least,
a photoelectric conversion element having an amplification function,
a first transistor, and the second transistor.

The photoelectric conversion element includes a first electrical signal output section and a second electrical signal output section.

The first transistor includes a first output section, a second output section, and a third control section that controls a current flowing between the first output section and the second output section or resistance between the first output section and the second output section.

The second transistor includes a fourth output section, a fifth output section, and a sixth control section that controls a current flowing between the fourth output section and the fifth output section or resistance between the fourth output section and the fifth output section.

The second electrical signal output section of the photoelectric conversion element has to the first electrical signal output section a potential difference polarity that permits conduction of an electrical signal current from or to the first electrical signal output section and another potential difference polarity that permits less conduction of the electrical signal current from or to the first electrical signal output section.

The current flowing between the first output section and the second output section in the first transistor or the resistance between the first output section and the second output section in the first transistor is mainly controlled by a voltage or a current between the third control section and the second output section.

The second electrical signal output section is connected to the second output section of the first transistor.

The fifth output section of the second transistor is connected to the first output section of the first transistor.

The fourth output section of the second transistor serves as a second cell output section.

The third control section of the first transistor serves as a first cell selection section.

The sixth control section of the second transistor serves as a second cell selection section.

The second cell selection section is driven to a potential direction in which the second transistor becomes conductive.

An electrical signal of the photoelectric conversion cell is read from the second cell output section by driving the second cell selection section to a potential direction in which the second transistor becomes conductive and the first cell selection section to a potential direction of the potential difference polarity that permits conduction of the electrical signal current.

The electrical signal of the photoelectric conversion cell is blocked from the second cell output section by driving the first cell selection section to a direction opposite to the potential direction of the potential difference polarity that permits conduction of the electrical signal current, or the electrical signal of the photoelectric conversion cell is blocked from the second cell output section regardless of the potential of the first cell selection section by driving the second cell selection section in a potential direction that causes the second transistor to be non-conductive.

The object of the present invention may be achieved by the photoelectric conversion cell B2 which results from interchanging the first transistor and the second transistor in position in the photoelectric conversion cell B1. More specifically, the photoelectric conversion cell B2 includes, at least, a photoelectric conversion element having an amplification function, a first transistor, and a second transistor.

The photoelectric conversion element includes a first electrical signal output section and a second electrical signal output section.

The first transistor includes a first output section, a second output section, and a third control section that controls a current flowing between the first output section and the second output section or resistance between the first output section and the second output section.

The second transistor includes a fourth output section, a fifth output section, and a sixth control section that controls a current flowing between the fourth output section and the fifth output section or resistance between the fourth output section and the fifth output section.

The second electrical signal output section of the photoelectric conversion element has to the first electrical signal output section a potential difference polarity that permits conduction of an electrical signal current from or to the first electrical signal output section and another potential difference polarity property that permits less conduction of the electrical signal current from or to the first electrical signal output section.

The current flowing between the first output section and the second output section in the first transistor or the resistance between the first output section and the second output section in the first transistor is mainly controlled by a voltage or a current between the third control section and the second output section.

The second electrical signal output section is connected to the fourth output section of the second transistor.

The second output section of the first transistor is connected to the fifth output section of the second transistor.

The first output section of the first transistor serves as a second cell output section.

The third control section of the first transistor serves as a first cell selection section.

The sixth control section of the second transistor serves as a second cell selection section.

An electrical signal of the photoelectric conversion cell is read from the second cell output section by driving the second cell selection section is to a potential direction in which the second transistor becomes conductive and the first cell selection section to a potential direction of the potential difference polarity that permits conduction of the electrical signal current.

The electrical signal of the photoelectric conversion cell is blocked from the second cell output section by driving the first cell selection section to a direction opposite to the potential direction of the potential difference polarity that permits conduction of the electrical signal current, or the electrical signal of the photoelectric conversion cell is blocked from the second cell output section regardless of the potential of the first cell selection section by driving the second cell selection section to a potential direction that causes the second transistor to be non-conductive.

The sentence reading "the electrical signal of the photoelectric conversion cell is blocked from the second cell output section" in the present invention is intended to mean that the first transistor or the second transistor is set to be in a high resistance state so that an electrical signal of the photoelectric conversion cell is not read from the second cell output section. In that case, a leakage current through the first and second transistors not high enough to cause a large effect on the array operation to be discussed later is acceptable.

FIG. 8 is a circuit diagram of the photoelectric conversion cell B1.

The second electrical signal output section 102 of the photoelectric conversion element 100 is connected to the second output section 12 of the first transistor 10, the fifth output section 25 of a second transistor 20 is connected to the first output section 11 of the first transistor 10, and a fourth output section 24 becomes the second cell output section of the photoelectric conversion cell B1.

It is noted that the first electrical signal output section 101 of the photoelectric conversion element 100 is supplied with a first cell bias 2010.

If a two-dimensional array is constructed using the photoelectric conversion cell B1, the third control section 13 of the first transistor 10 is connected as the first cell selection section of the photoelectric conversion cell B1 to the first selection line 14, the sixth control section 26 of the second transistor 20 is connected as a second cell selection section of the photoelectric conversion cell B1 to a second selection line 16, and the fourth output section 24 is connected to a second output line 17 of the array.

In one array structure, one second output line 17 may be connected to all the second cell output sections of the photoelectric conversion cells B1 needed in the array. Optionally, a plurality of second output lines 17 may be used to be respectively connected to the second cell output sections of each groups of photoelectric conversion cells B1 (for example, for every two columns of the photoelectric conversion cells B1).

The second electrical signal output section 102 of the photoelectric conversion element 100 has to the first electrical signal output section 101 a potential difference polarity that permits conduction of the electrical signal current from or to the first electrical signal output section 101 and another potential difference polarity that permits less conduction of the electrical signal current from or to the first electrical signal output section 101. When the photoelectric conversion cell B1 is selected, the photoelectric conversion cell B1 is read by driving the third control section 13 of the first transistor 10 from the first selection potential to the second selection potential in a potential direction of the potential difference polarity that permits conduction of the electrical signal current, and also almost concurrently, by driving the sixth control section 26 of the second transistor 20 from a third selection potential to a fourth selection potential in a potential direction that causes the second transistor 20 to be conductive. The photoelectric conversion element 100 is substantially electrically blocked from the second cell output section by driving the third control section 13 of the first transistor 10 to the first selection potential in the opposite direction, or by driving the sixth control section 26 of the second transistor 20 to the third selection potential that causes the second transistor 20 to be non-conductive. The first electrical signal output section 101 is typically supplied with the first cell bias 2010.

When the photoelectric conversion cell B1 is selected, the third control section 13 of the first transistor 10 is driven to the second selection potential from the first selection potential, the cell B1 is read with the potential of the second electrical signal output section of the photoelectric conversion element 100 at the second cell potential determined by the second selection potential. A difference between the second cell potential and the second selection potential is a base-emitter voltage Vbe1 if the first transistor 10 is a bipolar transistor, and is a gate-source voltage Vgs1 if the first transistor 10 is a field-effect transistor (FET). The value of the difference changes slightly depending on a read current, but is less susceptible to a voltage variation of the first output section 11 of the first transistor 10. This advantage is particularly pronounced in the vicinity of the saturation region if the first transistor 10 is a field-effect transistor, and in the vicinity of the active region (the region of constant-current output characteristics) if the first transistor 10 is a bipolar transistor.

When the read current of the electrical signal becomes lower, the resistance of the first transistor 10 viewed from the second electrical signal output section 102 of the photoelectric conversion element 100 becomes higher. If the reading period is short, the reading operation ends before the potential of the second electrical signal output section 102 settles to a constant value, and the potential is not sufficiently reset to an initial value. For this reason, dynamic characteristics are degraded.

To solve this problem, a potential Vout2 of the second output line 17 (=a second cell output potential) is set to be "a potential closer to the first selection potential side than a voltage (Vselect2−Vth1)" at least at the end of the reading operation of each cell B1 or in the latter half of the reading operation if the first transistor 10 is a field-effect transistor. In this way, the potential is sufficiently reset each time the reading operation ends. Here, Vselect2 represents the second selection potential of the first selection line 14 (=a second selection potential of the first cell selection section), and Vth1 represents a gate threshold voltage of the first transistor 10, and is negative in a p-channel and positive in an n-channel.

In case that a current-reading type sense amplifier is connected to the second output line 17, and the sense amplifier has a signal input and a reference potential input, "the potential closer to the first selection potential side than a voltage (Vselect2−Vth1)" can be connected to the reference potential input. In this voltage setting with the first transistor 10 being a field-effect transistor, an operating point of the transistor shifts from the saturation region to the triode region (non-saturation region). Even in such a case, the effect of a potential variation of the second output line 17 during the reading of the electrical signal on a potential change in the photoelectric conversion cell B1 is still alleviated.

The photoelectric conversion cell B1 or B2 can reduce number of sense amplifiers for the array architecture, but still needs a total of three interconnection lines including two cell selection lines and one cell output line.

The present invention provides a photoelectric conversion cell C1 as a new cell that permits the number of wiring lines to be reduced.

By using the photoelectric conversion cell C1, a noise associated with the selection of a third output line 18 can be set on a time-phase sequence different from that of the signal sense, and the effect of the noise can be substantially removed.

More specifically, the photoelectric conversion cell C1 is constructed by connecting a seventh input section of a third element to the first output section 11 of the first transistor 10 of the photoelectric conversion cell A1, and setting an eighth output section of the third element to be a third cell output section. The third element may be a rectifier element or a bipolar transistor. If the third element is a rectifier element, the seventh input section is one terminal of the rectifier element, and the eighth output section is the other terminal of the rectifier element. If the third element is a bipolar transistor, the seventh input section is the base of the bipolar transistor, and the eight output section is the emitter of the bipolar transistor. The photoelectric conversion cell is selected by a potential at the third cell output section and a potential at the third control section. If the third element is the bipolar transistor, the collector thereof (a ninth output section) may be supplied with a third cell bias potential (2030 of FIG. 9), or may be connected to the base to operate as a diode. The third cell bias potential may be common to the first cell bias potential. The rectifier element may be made of pn junction, hetero junction, or Schottky barrier junction.

The photoelectric conversion cell C1 is constructed as below. The photoelectric conversion cell C1 includes, at least, a photoelectric conversion element having an amplification function, a first transistor, and a third element.

The photoelectric conversion element includes a first electrical signal output section and a second electrical signal output section.

The first transistor includes a first output section, a second output section, and a third control section that controls a current flowing between the first output section and the second output section or resistance between the first output section and the second output section.

The third element includes, at least, a seventh input section, and an eighth output section.

The second electrical signal output section of the photoelectric conversion element has to the first electrical signal output section a potential difference polarity that permits conduction of an electrical signal current from or to the first electrical signal output section and another potential difference polarity that permits less conduction of the electrical signal current from or to the first electrical signal output section.

The current flowing between the first output section and the second output section in the first transistor or the resistance between the first output section and the second output section in the first transistor is mainly controlled by a voltage or a current between the third control section and the second output section.

The second electrical signal output section is connected to the second output section of the first transistor.

The first output section of the first transistor is connected to the seventh input section of the third element.

The eighth output section of the third element serves as a third cell output section.

The third control section of the first transistor serves as a first cell selection section.

The third cell output section is driven by a potential in a potential direction (sixth potential) in which the third element becomes conductive.

An electrical signal of the photoelectric conversion cell is read from the third cell output section by driving the first cell selection section in a potential direction (the second selection potential) of the potential difference polarity that permits conduction of the electrical signal current.

The electrical signal of the photoelectric conversion cell is blocked from the third cell output section by driving the first cell selection section in a direction (the first selection potential) opposite to the potential direction of the potential difference polarity that permits conduction of the electrical signal current, or the electrical signal of the photoelectric conversion cell is blocked from the third cell output section regardless of the potential of the first cell selection section by driving the third cell output section in a potential direction (fifth potential) that causes the third element to be non-conductive.

"The potential direction in which the third element becomes conductive" herein refers to a potential direction (toward sixth potential) that causes the junction portion of a rectifier element to be forward biased by changing the potential of the third cell output section from the fifth potential to the sixth potential if the third element is the rectifier element, or refers to a potential direction (toward sixth potential) that causes the emitter junction of a transistor to be forward biased if the third element is the transistor. The potential direction that causes the third element to be non-conductive refers to the potential direction (toward fifth potential) that causes the junction portion of a rectifier element to be reverse biased by changing the third cell output section from the sixth potential to the fifth potential if the third element is the rectifier element, or refers to the potential direction (toward fifth potential) that causes the emitter junction of a transistor to be reverse biased if the third element is the transistor. In this invention, the direction of the change of the potential (not necessarily absolute value) is important.

The sentence reading "the electrical signal of the photoelectric conversion cell is blocked from the third cell output section" in the present invention is intended to mean that the first transistor or the third element is set to be in a high resistance state so that an electrical signal of the photoelectric conversion cell is not read from the third cell output section. In that case, a leakage current through the first transistor and the third element not high enough to cause a large effect on the array operation to be discussed later is acceptable.

FIG. 9 is a circuit diagram of the photoelectric conversion cell C1.

The second electrical signal output section 102 of the photoelectric conversion element 100 is connected to the second output section 12 of the first transistor 10, the seventh input section 37 of a third element 30 is connected to the first output section 11 of the first transistor 10, and the eighth output section 38 of the third element 30 serves as a third cell output section of the photoelectric conversion cell C1.

In this example, the first electrical signal output section 101 of the photoelectric conversion element 100 is supplied with the first cell bias 2010. If the third element 30 is a bipolar transistor, the ninth output section 39 (collector) of the third element 30 is supplied with a third cell bias 2030. The third cell bias may be set to be common to the first cell bias 2010.

To construct a two-dimensional array from the photoelectric conversion cells C1, the third control section 13 of the first transistor 10 is connected as a first cell selection section of the photoelectric conversion cell C1 to the first selection line 14, and the eighth output section 38 of the third element 30 is connected as a third cell selection section to a third output line 18.

In the array, the third output lines 18 of the number close to the number of photoelectric conversion cells arranged in the first direction may be arranged in parallel. It is not necessarily a requirement that a dummy photoelectric conversion cell arranged for solving a lithographic peripheral pattern issue be connected to the third output line 18. The same is true of the other arrays.

The second electrical signal output section 102 of the photoelectric conversion element 100 has to the first electrical signal output section 101 a potential difference polarity that permits conduction of the electrical signal current (the photocurrent or the current resulting from amplifying the photocurrent) from or to the first electrical signal output section 101 and another potential difference polarity that permits less conduction of the electrical signal current from or to the first electrical signal output section 101. When the photoelectric conversion cell C1 is selected, the third cell output section of the photoelectric conversion cell C1 is driven from a sixth output potential subsequent to a fifth output potential via the third output line 18 connected to the photoelectric conversion cell C1. A transition from the fifth output potential to the sixth output potential is a change in a direction leading to conduction between the seventh input section 37 and the eighth output section 38 of the third element 30. At a timing when a potential variation noise to the sense amplifier almost settles, the third output line 18 is set to be in a floating state. The photoelectric conversion cell C1 is then read by driving through the first selection line 14 the first cell selection section of the photoelectric conversion cell C1 which is the third control section 13 of the first transistor 10 from the first selection potential to the second potential that is in the direction of the potential difference polarity that permits conduction of the electrical signal current (the photocurrent or the current resulting from amplifying the photocurrent) of the photoelectric conversion element 100.

When the photoelectric conversion cell C1 is selected, the third control section 13 of the first transistor 10 is driven to the second selection potential from the first selection potential, the cell is read with the potential of the second electrical signal output section of the photoelectric conversion element 100 at the second cell potential determined by the second selection potential. A difference between the second cell potential and the second selection potential is a base-emitter voltage Vbe1 if the first transistor 10 is a bipolar transistor, and is a gate-source voltage Vgs1 if the first transistor 10 is a field-effect transistor (FET). The value of the difference changes slightly depending on a read current, but is less susceptible to a voltage variation of the first output section 11 of the first transistor 10. This advantage is particularly pronounced if the first transistor operates in the vicinity of the saturation region in case that the first transistor 10 is a field-effect transistor, and if the first transistor operates in the vicinity of the active region (the region of constant-current output characteristics) in case that the first transistor 10 is a bipolar transistor.

As with the case of the photoelectric conversion cell A1, when the read current of the electrical signal becomes lower, the resistance of the first transistor 10 viewed from the second electrical signal output section 102 of the photoelectric conversion element 100 becomes higher. If the reading period is short, the reading is end before the potential of the second electrical signal output section 102 settles to a constant value, and the potential is not sufficiently reset to an initial value. For this reason, dynamic characteristics are degraded.

To solve this problem, a potential Vout3 of the third output line 18 (=the third cell output potential) is set to be "a potential closer to the first selection potential side than a voltage (Vselect2−Vth1−Vbe3)(or Vd))" at least at the end of the reading operation of each cell C1 or in the latter half of the reading operation if the first transistor 10 is a field-effect transistor. In this way, the potential is sufficiently reset each time the reading operation is end. Here, Vselect2 represents the second selection potential of the first selection line 14 (=the second selection potential of the first cell selection section), and Vth1 represents a gate threshold voltage of the first transistor 10, and is negative in a p-channel and positive in an n-channel. Vbe3 represents a base-emitter voltage if the third element 30 is a bipolar transistor, and Vd represents a forward voltage if the third element 30 is a rectifier element.

It is noted that a current-reading type sense amplifier is connected to the third output line 18, that the sense amplifier has a signal input and a reference potential input, and that "the potential closer to the first selection potential side than a voltage (Vselect2−Vth1−Vbe)(or Vd))" is connected to the reference potential input. In the voltage setting with the first transistor 10 being a field-effect transistor, an operating point of the transistor shifts from the saturation region to the triode region (non-saturation region). Even in such a case, the effect of a potential variation of the third output line 18 during the reading of the electrical signal on a potential change in the photoelectric conversion cell C1 is still small.

A photoelectric conversion array R1A is constructed of the photoelectric conversion cell A1. The photoelectric conversion array R1A includes, at least, a plurality of first selection lines extending in a first direction, a plurality of first output lines extending in a second direction intersecting the first direction, and a plurality of photoelectric conversion cells A1.

The photoelectric conversion cell A1 includes a first cell selection section and a first cell output section.

The plurality of photoelectric conversion cells A1 are arranged in the first direction and the second direction.

First cell selection sections of the plurality of photoelectric conversion cells arranged in a row in the first direction are respectively connected to one of the plurality of first selection lines.

First cell output sections of the plurality of photoelectric conversion cells arranged in a column in the second direction are respectively connected to one of the plurality of first output lines.

A photoelectric conversion array R1B of the present invention is constructed of the photoelectric conversion cells B1 or the photoelectric conversion cells B2. The photoelectric conversion array R1B includes, at least, a plurality of first selection lines extending in a first direction, a plurality of second selection lines extending in a second direction intersecting the first direction, at least one second output line, and a plurality of photoelectric conversion cells B1 or a plurality of photoelectric conversion cells B2.

The photoelectric conversion cell B1 or B2 includes a first cell selection section, a second cell selection section, and a second cell output section.

The plurality of photoelectric conversion cells B1 or B2 are arranged in the first direction and the second direction.

First cell selection sections of the plurality of photoelectric conversion cells B1 or B2 arranged in a row in the first direction are respectively connected to one of the plurality of first selection lines.

Second cell selection sections of the plurality of photoelectric conversion cells B1 or B2 arranged in a column in the second direction are respectively connected to one of the plurality of second selection lines.

Second output sections of the photoelectric conversion cell B1 or B2 are respectively connected to one of the at least one second output line.

If the arrays needs to be discriminated from each other depending on the type of the photoelectric conversion cell, the photoelectric conversion array employing the photoelectric conversion cell B1 is referred to as a photoelectric conversion array R1B1, and the photoelectric conversion array employing the photoelectric conversion cell B2 is referred to as a photoelectric conversion array R1B2.

A photoelectric conversion array R1C is constructed of the photoelectric conversion cells C1. The photoelectric conversion array R1C includes, at least, a plurality of first selection lines extending in a first direction, a plurality of third output lines extending in a second direction intersecting the first direction, and a plurality of photoelectric conversion cells C1.

The photoelectric conversion cell C1 includes a first cell selection section and a third cell output section.

The plurality of photoelectric conversion cells C1 are arranged in the first direction and the second direction.

First cell selection sections of the plurality of photoelectric conversion cells C1 arranged in a row in the first direction are respectively connected to one of the plurality of first selection lines.

Third cell output sections of the plurality of photoelectric conversion cells C1 arranged in a column in the second direction are respectively connected to one of the plurality of third output lines.

FIG. 10 illustrates an array of the present invention that includes m photoelectric conversion cells (A1 or C1) arranged in a first direction and n photoelectric conversion cells (A1 or C1) arranged in a second direction. The number of photoelectric conversion cells is m×n in the array. FIG. 10 illustrates the photoelectric conversion array 1000, and cells depending on location therewithin are respectively referred to as 1000-1-1, 1000-2-1, 1000-3-1, 1000-4-1, . . . , 1000-*m*-1, 1000-1-2, 1000-2-2, 1000-3-2, . . . , 1000-*m*-2, 1000-1-3, 1000-2-3, 1000-3-3, . . . , 1000-*m*-3, . . . , 1000-*i*-*j* (not illustrated), . . . , 1000-*m*-*n* by hyphenated suffix numbers.

The first selection lines are represented by 14-1, 14-2, 14-3, . . . , 14-*n*, and the number of first selection lines is typically equal to the number n of a group of the photoelectric conversion cells arranged in the second direction. The first selection lines 14-1, 14-2, 14-3, . . . , 14-*n* are respectively electrically connected to the first cell selection sections of the photoelectric conversion cells arranged at the respective rows.

The first output lines are represented by 15-1, 15-2, 15-3, . . . , 15-*m*, and the number of first output lines is typically equal to the number m of photoelectric conversion cells arranged in the first direction. The first output lines 15-1, 15-2, 15-3, . . . , 15-*m* are respectively connected to the first cell output sections of a group of the photoelectric conversion cells arranged at the respective columns. If the photoelectric conversion cell A1 is replaced with the photoelectric conversion cell C1, the first output lines 15-1, 15-2, 15-3, . . . , 15-*m* become third output lines 18-1, 18-2, 18-3, . . . , 18-*m* (as denoted within parentheses in FIG. 10).

There are cases when the photoelectric conversion cells arranged as dummy cells are not electrically connected to the first selection lines 14-1, 14-2, 14-3, . . . , 14-*n* or the first output lines 15-1, 15-2, 15-3, . . . , 15-*m*. The number of photoelectric conversion cells arranged in the second direction or the first direction does not necessarily agree with the number of first selection lines or the number of first output lines.

The selection of an address (i,j) of the photoelectric conversion cell 1000 is performed at an intersection of a first selection line 14-*j* selected from among the first selection lines 14-1, 14-2, 14-3, . . . , 14-*n* and a first output line 15-*i* selected from among the first output lines 15-1, 15-2, 15-3, . . . , 15-*m*. To successively read outputs from the array, electrical signals of the individual photoelectric conversion cells are successively read out by applying to the selected first selection line 14-*j* the second selection potential (standard pulse shape) subsequent to the first selection potential while non-selected the first selection lines 14-1, 14-2, 14-3, . . . , 14-*n* are supplied with the first selection potential.

FIG. 11 illustrates an array of the present invention that includes m photoelectric conversion cells (B1 or B2) arranged in the first direction and n photoelectric conversion cells (B1 or B2) arranged in the second direction. The number of photoelectric conversion cells is m×n in the array. FIG. 11 illustrates the photoelectric conversion array 1002, and cells depending on location therewithin are respectively referred to as **1002-1-1, 1002-2-1, 1002-3-1, 1002-4-1, . . . , 1002-*m*-1, 1002-1-2, 1002-2-2, 1002-3-2, . . . , 1002-*m*-2, 1002-1-3, 1002-2-3, 1002-3-3, . . . , 1002-*m*-3, . . . , 1002-*i*-*j* (not illustrated), . . . , 1002-*m*-*n*** by hyphenated suffix numbers.

The first selection lines are represented by 14-1, 14-2, 14-3, . . . , 14-*n*, and the number of first selection lines is typically equal to the number n of a group of the photoelectric conversion cells arranged in the second direction. The first selection lines 14-1, 14-2, 14-3, . . . , 14-*n* are respectively electrically connected to the first cell selection sections of a group of the photoelectric conversion cells arranged at the respective rows.

The second selection lines are represented by 16-1, 16-2, 16-3, . . . , 16-*m*, and the number of second selection lines is typically equal to a group of the number m of photoelectric conversion cells arranged in the first direction. The second selection lines 16-1, 16-2, 16-3, . . . , 16-*m* are respectively connected to the second cell output sections of a group of the photoelectric conversion cells arranged at the respective columns.

In this example, two second output lines 17-1 and 17-2 are employed in the array. Electrical signal outputs from two photoelectric conversion cells are concurrently obtained via the two second output lines 17-1 and 17-2. For example, if the selection lines connected to the adjacent photoelectric conversion cells are concurrently selected, a difference between the electrical signals of the adjacent photoelectric conversion cells obtained via the two second output lines 17-1 and 17-2 can be calculated on a real-time basis. If the number of second output lines is one, the electrical signal outputs from the photoelectric conversion cells are successively obtained as a serial output.

There are cases when the photoelectric conversion cells arranged as dummy cells are not electrically connected to the first selection lines 14-1, 14-2, 14-3, . . . , 14-*n* or the second selection lines 16-1, 16-2, 16-3, . . . , 16-*m* or the second output lines 17-1 and 17-2. The number of photoelectric conversion cells arranged in the second direction or the first direction does not necessarily agree with the number of first selection lines or the number of first output lines.

The selection of an address (i,j) of the photoelectric conversion cell 1002 is performed at an intersection of a first selection line 14-$j$ selected from among the first selection lines 14-1, 14-2, 14-3, ..., 14-$n$ and a second selection line 16-$i$ selected from among the second selection lines 16-1, 16-2, 16-3, ..., 16-$m$. To successively read outputs from the array, electrical signals of the individual photoelectric conversion cells are successively read out by applying to the selected first selection line 14-$j$ and the selected second selection line 16-$i$ the second selection potential (usually in a pulse shape) subsequent to the first selection potential and the fourth selection potential (usually in a pulse shape) subsequent to the third selection potential, respectively, while the non-selected first selection lines 14-1, 14-2, 14-3, ..., 14-$n$ are supplied with the first selection potential and the non-selected second output lines 16-1, 16-2, 16-3, ..., 16-$m$ are supplied with the third selection potential.

Effect of Invention

According to the present invention, if the photoelectric conversion element is a phototransistor and a signal is obtained not from the collector but from the emitter, a reading delay caused by stray capacitance between the collector and each of the isolation region and the substrate is avoided, and an increase of the reading delay because of the Miller effect is prevented. In the case of the photoelectric conversion cell C1, current amplification is also performed when the address selection is performed by the emitter. According to the present invention, image information can be read at sensitivity close to dark current limitation.

The connection method of the selection element and the photoelectric conversion element can control disturbances including a voltage variation given in a reading pixel or in another pixel in response to a noise and a voltage variation on the signal output line during reading.

Since the connection method of the first transistor of the present invention makes a feed-through noise of an address selection pulse (a pulse applied to the first selection line, the second selection line, or the third output line) at a leading pulse edge to be opposite in sign to the read signal, it is easy to separate the signal from the noise. The effect of the noise can be eliminated by slicing the read signal through a strobe process or the like after the leading-pulse-edge noise of the address selection pulse (transient current shape) becomes weak.

The amplification-type photoelectric conversion element and the above-described structure thereof implement a photoelectric conversion cell having a high sensitivity and wide dynamic range, and a two-dimensional array of the cells.

Since an isolation structure of a semiconductor region including the photoelectric conversion element (a first semiconductor region in the embodiment described below) becomes needless at least between the individual photoelectric conversion cells in a raw or in a column, photoelectric conversion may be performed to light having a wavelength close to long wavelength limitation where photoelectric conversion is possible by that semiconductor.

The isolation structure of the semiconductor region including the photoelectric conversion element (the first semiconductor region in the embodiment described below) becomes needless at least between the individual photoelectric conversion cells. A transistor of the photoelectric conversion cell free from the isolation structure can be also employed. Without adding a drastic modification to the MOSLSI manufacturing process, the photoelectric conversion cell and the array of the present invention can be manufactured. For this reason, the photoelectric conversion cell and the array of the present invention can be manufactured using a MOSLSI foundry.

DESCRIPTION OF EMBODIMENTS

A photoelectric conversion element as one embodiment of the present invention is a bipolar-type phototransistor. The photoelectric conversion element BP preferably includes, at least, a first semiconductor region having a first surface and a first conductivity type, one or plural second semiconductor regions, each having a second surface, and a conductivity type opposite to the first conductivity type, and arranged on or in the first surface of the first semiconductor region, and one or plural third semiconductor regions, each having a third surface and the first conductivity type, each third semiconductor region arranged on or in the second surface of each of the one or plural second semiconductor regions.

If the number of the second semiconductor regions is plural, each of the second semiconductor regions, excluding at least one second semiconductor region, is electrically connected to one of the third semiconductor regions that is not arranged therewithin.

If the number of third semiconductor regions is plural, each of the third semiconductor regions, excluding at least one third semiconductor region, is electrically connected to one of the second semiconductor regions on or in which the each of the third semiconductor regions is not arranged.

The first semiconductor region serves as the first electrical signal output section, and the one third semiconductor region serves as the second electrical signal output section.

Figure 1:
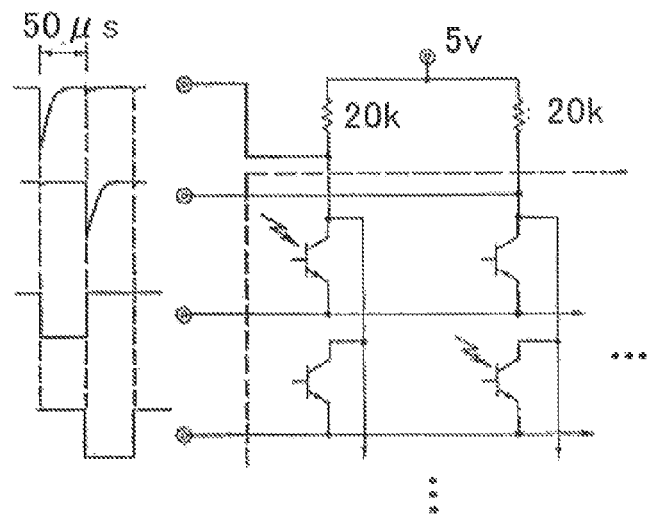
FIG. 1 is a circuit diagram of a two-dimensional array where a common load resistor is connected to a collector of a phototransistor.
Figure 2:
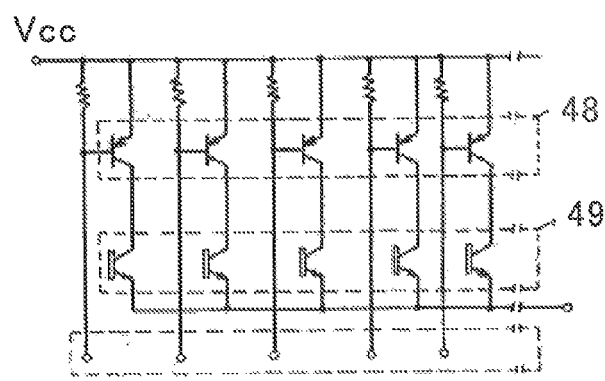
FIG. 2 illustrates a one-dimensional array of phototransistors.
Figure 3:
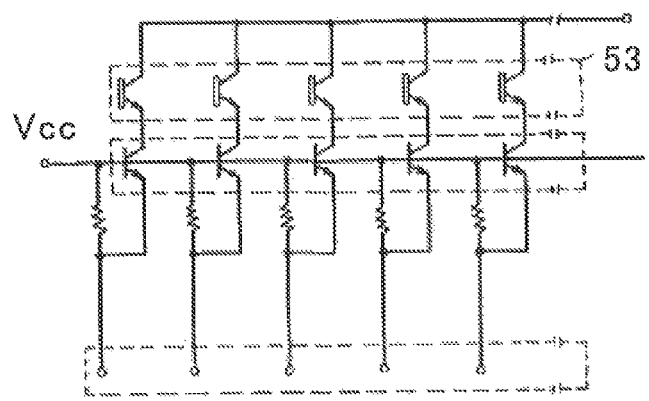
FIG. 3 illustrates another one-dimensional array of phototransistors.
Figure 4:
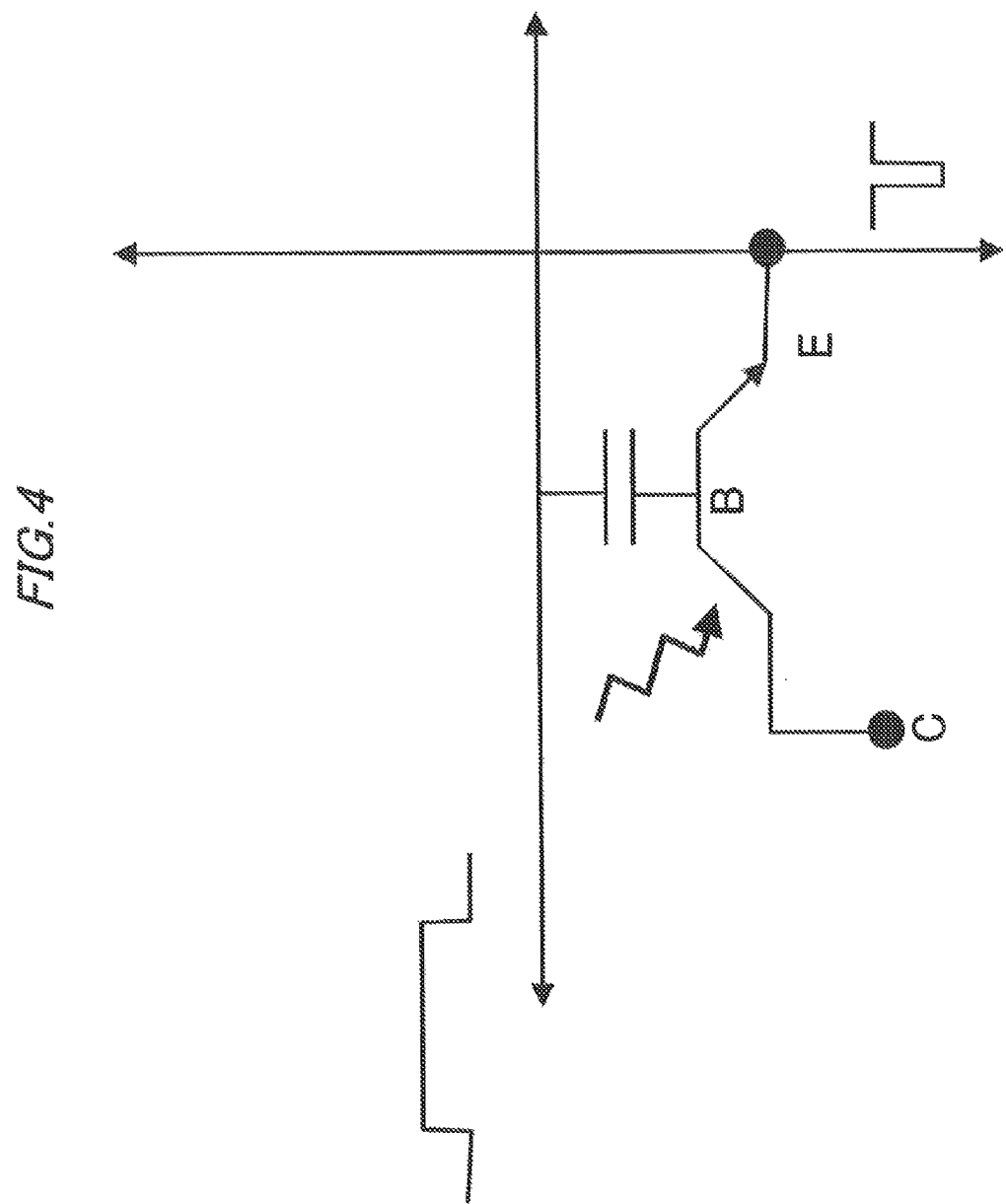
FIG. 4 illustrates a phototransistor cell that has a base with an X driving wiring line capacitive coupled thereto, a Y driven emitter, and a collector from which reading is performed.
Figure 5:
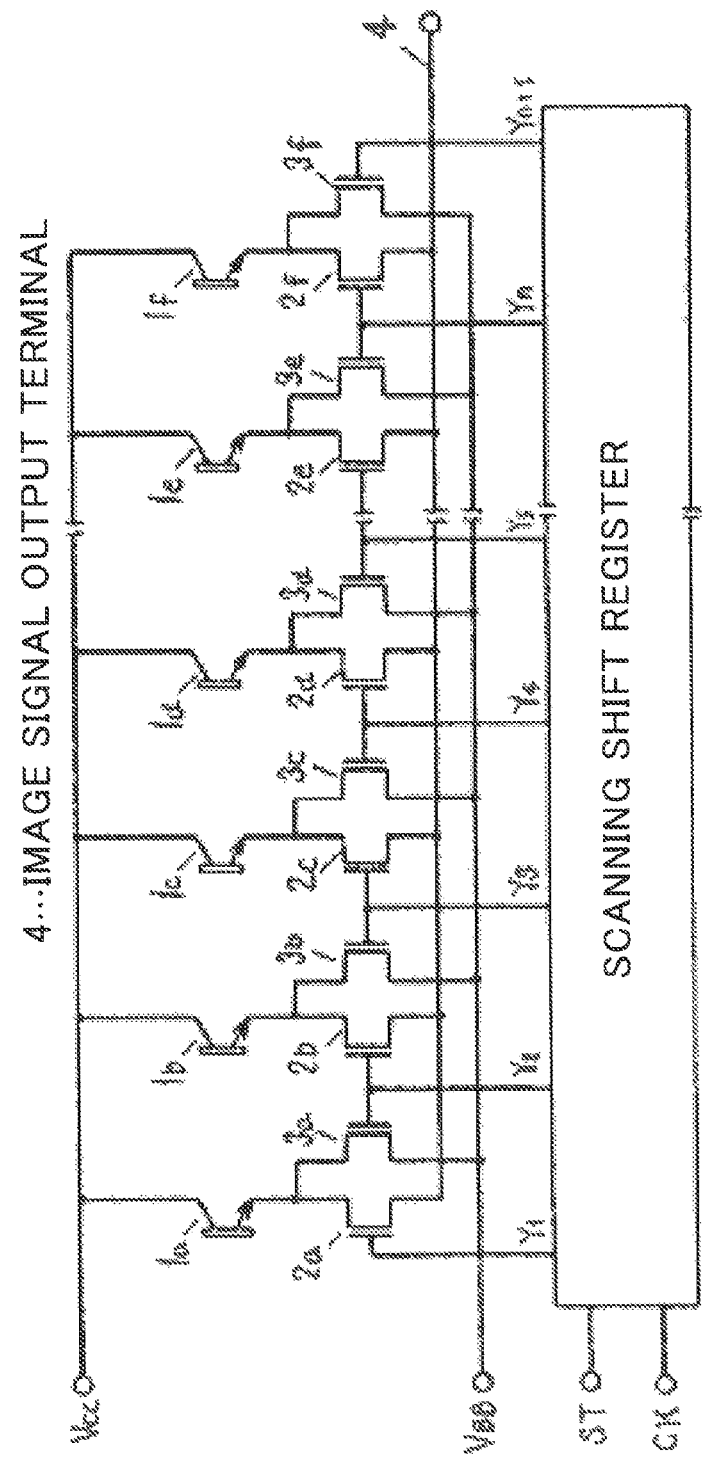
FIG. 5 illustrates another one-dimensional array of phototransistors.
Figure 6:
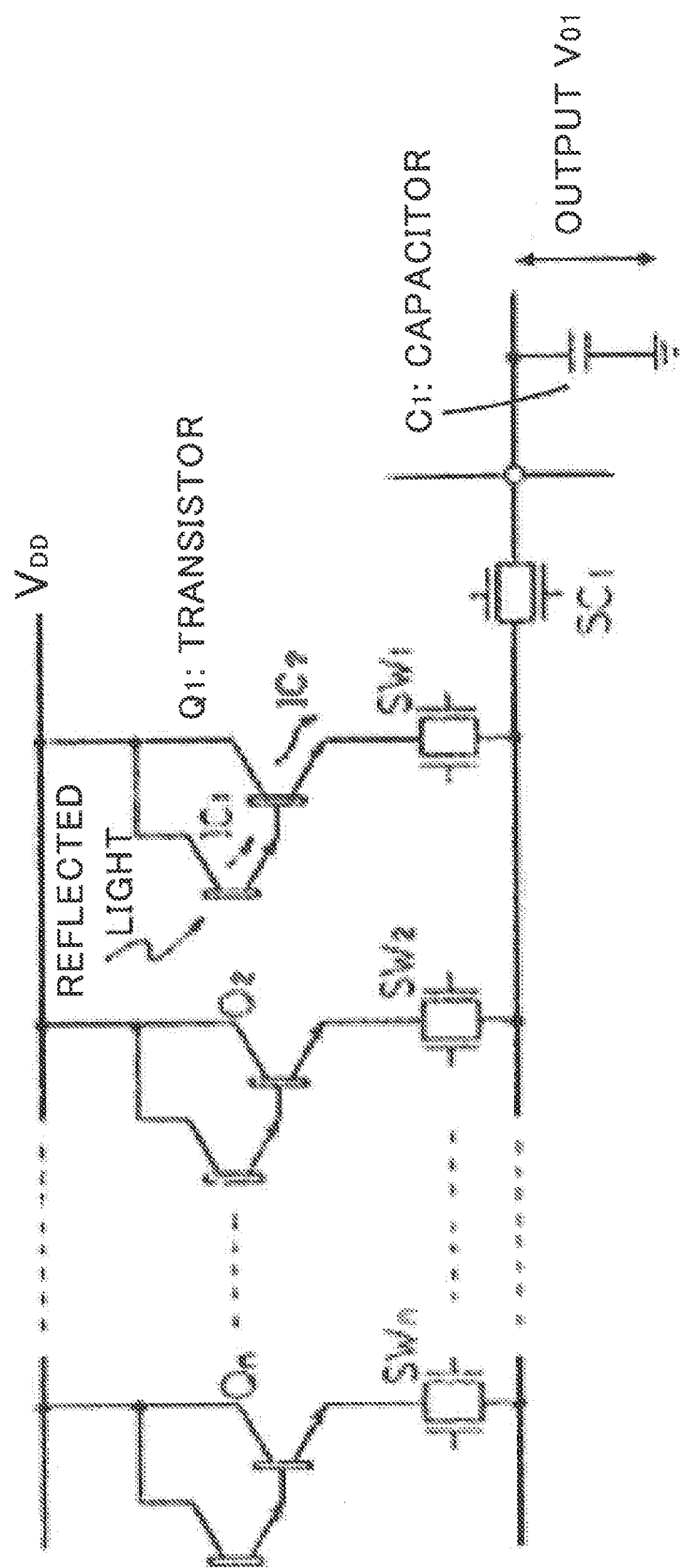
FIG. 6 illustrates a one-dimensional array of Darlington-connected phototransistors.
Figure 7:
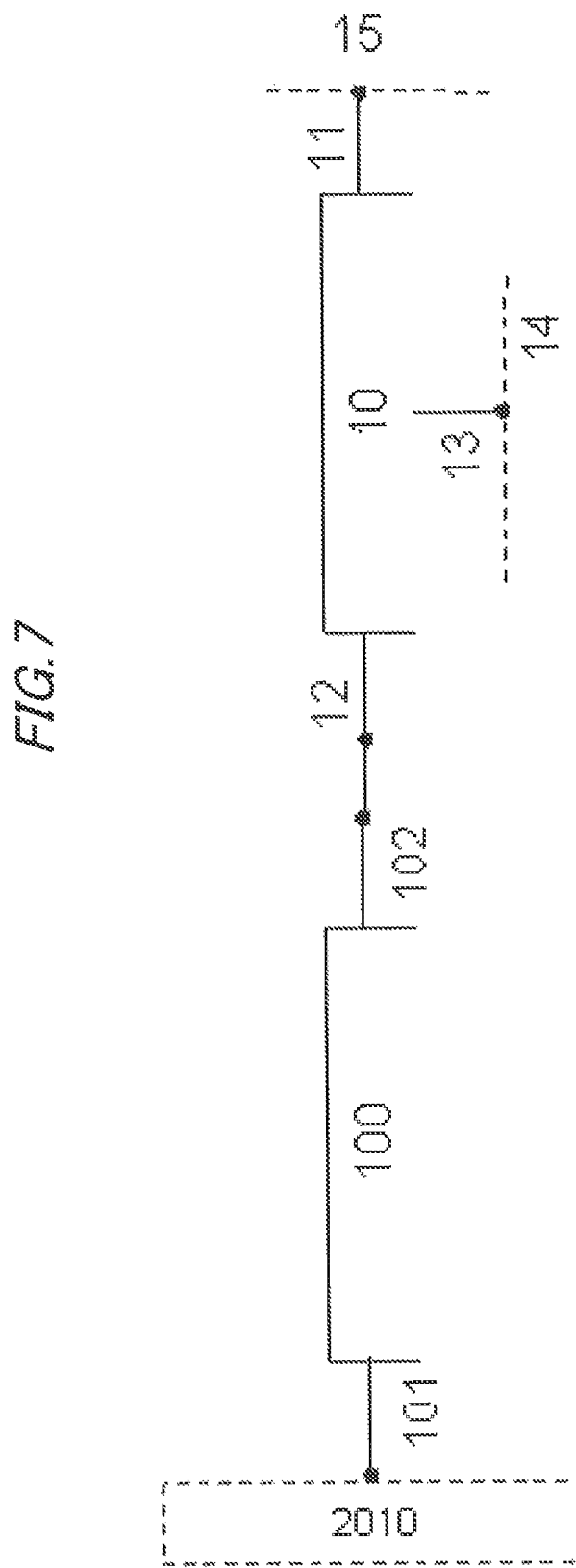
FIG. 7 is a circuit diagram of elements of a photoelectric conversion cell A1 of the present invention.
Figure 8:
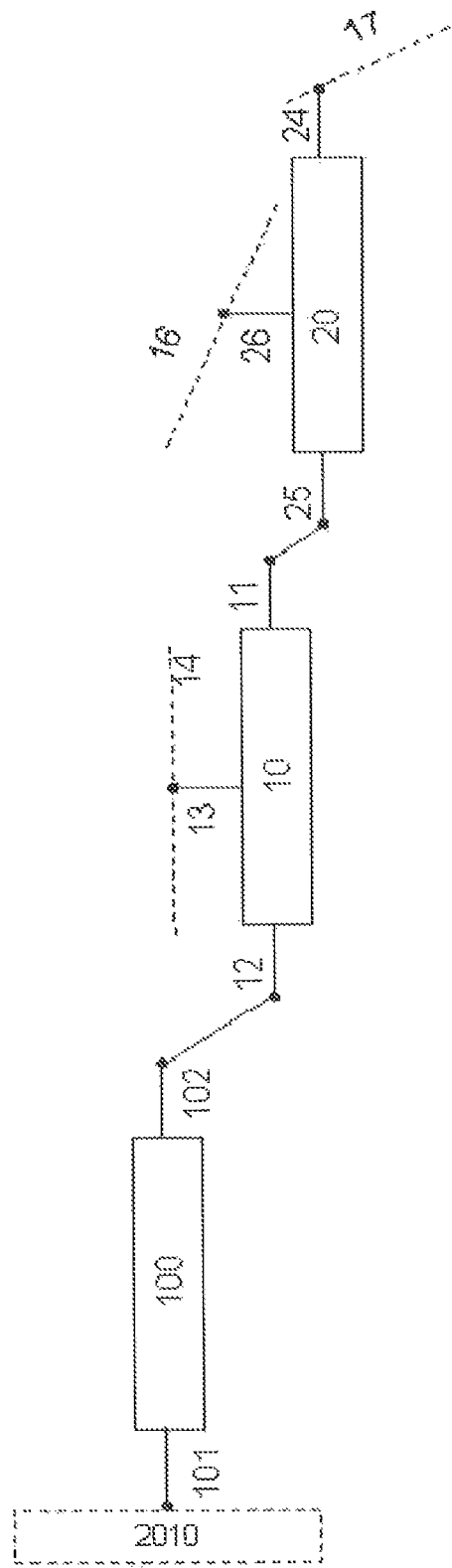
FIG. 8 is a circuit diagram of elements of a photoelectric conversion cell B1 of the present invention.
Figure 9:
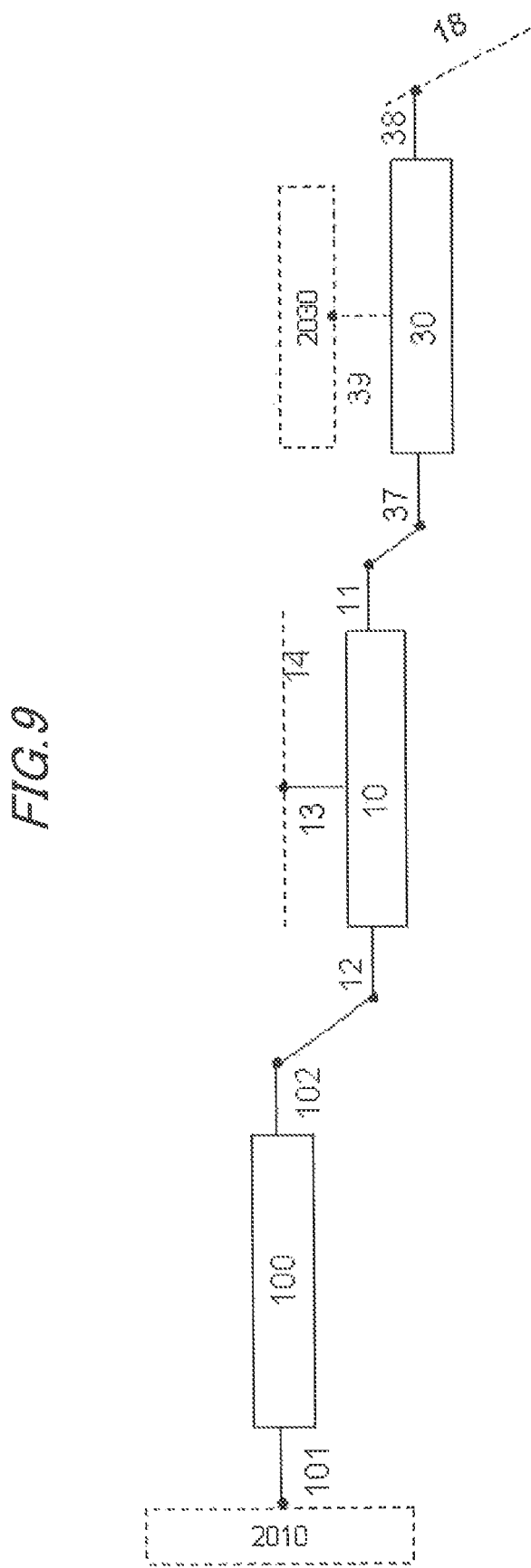
FIG. 9 is a circuit diagram of elements of a photoelectric conversion cell C1 of the present invention.
Figure 10:
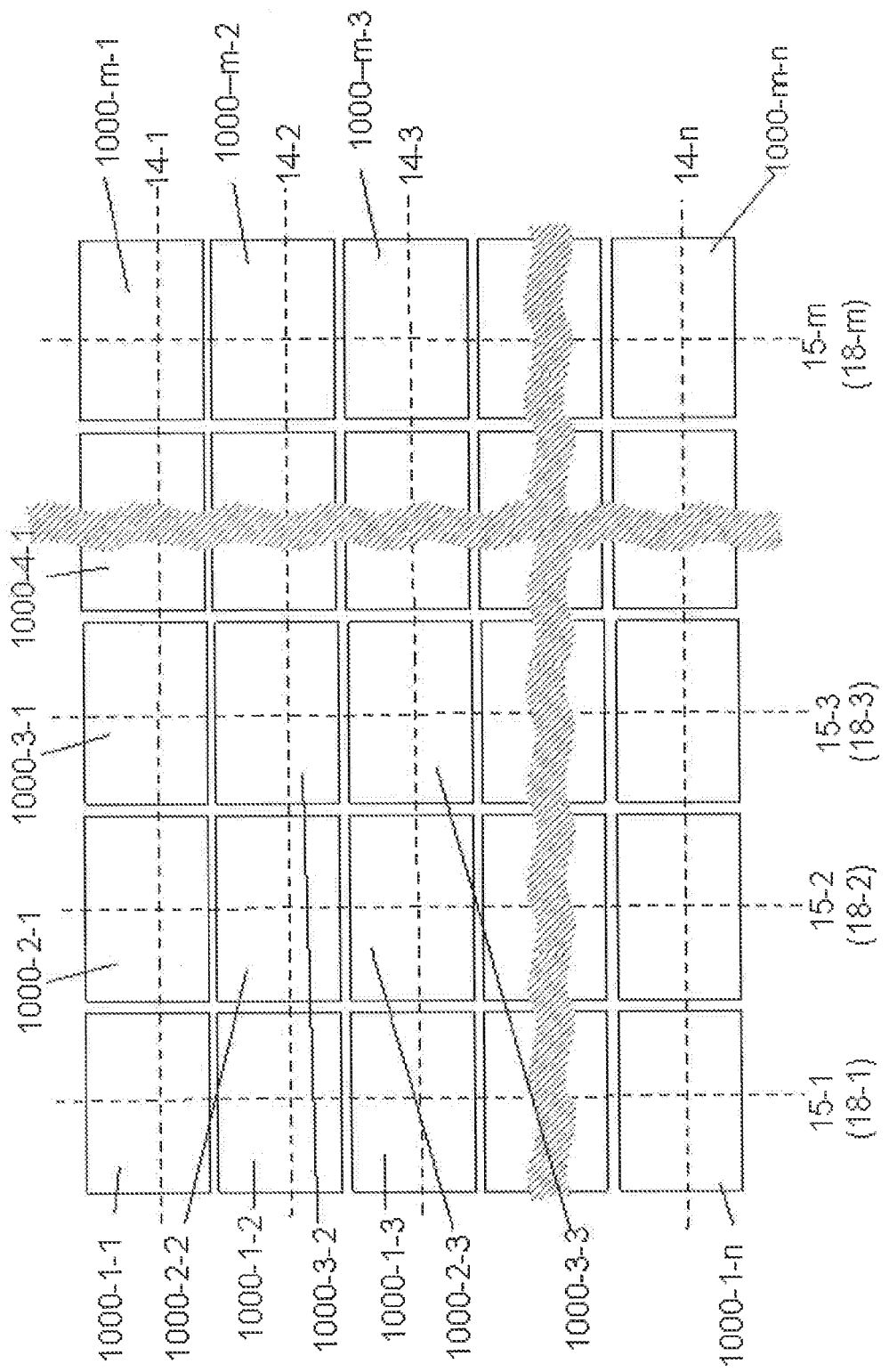
FIG. 10 illustrates a layout and interconnection of photoelectric conversion arrays R1A and R1C of the present invention.
Figure 11:
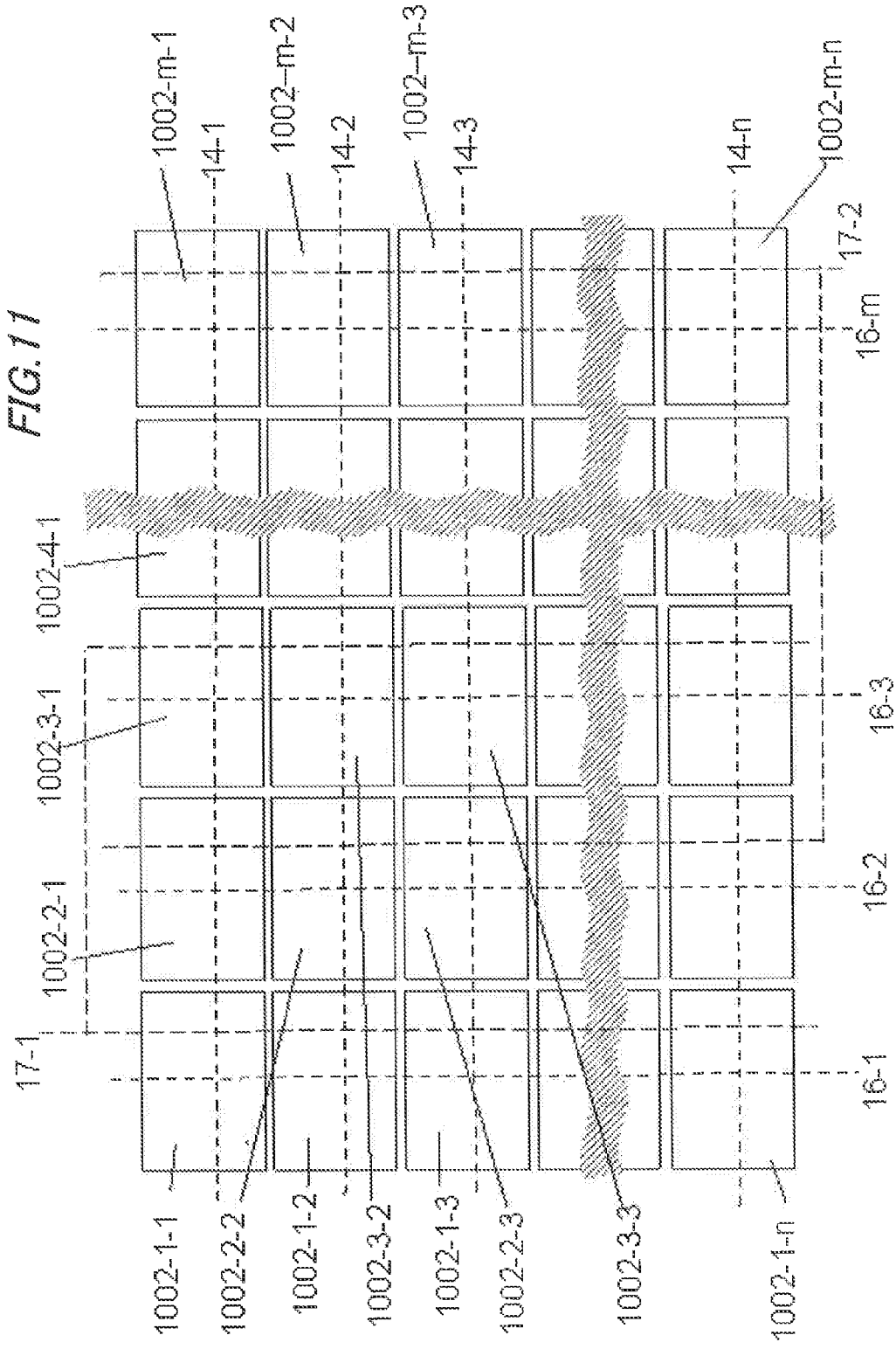
FIG. 11 illustrates a layout and interconnection of photoelectric conversion arrays R1B1 and R1B2 of the present invention.
Figure 12:
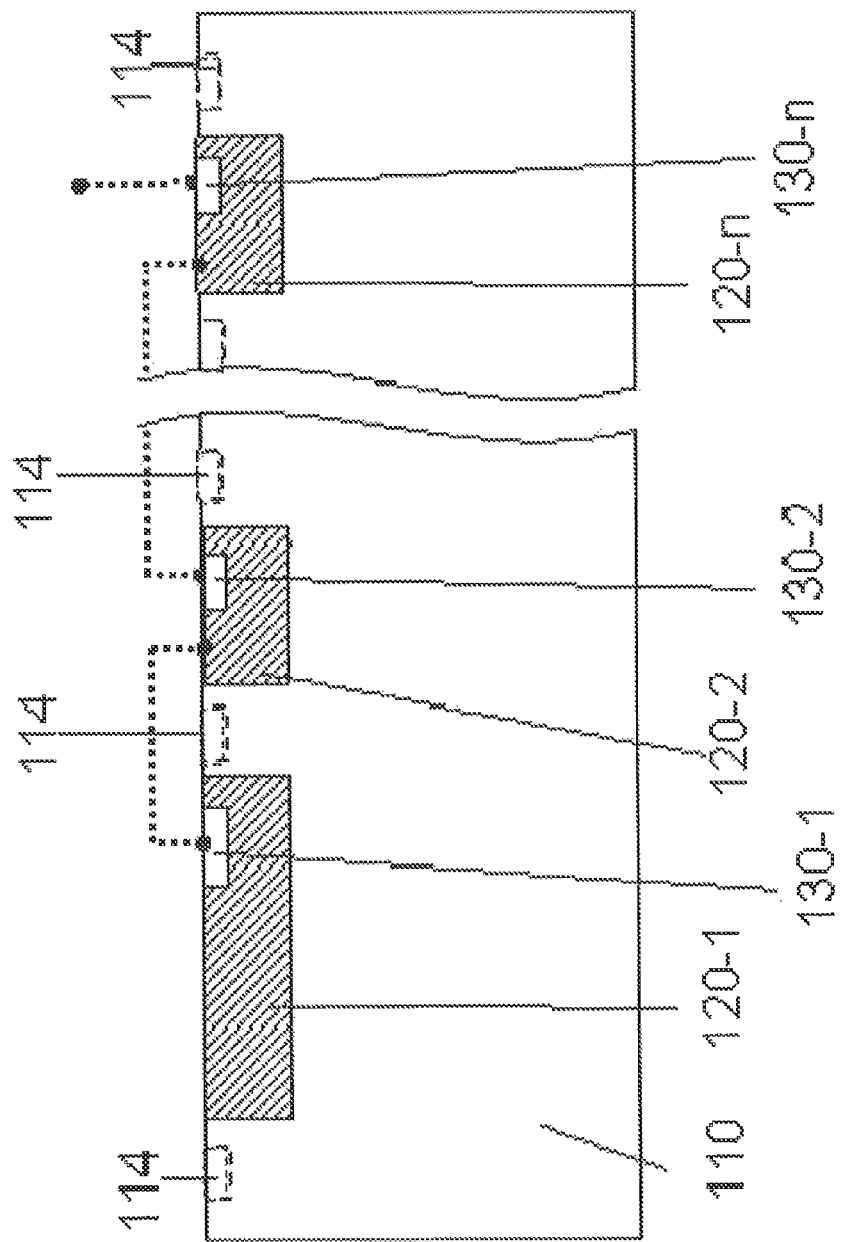
FIG. 12 is a sectional view of one example of an amplification-type photoelectric conversion element used in the photoelectric conversion cell of the present invention.

FIG. 12 is a sectional view of an example of a structure of the photoelectric conversion element BP. FIG. 12 illustrates a first semiconductor region 110, second semiconductor regions 120-1, 120-2, ..., 120-*n*, and third semiconductor regions 130-1, 130-2, ..., 130-*n*.

Interconnections between the semiconductor regions are diagrammatically denoted by broken lines. As illustrated, the second semiconductor region 120-2 is connected to a third semiconductor region 130-1 other than the third semiconductor region 130-2 arranged within the second semiconductor region 120-2 itself. The third semiconductor region 130-2 is connected to a second semiconductor (not illustrated) other than the second semiconductor region 120-2 having the third semiconductor region 130-2. The second semiconductor region 120-*n* is connected to a third semiconductor region (not illustrated) other than the third semiconductor region 130-*n* arranged within the second semiconductor region 120-*n* itself. The third semiconductor region 130-*n* also serves as a second electrical signal output section of the photoelectric conversion element BP. In this example, the first semiconductor region 110 is responsible for photoelectric conversion and functions as the first electrical signal output section as well.

An electrical signal converted from light information is obtained as a current output in a direction in which junctions formed between the second semiconductor regions 120-1, 120-2, ..., 120-*n* and the third semiconductor regions 130-1, 130-2, ..., 130-*n* are forward biased. In the present invention, this direction is expressed by the sentence reading "the second electrical signal output section of the photoelectric conversion element has to the first electrical signal output section a potential difference polarity that permits conduction of an electrical signal current from or to the first electrical signal output section."

It is noted that a higher impurity concentration region 114 having a higher impurity concentration than that of and the same conductivity type as the first semiconductor region 110 may be occasionally arranged to control surface leakage current.

The photoelectrical conversion element BP performs mainly photoelectric conversion between the second semiconductor region not electrically connected to the third semiconductor region and the first semiconductor region 110. The junction therebetween serves as a carrier collection junction, the first semiconductor region 110 serves as a collector of a bipolar-type phototransistor and a bipolar transistor, the second semiconductor region not electrically connected to the third semiconductor region serves as a base of the bipolar-type phototransistor, the second semiconductor region electrically connected to the third semiconductor region serves as a base of the bipolar transistor, and the third semiconductor region serves as an emitter of the bipolar-type phototransistor or the bipolar transistor. Even if a device constructed of the first, second, and third semiconductor regions has no amplification effect, the junction formed between the third semiconductor region and the second semiconductor region still operates as a block diode because of a bias relationship during non-selected period.

The use of plural number of second semiconductor regions and third semiconductor regions, for example, two or three second semiconductor regions and third semiconductor regions is advantageous, because a current gain of the photoelectric conversion element and a withstand voltage of the second electrical signal output section increase by the number of semiconductor regions. But, involved areas also increase. If one second semiconductor region and one third semiconductor region are employed, the current gain of the transistor and the junction withstand voltage between the second semiconductor region and the third semiconductor region are preferably set to be high. To this end, the impurity concentration of a second surface of the second semiconductor region is preferably set to be at a low concentration level but at a level (for example, to a level of 5E17 to 1E19 atoms/cc) that does not cause surface depletion under a standard clean process.

An impurity concentration of a third surface of the third semiconductor region is preferably set to be 2E19 atoms/cc or higher. If plural number of second semiconductor regions and third semiconductor regions are used, an amplification factor of multi-transistors becomes plural powers of an amplification factor of a single transistor, and the withstand voltage becomes plural times of the withstand voltage of the single transistor. The impurity concentration of the second surface of the second semiconductor region can be increased to about 1E19 atoms/cc.

It is noted that even if the current gain is small, a charge responsive to an integrated value of amount of light irradiating the photoelectric conversion cell during the non-selected period is accumulated in the junction capacitance between the second semiconductor region and the first semiconductor region 110, and information responsive to the charge can be read.

The impurity concentration of the surface portion of the first semiconductor region 110 is set to be at a low impurity concentration level (about 1E14-1E17 atoms/cc). A region having a high impurity concentration (1E18 atoms/cc or above) is preferably arranged on a rear surface (opposed to the first surface) to improve vertical carrier collection or to control lateral diffusion of light excited carriers. The thickness of the low impurity concentration surface portion of the first semiconductor region 110 (a distance from the first surface to the high impurity concentration region) is preferably equal to or smaller than one side of the photoelectric conversion cell to control the lateral diffusion, and equal to or larger than a reciprocal of an absorption coefficient of light with upper limit long-wavelength to be photoelectrically converted. Since the structure of the first semiconductor region 110 generates an electric field that accelerates the light-excited carriers from a lower portion having a high impurity concentration toward the surface, the collection efficiency of the light-excited carriers is increased. The structure also prevents the light-excited carriers from submerging below and reaching an adjacent photoelectric conversion cell. The life time of carriers in the lower portion having the high impurity concentration becomes shorter than those in the surface portion because of the high impurity concentration there, and decreases a diffusion length of the carriers. The lateral diffusion length of the carriers submerging below is also reduced. The structure and the remedial countermeasure are applicable to photoelectric conversion elements to be discussed below.

A photoelectric conversion element as one of the embodiments of present invention is a field-effect phototransistor. The photoelectric conversion element FE as a preferable embodiment includes, at least, a first semiconductor region having a first surface and a first conductivity type, a second semiconductor region having a second surface, and a conductivity type opposite to the first conductivity type, and arranged on or in the first surface of the first semiconductor region, a third semiconductor region having a third surface and the first conductivity type, and arranged on or in the second surface of the second semiconductor region, and a channel formation region that bridges between the first semiconductor region and the third semiconductor region in the second semiconductor region.

The first semiconductor region serves as the first electrical signal output section and the third semiconductor region servers as the second electrical signal output section.

Figure 13:
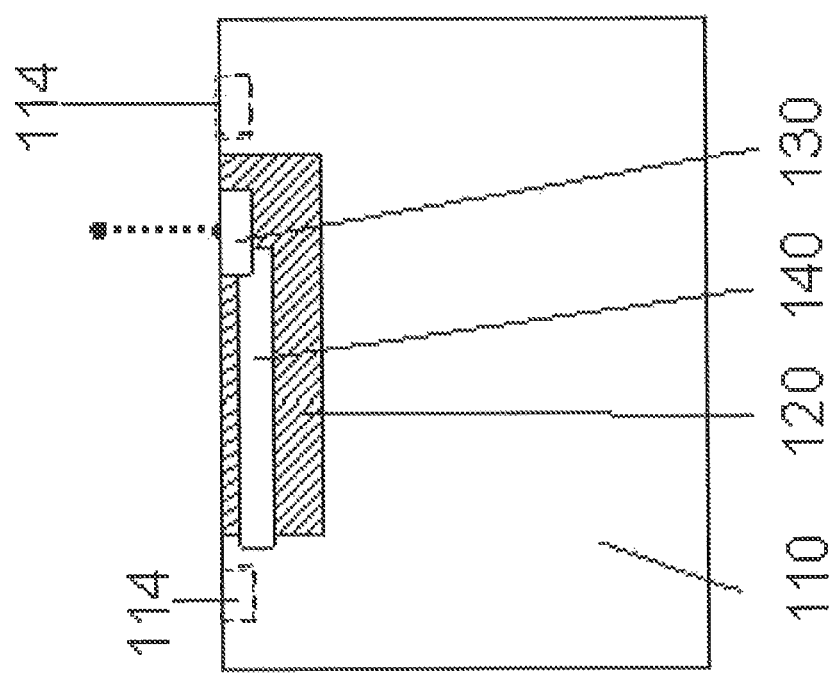
FIG. 13 is a sectional view of another example of an amplification-type photoelectric conversion element used in the photoelectric conversion cell of the present invention.

FIG. 13 is a sectional view of an example of a structure of the photoelectric conversion element FE.

FIG. 13 illustrates a first semiconductor region 110, a second semiconductor region 120, and a third semiconductor region 130. A region 114 being a higher impurity concentration region and having the same conductivity type as the first semiconductor region 110 may be arranged to control surface leakage current. Also included is a fourth semiconductor region 140.

The third semiconductor region 130 also serves as a second electrical signal output section of the photoelectric conversion element FE. In this example, the first semiconductor region 110 performs photoelectric conversion and serves as a first electrical signal output section as well.

The second semiconductor region 120 serves as a gate of the field-effect transistor. The first semiconductor region 110 and the third semiconductor region 130 serve as a drain or a source of the field-effect transistor. A current flowing through the region 140 between the first semiconductor region 110 and the third semiconductor region 130 is controlled by a potential at the second semiconductor region 120.

Photoelectric conversion is mainly performed by the first semiconductor region 110 and the second semiconductor region 120. The collection of light-excited carriers is performed by a junction between the first semiconductor region 110 and the second semiconductor region 120. During non-selection period, charge of the light-excited carriers is accumulated on the second semiconductor region 120. If the second semiconductor region 120 is set to be floating after being reverse biased with respect to the third semiconductor region 130, the second semiconductor region 120 is charged with light-excited carriers. The potential of the second semiconductor region 120 changes to a forward bias direction with respect to the third semiconductor region 130 after being reverse biased (the direction is important and it is not necessarily a requirement that the second semiconductor region 120 be forward biased to the third semiconductor region).

Due to the change of the potential at the second semiconductor region 120 during selection and reading periods, a current between the first electrical signal output and the second electrical signal output is changed. More specifically, an integrated value of amount of irradiation light is read as a current.

The photoelectric conversion element FE may be applied to the photoelectric conversion cell of the present invention. After a pulse of a potential difference polarity causing the junction between the third semiconductor region 130 and the second semiconductor region 120 to be in a forward direction is applied to the third semiconductor region 130 during reading, a pulse in the opposite direction is applied to the third semiconductor region 130 or the third semiconductor region 130 is set to be in a floating state (to turn off the first transistor 10 of the photoelectric conversion cell). The second semiconductor region 120 is then reverse biased with respect to the third semiconductor region 130, and accumulation of light-excited carriers during non-selection period.

Figure 14:
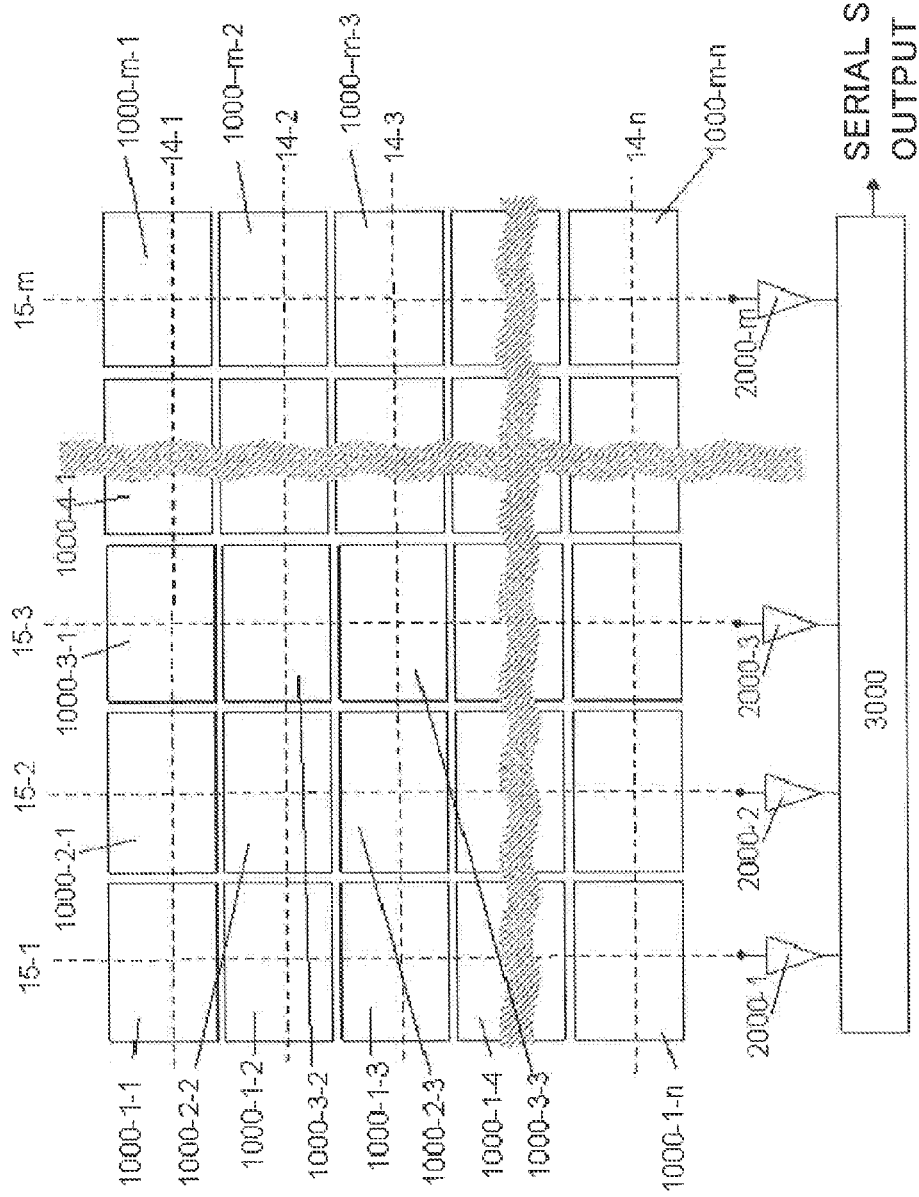
FIG. 14 illustrates one example of electrical signal reading of the photoelectric conversion array R1A and connection of a sense amplifier to the photoelectric conversion array R1A in accordance with the present invention.

In the photoelectrical conversion array R1A, if electrical signals read from the plurality of first output lines 15-1, 15-2, 15-3, . . . , 15-m are electric currents, sense amplifiers are respectively connected to the first output lines 15-1, 15-2, 15-3, . . . , 15-m to read electrical signals in parallel. FIG. 14 illustrates this example. Output voltages of a plurality of sense amplifiers 2000-1, 2000-2, 2000-3, . . . , 2000-m are successively switched through a switch circuit 3000 to give a serial signal output as an electrical signal.

A light-shield film may be arranged on the photoelectric conversion cell connected to any one first output line 15-$i$ from among the plurality of first output lines 15-1, 15-2, 15-3, . . . , 15-m. A value resulting from subtracting an output of a sense amplifier connected to the one first output line 15-$i$ from an output of another sense amplifier is used as an electrical signal. The resulting electrical signal is subtracted with a dark current component and a selection pulse noise component. A weak-light sensitivity of the photoelectrical conversion array R1A is thus improved. This method provides the same advantage in other array structures where the first output lines 15-1, 15-2, 15-3, . . . , 15-m are replaced with second output lines 17-1, 17-2, 17-3, . . . , 17-m, or third output lines 18-1, 18-2, 18-3, . . . , 18-m. More specifically, a light-shield film is arranged on the photoelectric conversion cell connected to any one second output line 17-$i$ selected from among the second output lines 17-1, 17-2, 17-3, . . . , 17-m or the photoelectric conversion cell connected to any one third output line 18-$i$ selected from among the third output lines 18-1, 18-2, 18-3, . . . , 18-m. Used as an electrical signal is a value resulting from subtracting an output from a sense amplifier connected to the one second output line 17-*i* or an output from a sense amplifier connected to the one third output line 18-*i* from an output of another sense amplifier.

Figure 15:
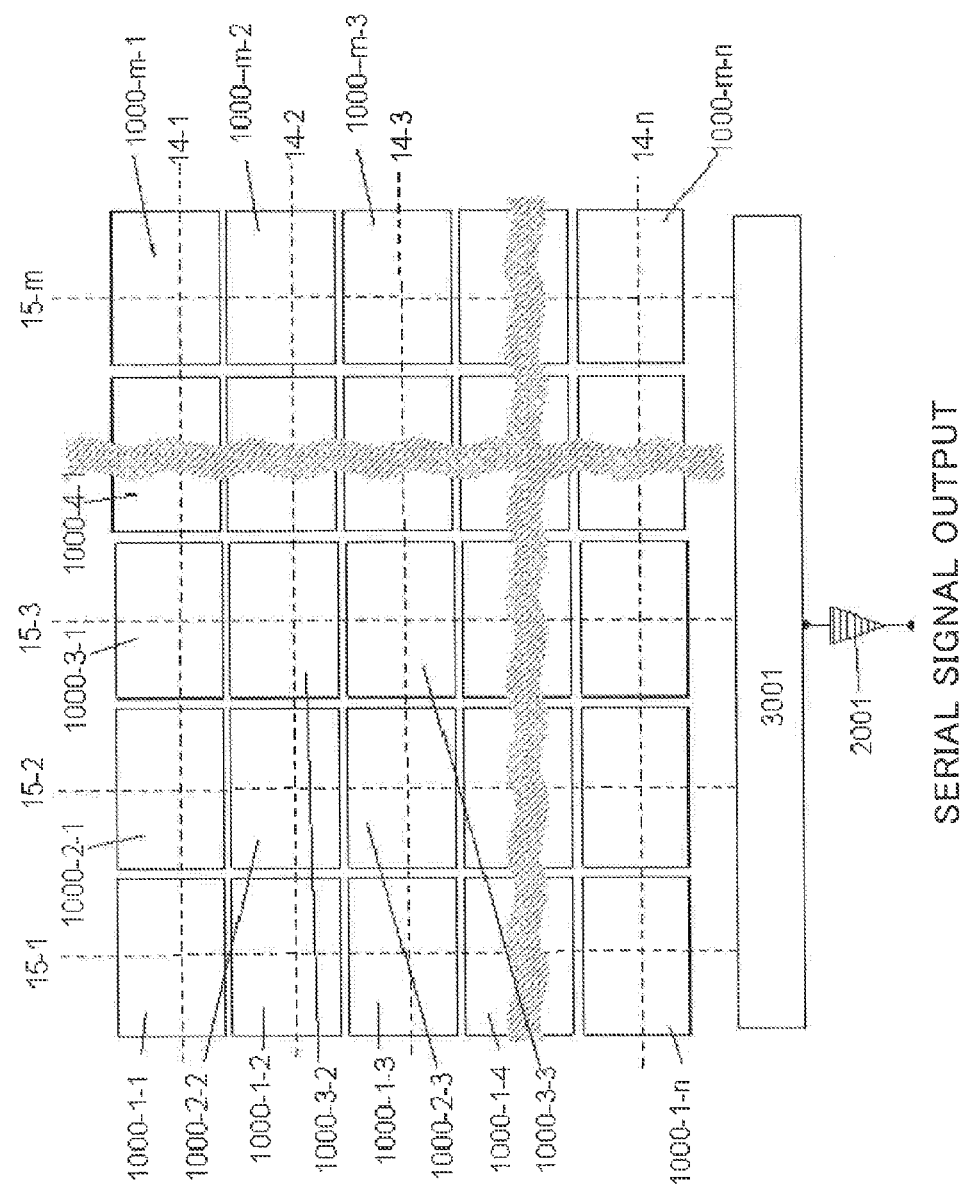
FIG. 15 illustrates another example of the electrical signal reading of the photoelectric conversion array R1A and the connection of the sense amplifier to the photoelectric conversion array R1A in accordance with the present invention.

If the electrical signals read from the plurality of first output lines 15-1, 15-2, 15-3, . . . , 15-*m* are voltages or charges, the parallel reading method of FIG. 15 is also possible. As illustrated in FIG. 15, however, one sense amplifier 2001 (or a plural number of sense amplifiers 2001 but still smaller than the number of first output lines) is successively switched to the plurality of first output lines 15-1, 15-2, 15-3, . . . , 15-*m* arranged in the first direction to read the electrical signal. In such a case, a switch circuit 3001 successively connects the first output lines 15-1, 15-2, 15-3, . . . , 15-*m* to the sense amplifier 2001, and the electrical signal is taken out as a serial signal from the output of the sense amplifier.

When an electrical signal is sensed from the first, second, or third output line in the array of the present invention, the first, second, or third output line is reset to a reset voltage prior to or subsequent to reading the electrical signal from the first, second, or third output line. This is preferable to achieve high accuracy reading. In this case, a sense amplifier having a reference input function may be used. By supplying a reference potential to the reference input, the sense amplifier provides the output electrical signal from each photoelectric conversion cell in the form of a difference from zero volt or the reference potential. Otherwise, the output electrical signal from the first, second, or third output section of the photoelectric conversion cell typically depends on the potential of each output section. In such a case, the reset operation is needed so that the read electrical signal is not affected by disturbances from preceding read states (or preceding read electrical signal).

Furthermore, an internal potential of the photoelectric conversion cell can be reset by resetting the potential at the first, second, or third output line in the latter half of the reading operation while the electrical signal is read from the first, second, or third output line. In order to perform the reset operation within a limited period of time, the reset potential is preferably set to be a value closer to the first selection potential side than ((second selection potential)−Vth1)) on the first and second output lines, and preferably set to a value closer to the first selection potential side than ((second selection potential)−Vth1−Vbe (or Vd)) on the third output line.

A reset circuit RSA1 (as a first example) to be added to the array structure of FIG. 14 (first example of the photoelectrical conversion array R1A) performs the reset operation. The reset circuit RSA1 includes a plurality of sixth transistors.

The sixth transistor is a field-effect transistor and includes two outputs (a source and a drain), and a gate.

One of the outputs is connected to one of the plurality of first output lines, and the other output is supplied with a reset potential.

A control voltage pulse to cause the sixth transistor to turn on is applied to the gate of the sixth transistor when the first selection line is at the first selection potential or before the first selection line transitions from the second selection potential to the first selection potential, and a control potential to cause the sixth transistor to turn off is applied to the gate of the sixth transistor at least when the first selection line transitions from the first selection potential to the second selection potential. More specifically, the control potential to cause the sixth transistor to turn off is applied to the gate of the sixth transistor at least when sensing starts with the first selection line transitioning from the first selection potential to the second selection potential.

The first selection potential is a potential that blocks the electrical signal of the photoelectric conversion cell from the first cell output section, and the second selection potential is a potential that has a potential difference polarity in a direction that permits the electrical signal current of the photoelectric conversion element to flow easier than with the first selection potential.

The sense amplifier used in this case preferably has a reference input in addition to an electrical signal input. The reference input is supplied with the reset potential. In order to reset the cell internal potential only, the sixth transistor is simply turned on only after reading while the first selection line remains at the second potential.

The above control voltage pulse transitions in voltage to cause the sixth transistor to turn from off to on and from on to off. At the necessary timing, the control voltage pulse may be supplied by a control pulse supplying unit including a pulse generator circuit such as a known shift register.

Figure 16:
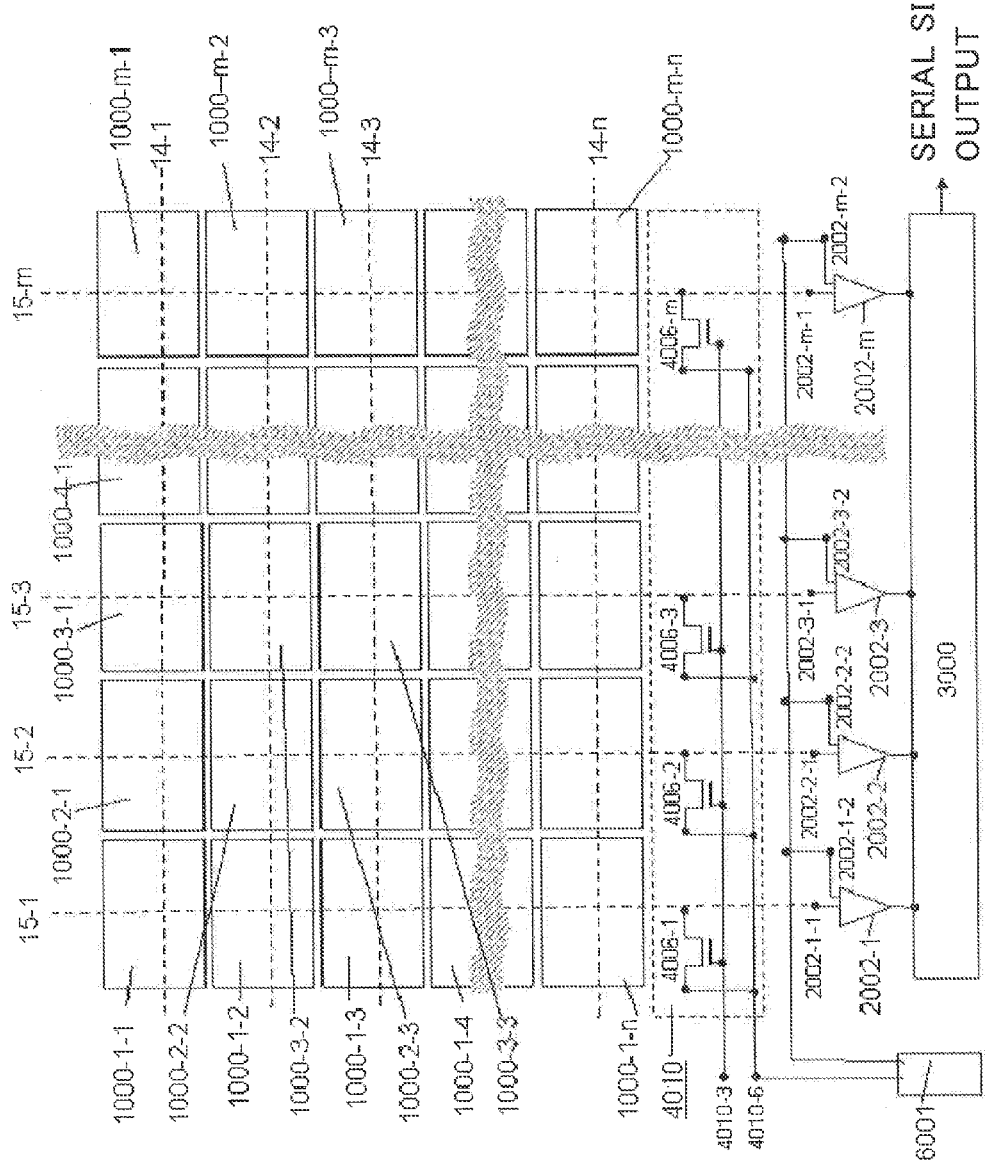
FIG. 16 illustrates a first example of a reset circuit of the photoelectric conversion array R1A of the present invention.

A specific circuit diagram of the reset circuit RSA1 is specifically illustrated in FIG. 16 using transistor symbol.

FIG. 16 illustrates a reset circuit 4010. The reset circuit 4010 includes a plurality of sixth transistors 4006-1, 4006-2, 4006-3, . . . , 4006-*j* (j not illustrated), . . . , 4006-*m*. Suffix numbers of the sixth transistors 4006-1, 4006-2, 4006-3, . . . , 4006-*j* (j not illustrated), . . . , 4006-*m* respectively correspond to those of the first output lines 15-1, 15-2, 15-3, . . . , 15-*j* (j not illustrated), . . . , 15-*m*. The sixth transistors 4006-1, 4006-2, 4006-3, . . . , 4006-*m* are field-effect transistors. One of the two outputs of the sixth transistor 4006-*j* (j=1, 2, 3, . . . , m) is connected to the first output line 15-*j* (j=1, 2, 3, . . . , m), and the other output is connected to the reset potential supply means 6001 (via a terminal 4010-6 of the reset circuit).

Inputs 2002-1-1, 2002-2-1, 2002-3-1, . . . , 2002-*m*-1 of sense amplifiers 2002-1, 2002-2, 2002-3, . . . , 2002-*m* are respectively connected to the first output lines 15-*j* (j=1, 2, 3, . . . , m), and the one of the two outputs of the sixth transistors 4006-*j* (j=1, 2, 3, . . . , m). The reset potential supply means 6001 is connected to the reference inputs 2002-1-2, 2002-2-2, 2002-2-2, . . . , 2002-*m*-2 of the sense amplifiers.

The control voltage pulse to cause the sixth transistor 4006-*j* (j=1, 2, 3, . . . , m) to turn from off to on is applied to the gate of the sixth transistor 4006-*j* (j=1, 2, 3, . . . , m) (via terminal 4010-3 of the reset circuit).

The control voltage pulse to cause the sixth transistor to turn on is applied to the gate of the sixth transistor 4006-*j* (j=1, 2, 3, . . . , m) during at least part of the time throughout which the first selection line is at the first selection potential, or at an earlier stage of the transition of the first selection line from the second selection potential to the first selection potential. The latter state is effective to reset the cell potential in the photoelectric conversion cell, and after the signal of the photoelectric conversion cell is read, the control voltage pulse may be applied during part of the period throughout which the first selection line remains at the second selection potential. In other words, at least at the moment sensing at which the first selection line 14 transitions from the first selection potential to the second selection potential starts, it is sufficient if the control potential causing the sixth transistor 4006-*j* (j=1, 2, 3, . . . , m) to turn off is applied to the gate of the sixth transistor 4006-*j* (j=1, 2, 3, . . . , m). If the reset potential in this case is set to be closer to the first selection potential side than ((the second selection potential)−Vth1), settlement of the reset operation is fast.

The control voltage pulse transitions in voltage to cause the sixth transistor to turn from off to on and from on to off. At the necessary timing, the control voltage pulse may be supplied by a control pulse supplying unit including a pulse generator circuit such as a known shift register.

Figure 17:
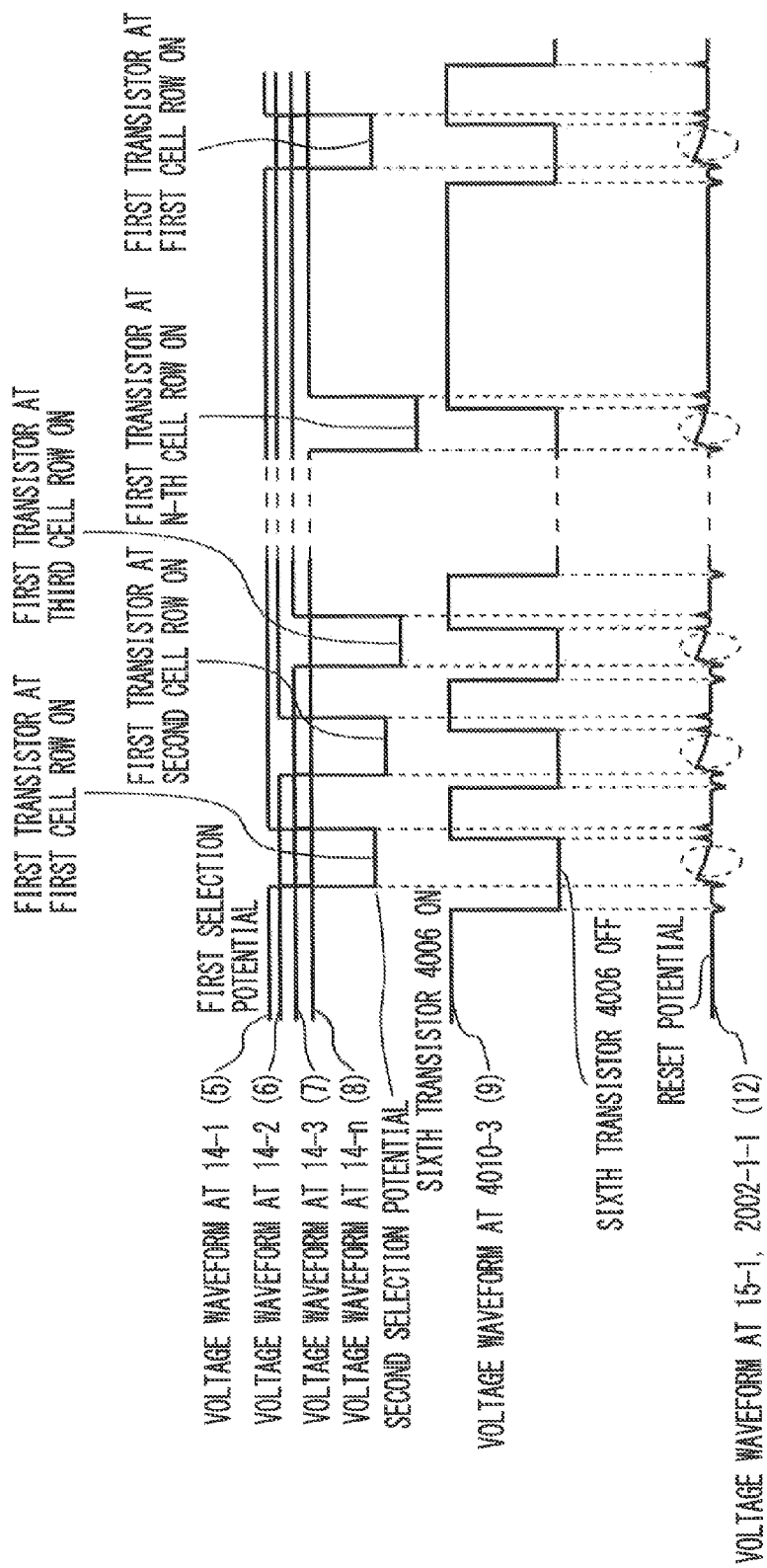
FIG. 17 illustrates an example of an operating waveform of the first example of the reset circuit of FIG. 16.

FIG. 17 is a waveform diagram illustrating an operation of the reset circuit RSA1. As denoted by waveforms (5), (6), (7), and (8), the first selection line 14-$j$ ($j$=1, 2, 3, ..., m) ($j$ is not illustrated) is driven by the voltage pulse that successively transitions from the first selection potential→the second selection potential→the first selection potential, and the electrical signal of the photoelectric conversion cell connected to the first selection line 14-$j$ is read. The gate of the sixth transistor 4006-$j$ ($j$=1, 2, 3, ..., m) ($j$ is not illustrated) of the reset circuit 4010 is driven by the control pulse having a voltage waveform (9). This waveform applies when the sixth transistor is an n-channel. During a phase in which the first selection line 14-$j$ ($j$=1, 2, 3, ..., m) is driven by the first selection potential, the control pulse causing the sixth transistor 4006-$j$ ($j$=1, 2, 3, ..., m) to turn on is applied to the gate of the sixth transistor. As illustrated, the control pulse causing the sixth transistor 4006-$j$ ($j$=1, 2, 3, ..., m) to turn on is applied to the gate of the sixth transistor in the latter half period thereafter in which the first selection line is driven by the second selection potential.

Voltage waveform (12) illustrates a voltage waveform on the first output line 15-1 and on the input 2002-1-1 of the sense amplifier 2002. Sensing is performed at a portion denoted by a broken circle. The same is true of the first output line 15-$j$ ($j$=1, 2, 3, ..., m) and the input 2002-1-$j$ ($j$=1, 2, 3, ..., m) of the sense amplifier 2002.

The polarity of the illustrated voltage waveforms applies when the sixth transistor is n-channel.

A reset circuit RSA2 (second example) is added to the array structure of FIG. 15 (second example of the photoelectrical conversion array R1A). The reset circuit RSA2 includes a plurality of fourth transistors and a single sixth transistor.

The fourth transistor is a field-effect transistor and includes two outputs (a source and a drain), and a gate, and the sixth transistor is a field-effect transistor and includes two outputs (a source and a drain), and a gate.

One of the outputs of each of the plurality of fourth transistors is connected to one of the plurality of first output lines, and the other output of each of the plurality of fourth transistors is connected to an input of a sense amplifier.

One of the outputs of the sixth transistor is connected to the other output of each of the plurality of fourth transistors.

The other output of the sixth transistor is supplied with a reset voltage.

A control voltage pulses to successively turn off, on, and then off again the plurality of fourth transistors are successively applied to each of the gates of the fourth transistors.

A control voltage pulse to cause the sixth transistor to turn on is applied to the gate of the sixth transistor when the fourth transistor is off or before the fourth transistor is transitioned from on to off. In other words, a control potential to cause the sixth transistor to turn off is applied to the gate of the sixth transistor at least except when one of the plurality of fourth transistors is transitioned from off to on.

In order to reset the cell internal potential only, the sixth transistor is simply turned on after reading, only while the fourth transistor remains on.

The control voltage pulse transitions in voltage to cause the fourth transistor or the sixth transistor to turn from off to on and from on to off. At the necessary timing, the control voltage pulse may be supplied by a control pulse supplying unit including a pulse generator circuit such as a known shift register.

Figure 18:
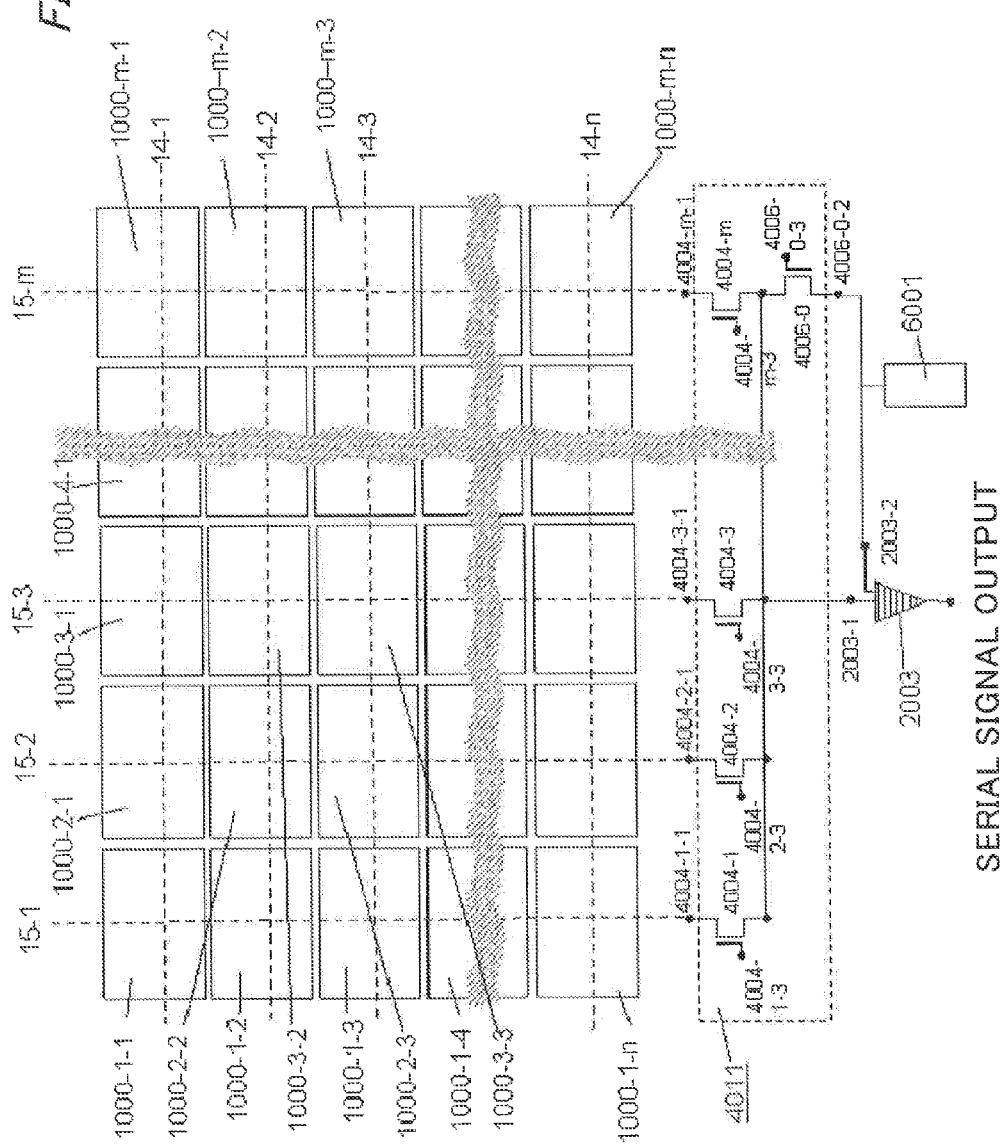
FIG. 18 illustrates a second example of the reset circuit of the photoelectric conversion array R1A of the present invention.

A specific circuit diagram of the reset circuit RSA2 is illustrated in FIG. 18 using transistor symbol.

FIG. 18 illustrates the entire reset circuit RSA2 4011. The reset circuit 4011 includes a plurality of fourth transistors 4004-1, 4004-2, 4004-3, ..., 4004-$m$, and the sixth transistor 4006-0. The fourth transistors 4004-1, 4004-2, 4004-3, ..., 4004-$m$ are field-effect transistors, and one-side outputs of the two outputs (a source and a drain), 4004-1-1, 4004-2-1, 4004-3-1, ..., 4004-$m$-1 are respectively connected to the first output lines 15-1, 15-2, 15-3, ..., 15-$m$. The other outputs of the fourth transistors 4004-1, 4004-2, 4004-3, ..., 4004-$m$ are connected to an input 2003-1 of a sense amplifier 2003. The sixth transistor 4006-0 is a field-effect transistor, and one of the two outputs (the source and the drain) is connected to the other outputs of the plurality of fourth transistors 4004-1, 4004-2, 4004-3, ..., 4004-$m$, and the other output 4006-0-2 of the two outputs of the sixth transistor is connected to the reset potential supply means 6001.

The sense amplifier 2003 has a reference input, and the reference input is connected to the reset potential.

Figure 19:
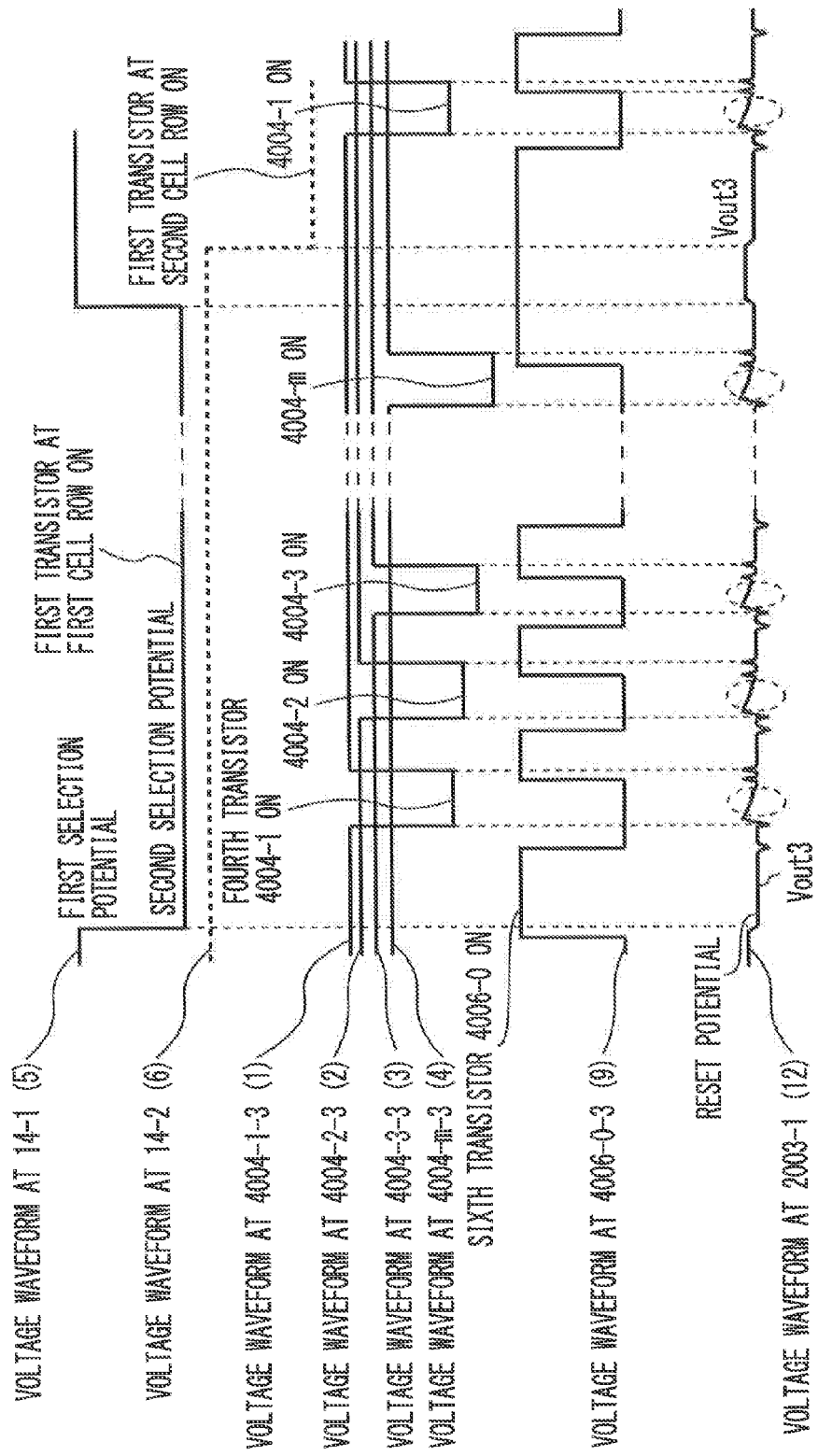
FIG. 19 illustrates an example of an operating waveform of the second example of the reset circuit of FIG. 18.

FIG. 19 is a waveform diagram of an operation of the reset circuit RSA2. To read an electrical signal from the photoelectric conversion cell, one first selection line 14-$i$($i$=1, 2, 3, ..., n) is driven to the second selection potential subsequent to the first selection potential. Voltage waveforms (5) and (6) illustrate that the second of the first selection line 14-2 is driven subsequent to the first selection line 14-1.

When the first selection line 14-$i$ is driven by the second selection potential, a voltage pulse to turn off→to on→to off the fourth transistor 4004-$j$ is applied to the gate 4004-$j$-3 of the fourth transistor 4004-$j$ ($j$=1, 2, 3, ..., m) as denoted by waveforms (1), (2), (3), and (4). In this way, the first output line 15-$j$ ($j$=1, 2, 3, ..., m) is successively connected to the input 2003-1 of the sense amplifier 2003, and an electrical signal of the photoelectric conversion cell at the intersection of the first selection line 14-$i$ and the first output line 15-$j$ is thus read. If a gate potential to cause the sixth transistor to turn on remains with the fourth transistor 4004-$j$ in an off state, the electrical signal of the photoelectric conversion cell with reference to the reset voltage is transferred to the input of the sense amplifier. Voltage waveform (9) further denotes an operational waveform in which the sixth transistor is turned on in a latter period while the fourth transistor 4004-$j$ is turned on. In such a case, the internal cell potential of the photoelectric conversion cell can be reset after the reading of the electrical signal.

The polarity of the voltage waveforms applies when the fourth transistor 4004-$j$ is a p-channel transistor, and the sixth transistor 4006-0 is an n-channel transistor.

A reset circuit for the photoelectric conversion arrays R1B1 and R1B2 may include a sixth transistor connected as described below.

The reset circuit RSB1 provided herein includes at least one sixth transistor that is a field-effect transistor and includes two outputs (a source and a drain), and a gate.

One of the outputs of the at least one sixth transistor is connected to at least one of the plurality of second output lines of the photoelectric conversion array R1B, and the other output of at least one sixth transistor is supplied with a reset potential.

A voltage pulse that turns on the sixth transistor is applied to the gate of the sixth transistor when the first selection line is at the first selection potential and the second selection line is at the third potential in the photoelectric conversion array R1B, or in a latter half of a period in which the first selection line transitions to the second selection potential, or in a latter half of a period in which the second selection line transitions to the fourth potential. In other words, a control potential is provided that causes the sixth transistor to turn off at the moment the first selection line transitions from the first selection potential to the second selection potential with the second selection line remaining at the fourth selection potential, or at the moment the second selection line transitions from the third selection potential to the fourth selection potential with the first selection line remaining at the second selection potential.

The first selection potential is a potential that blocks the electrical signal of the photoelectric conversion cell from the second cell output section, and the second selection potential is a potential that has a potential difference polarity in a direction that permits the electrical signal current of the photoelectric conversion element to flow easier than with the first selection potential.

The third selection potential is a potential that causes the second transistor to be non-conductive, and the fourth selection potential is a potential that is in a direction that causes the second transistor to be conductive.

In order to reset the cell internal potential only, the sixth transistor is simply turned on after reading while the first selection line remains at the second potential with the second selection line remaining at the fourth potential.

Figure 20:
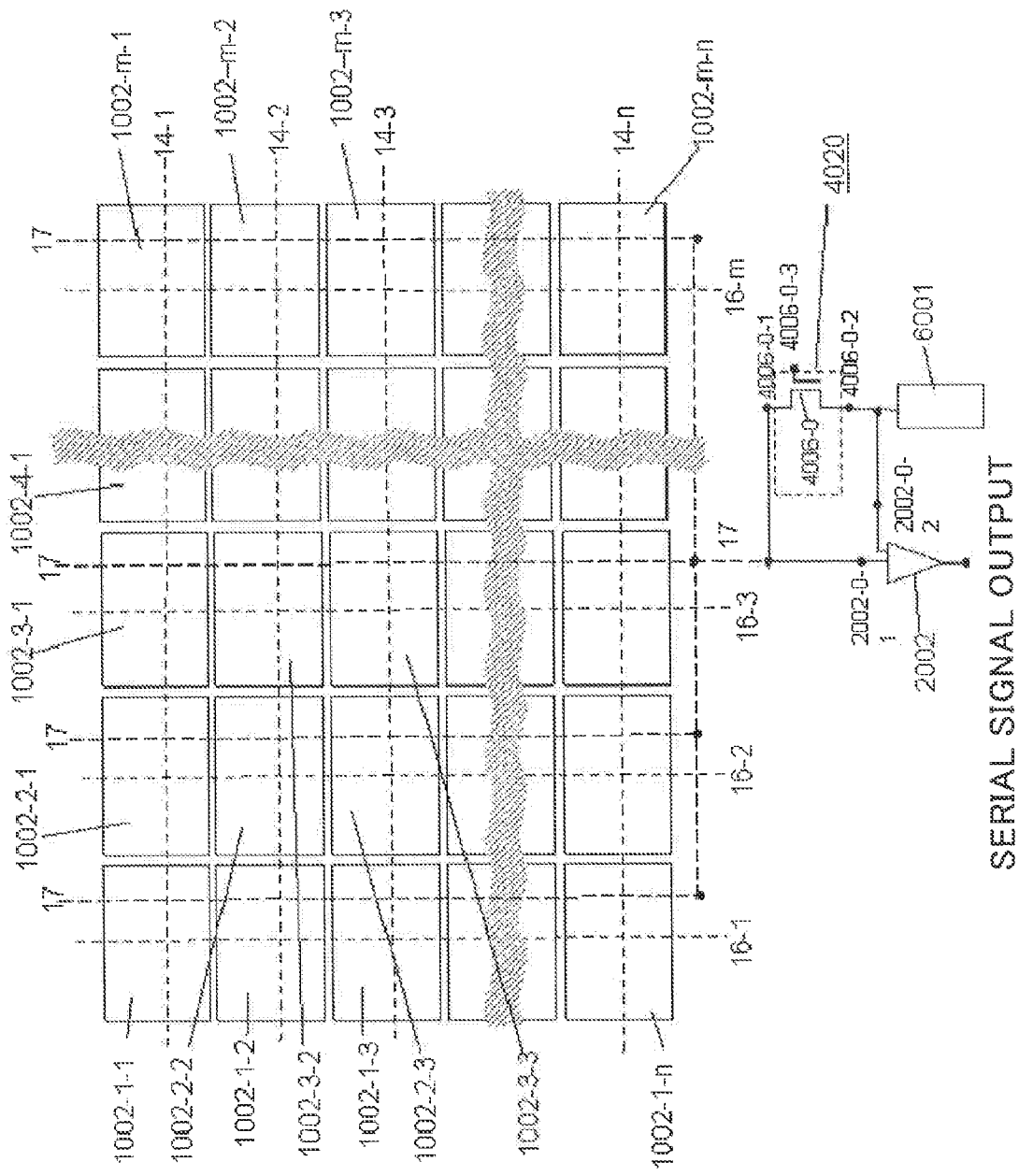
FIG. 20 illustrates a first example of a reset circuit of the photoelectric conversion array R1B of the present invention.

The circuit of the reset circuit RSB1 is illustrated in FIG. 20 using transistor symbols.

FIG. 20 illustrates the circuit of the reset circuit RSB1 4020. The reset circuit 4020 includes a sixth transistor 4006-0. The sixth transistor 4006-0 is a field-effect transistor and one 4006-0-1 of the two outputs (a source or a drain) of the sixth transistor 4006-0 is connected to the second output line 17, and the other output 4006-0-2 is connected to a reset potential supply means 6001.

An input 2002-0-1 of the sense amplifier 2002 is connected to the second output line 17, and the one output 4006-0-1 of the sixth transistor. A reference input 2002-0-2 of the sense amplifier 2002 is connected to the reset potential supply means 6001.

A voltage control pulse to cause the sixth transistor to turn on and off is applied to the gate 4006-0-3 of the sixth transistor.

The voltage control pulse to cause the sixth transistor to turn on is applied to during at least part of the period throughout which the first selection line is at the first selection potential with the second selection line remaining at the third selection potential, or in an earlier stage of the transition of the first selection line from the second selection potential to the first selection potential, or in an earlier stage of the transition of the second selection line from the fourth selection potential to the third selection potential. The latter cases are effective to reset the cell potential in the photoelectric conversion cell.

The control voltage pulse transitions in voltage to cause the sixth transistor to turn from off to on and from on to off. At the necessary timing, the control voltage pulse may be supplied by a control pulse supplying unit including a pulse generator circuit such as a known shift register.

If an array (such as the photoelectric conversion array R1C) is constructed of the photoelectrical conversion cells C1, parallel reading of FIG. 14 is not necessary. In order to apply a non-select potential to the third output section of a non-selected photoelectric conversion cell, a fifth output potential is supplied to the third output line 18, and a sixth potential is supplied to the third output line 18 connected to a selected photoelectric conversion cell. The one photoelectric conversion cell is thus selected from the array.

Figure 21:
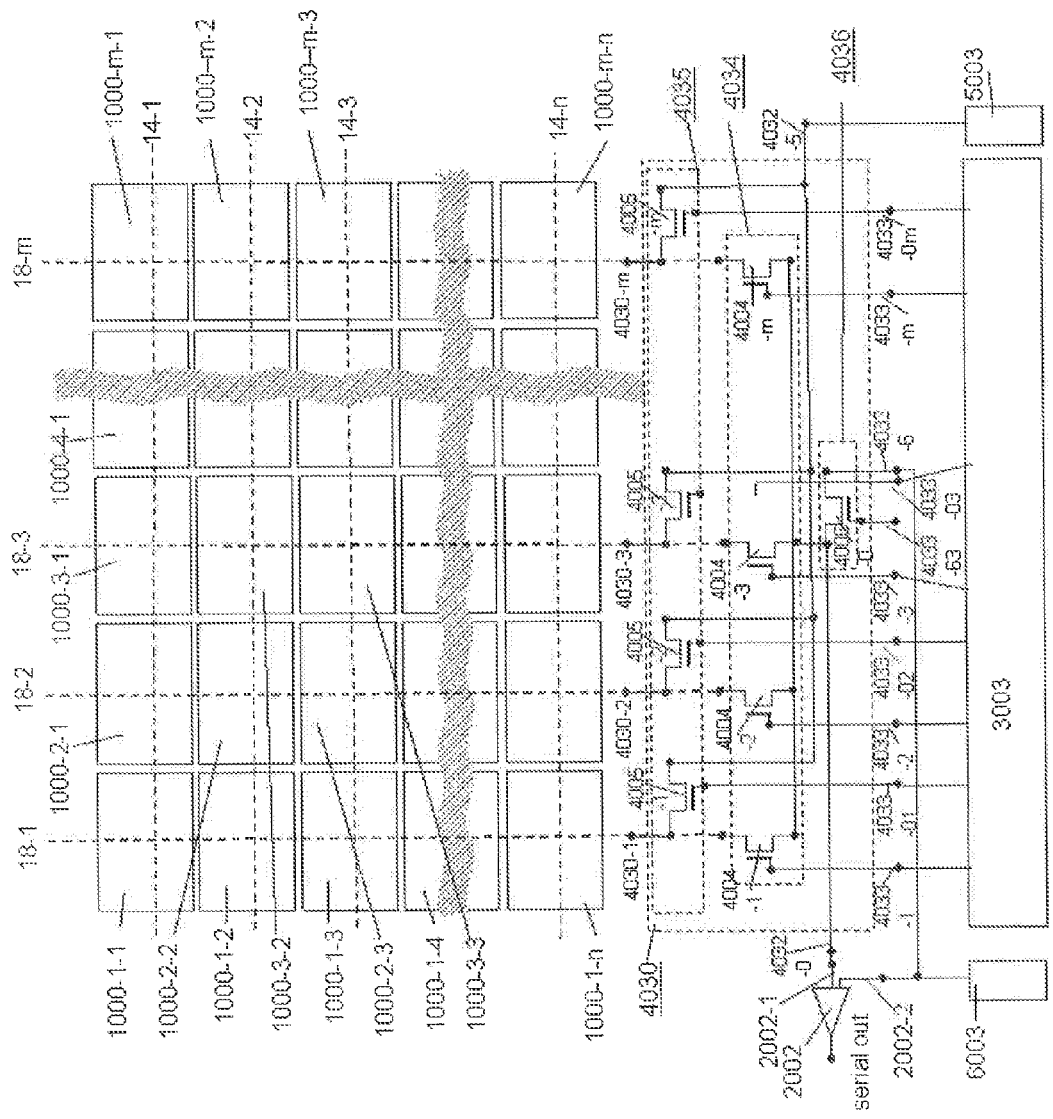
FIG. 21 illustrates an example of an electrical signal sense control circuit of the photoelectric conversion array R1C or R1A of the present invention.

As illustrated in FIG. 21, the third output line 18-$j$ (j=1, 2, 3, . . . , m, j is not illustrated) connected to the selected photoelectric conversion cell is
1) connected to the sense amplifier 2002 via the electrical signal sense control circuit 4030,
2) after being driven by the electrical signal sense control circuit 4030 to the sixth potential,
3) is switched to a floating state by the electrical signal sense control circuit 4030, and
4) the first selection line 14-$i$ connected to the selected photoelectric conversion cell among the plurality of first selection lines 14-$i$ (i=1, 2, 3, . . . , n) is driven from the first selection potential to the second selection potential, and causes the sense amplifier 2002 to sense the electrical signal from the selected photoelectric conversion cell.

The electrical signal may be any of a current, a charge, a voltage. The sense amplifier 2002 preferably has a reference signal input in addition to the electrical signal input. The reference signal input is supplied with the sixth potential. In current sensing, the current sensing is set to be performed in the vicinity of the sixth potential. The sixth potential is commonly shared as the reset potential. In voltage sensing, a signal voltage is sensed as a difference from the sixth potential. In charge sensing, a charge accumulated in the sense amplifier input is charge-voltage converted into a voltage via input capacitance of the sense amplifier 2002, stray capacitance of the third output line 18-$j$, and stray capacitance of a signal path of the electrical signal sense control circuit 4030, and the resulting voltage is sensed as a voltage change from the sixth potential.

For the photoelectrical conversion cell C1 connected to the selected third output line 18-$j$, a first selection line scan circuit successively drives a plurality of first selection lines 14-$i$ (i=1, 2, 3, . . . , n) to the second selection potential from the first selection potential, thereby reading the electrical signal of the photoelectrical conversion cell C1.

During at least part of the period throughout which any of the first selection lines 14-$i$ (i=1, 2, 3, . . . , n) is at the first selection potential, the electrical signal sense control circuit 4030 drives the third output line 18-$j$ to the fifth potential, thereby preventing mutual superimposition of an electrical signal from an adjacent photoelectrical conversion cell C1. When the electrical signal sense control circuit 4030 drives the third output line 18-$j$ to the fifth potential in an earlier stage of the transition of the first selection line from the second selection potential to the first selection potential, the cell potential in the photoelectrical conversion cell C1 can be reset. It is noted that the above steps 1) and 2) are interchangeable in order.

The electrical signal sense control circuit 4030 may be employed in the photoelectrical conversion array R1A constructed of the photoelectrical conversion cell A1. In the above discussion, the operational description can be applied to that array R1A if the third output line 18-$j$ is replaced with the first output line 15-$j$.

The electrical signal sense control circuit is structured as described below. More specifically, the electrical signal sense control circuit includes a connection circuit, a non-selected output potential setting circuit, and a selected output potential setting circuit.

The connection circuit is arranged between the plurality of third output lines of the photoelectric conversion array R1C and an input of a sense amplifier.

The connection circuit becomes a low resistance between one third output line selected from among the plurality of third output lines and the input of the sense amplifier and a high resistance between each of the other third output lines and the input of the sense amplifier.

The non-selected output potential setting circuit is arranged between the plurality of third output lines and fifth potential supply means.

The non-selected output potential setting circuit becomes a high resistance between the one third output line selected from among the plurality of third output lines and the fifth potential supply means, and supplies a fifth potential to a third output line not selected.

The selected output potential setting circuit is arranged between the connection circuit at the sense amplifier side (the input of the sense amplifier) and sixth potential supply means.

The selected output potential setting circuit supplies the sixth potential to the connection circuit at the sense amplifier side (the input of the sense amplifier) during at least part of the period throughout which the plurality of first selection lines in the photoelectric conversion array R1C are at the first selection potential, or prior to the transition of one of the plurality of first selection lines from the second selection potential to the first selection potential, and the selected output potential setting circuit becomes a high resistance in the remaining time. More specifically, the selected output potential setting circuit becomes a high resistance at least when one of the plurality of first selection lines of the photoelectric conversion array R1C transitions from the first selection potential to the second selection potential.

The first selection potential is a potential that blocks the electrical signal of the photoelectric conversion cell from the third cell output section, and the second selection potential is a potential that has a potential difference polarity in a direction that permits the electrical signal current of the photoelectric conversion element to flow easier than with the first selection potential.

Preferably, the sense amplifier includes a reference input in addition to the input and output, and the reference input is supplied with the sixth potential.

If the electrical signal sense control circuit including the first output line in place of the third output line, is applied to the photoelectrical conversion array R1A, parallel reading of the photoelectrical conversion cell A1 becomes unnecessary.

More specifically, the electrical signal sense control circuit, includes a connection circuit, a non-selected output potential setting circuit, and a selected output potential setting circuit.

The connection circuit is arranged between the plurality of first output lines of the photoelectric conversion array R1A and an input of a sense amplifier.

The connection circuit becomes a low resistance between one first output line selected from among the plurality of first output lines and the input of the sense amplifier and a high resistance between each of the other first output lines and the input of the sense amplifier.

The non-selected output potential setting circuit is arranged between the plurality of first output lines and fifth potential supply means.

The non-selected output potential setting circuit becomes a high resistance between the one first output line selected from among the plurality of first output lines and the fifth potential supply means, and supplies a fifth potential to a first output line not selected.

The selected output potential setting circuit is arranged between the input of the sense amplifier (the connection circuit at the sense amplifier side) and the sixth potential supply means.

The selected output potential setting circuit supplies the sixth potential to the input of the sense amplifier (the connection circuit at the sense amplifier side) during at least part of the period throughout which the plurality of first selection lines in the photoelectric conversion array R1A are at the first selection potential, or prior to the transition of one of the plurality of first selection lines from the second selection potential to the first selection potential, and the selected output potential setting circuit becomes a high resistance in the remaining time. More specifically, the selected output potential setting circuit becomes a high resistance at least when one of the plurality of first selection lines of the photoelectric conversion array transitions from the first selection potential to the second selection potential.

The first selection potential is a potential that blocks the electrical signal of the photoelectric conversion cell from the first cell output section, and the second selection potential is a potential that has a potential difference polarity in a direction that permits the electrical signal current of the photoelectric conversion element to flow easier than with the first selection potential.

The electrical signal sense control circuit described below is implemented using transistors.

More specifically, the connection circuit includes a plurality of fourth transistors.

Each of the plurality of fourth transistors is a field-effect transistor, and has two outputs (a source and a drain) with one of the two outputs being connected to each of the plurality of third output lines or each of the plurality of first output lines, and with the other output being connected to an input of a sense amplifier.

The non-selected output potential setting circuit includes a plurality of fifth transistors.

Each of the plurality of fifth transistors has two outputs with one of the two outputs being connected to each of the plurality of third output lines or each of the plurality of first output lines, and the other output being connected to fifth potential supply means.

The selected output potential setting circuit includes a sixth transistor.

The sixth transistor is a field-effect transistor and has two outputs (a source and a drain), with one of the two outputs being connected to the sixth potential supply means and the other of the two outputs being connected to the other of the outputs of each of the plurality of fourth transistors.

FIG. 21 illustrates a first example of the electrical signal sense control circuit.

FIG. 21 illustrates an entire electrical signal sense control circuit 4030. A connection circuit 4034 includes a plurality of fourth transistors 4004-1, 4004-2, 4004-3, ..., 4004-$m$ which make or break connections between a plurality of third output lines 18-1, 18-2, 18-3, ..., 18-$m$ and a sense amplifier 2002 in the photoelectric conversion array R1C in a time-series fashion. The plurality of fourth transistors 4004-1, 4004-2, 4004-3, ..., 4004-$m$ are field-effect transistors, and one-side outputs of the two outputs (sources and drains) are connected to the plurality of output lines of the array (18-1, 18-2, 18-3, ..., 18-$m$) via terminals 4030-1, 4030-2, 4030-3, ..., 4030-$m$ of the electrical signal sense control circuit 4030, respectively. The other outputs of the plurality of fourth transistors 4004-1, 4004-2, 4004-3, ..., 4004-$m$ are connected together to an output terminal 4032-0 of the electrical signal sense control circuit 4030, and then connected to an input terminal 2002-1 of the sense amplifier 2002 via the output terminal 4032-0.

A plurality of fifth transistors 4005-1, 4005-2, 4005-3, ..., 4005-$m$ make or break connections between a plurality of third output lines 18-1, 18-2, 18-3, ..., 18-$m$ and a fifth potential supply means 5003 in the photoelectric conversion array R1C in a time-series fashion. The fifth transistors 4005-1, 4005-2, 4005-3, . . . , 4005-$m$ may be field-effect transistors or bipolar transistors, and serves as a non-selected output potential setting circuit 4035. One-side outputs of the two outputs (a source and a drain or an emitter and a collector) of the fifth transistors 4005-1, 4005-2, 4005-3, . . . , 4005-$m$ are connected to the plurality of the third output lines of the array (18-1, 18-2, 18-3, . . . , 18-$m$) in the photoelectric conversion array R1C via terminals 4030-1, 4030-2, 4030-3, . . . , 4030-$m$ of the electrical signal sense control circuit 4030, respectively. The other outputs of the plurality of fifth transistors 4005-1, 4005-2, 4005-3, . . . , 4005-$m$ are connected together to a fifth potential supply means 5003 via a terminal 4032-5 of the electrical signal sense control circuit 4030.

A shift register 3003 controls on and off operations of the fourth transistors 4004-1, 4004-2, 4004-3, . . . , 4004-$m$ and the fifth transistors 4005-1, 4005-2, 4005-3, . . . , 4005-$m$ in a time-series fashion. The shift register 3003 applies pulses for the on and off operations to the gates of the fourth transistors 4004-1, 4004-2, 4004-3, . . . , 4004-$m$ via terminals 4033-1, 4033-2, 4033-3, . . . , 4033-$m$, and to the gates or bases of the fifth transistors 4005-1, 4005-2, 4005-3, . . . , 4005-$m$ via terminals 4033-01, 4033-02, 4033-03, . . . , 4033-0$m$.

If the fourth transistors 4004-1, 4004-2, 4004-3, . . . , 4004-$m$ and the fifth transistors 4005-1, 4005-2, 4005-3, . . . , 4005-$m$ are respectively complementary, i.e., combinations of 4004-1 and 4005-1, 4004-2 and 4005-2, 4004-3 and 4005-3, . . . , 4004-$m$ and 4005-$m$ are complementary transistors to each other, the number of control pulses to be provided to the gate or the base of each combination is advantageously reduced from two to one.

The sixth transistor 4006-0 serves as the selected output potential setting circuit 4036, and is a field-effect transistor. One of the two outputs (the source and drain) of the sixth transistor 4006-0 is connected to a sixth potential supply means 6003 via a terminal 4032-6 of the electrical signal sense control circuit 4030, and the other output is connected to the other outputs of the plurality of fourth transistors 4004-1, 4004-2, 4004-3, . . . , 4004-$m$, and to the input 2002-1 of the sense amplifier 2002 via a terminal 4032-0 of the electrical signal sense control circuit 4030.

The sixth transistor 4006-0 is controlled by a control pulse applied to the gate thereof via a terminal 4033-63 such that the sixth transistor 4006-0 is turned on during at least part of a phase in which the photoelectrical conversion cell C1 is not selected.

The phase in which the photoelectrical conversion cell C1 is not selected refers to a phase in which all the first selection lines 14-1, 14-2, 14-3, . . . , 14-$n$ in the photoelectric conversion array R1C are at the first potential. A phase in which the photoelectrical conversion cell C1 is selected refers to a phase in which one of the first selection lines 14-1, 14-2, 14-3, . . . , 14-$n$ in the photoelectric conversion array R1C is at the second potential.

The sense amplifier 2002 preferably includes a reference potential input 2002-2 in addition to a signal input 2002-1. The reference potential input 2002-2 is supplied with the sixth potential by the sixth potential supply means 6003. In the current sensing, a signal input is sensed in the vicinity of the sixth potential. In response to a voltage input, a difference from the sixth potential is sensed, amplified and then output. In no-signal input phase, the electrical signal sense control circuit 4030 preferably has a reset function to reset the input of the sense amplifier to the sixth potential.

Also, in the phase in which the photoelectrical conversion cell C1 is selected, the transition from off to on causes the internal potential of the photoelectrical conversion cell C1 to be reset subsequent to reading. To settle the reset operation faster, as previously described, the sixth potential supply means 6003 is preferably set to be a value closer to the first selection potential side than ((the second selection potential)−Vth1−Vbe (or Vd)).

It is noted that each terminal of the electrical signal sense control circuit 4030, the terminals of the sense amplifier 2002, the terminal of the fifth potential supply means 5003, and the terminal of the sixth potential supply means 6003 do not have the physical form of terminals if these elements are integrated on the same chip as the photoelectric conversion array R1C or the like, and those terminals are provided in the form of a conductive film extending between elements and blocks. The term "terminal" described herein is simply a term that is used for a delineation between functional blocks, and does not necessarily mean a physical form. In other words, the terminal is simply a connection point. In an integrated circuit, the fifth potential supply means 5003 or the sixth potential supply means 6003 may be a wiring line that supplies the fifth potential or the sixth potential from pads, or may be a power supply circuit that supplies the fifth potential or the sixth potential.

Figure 22:
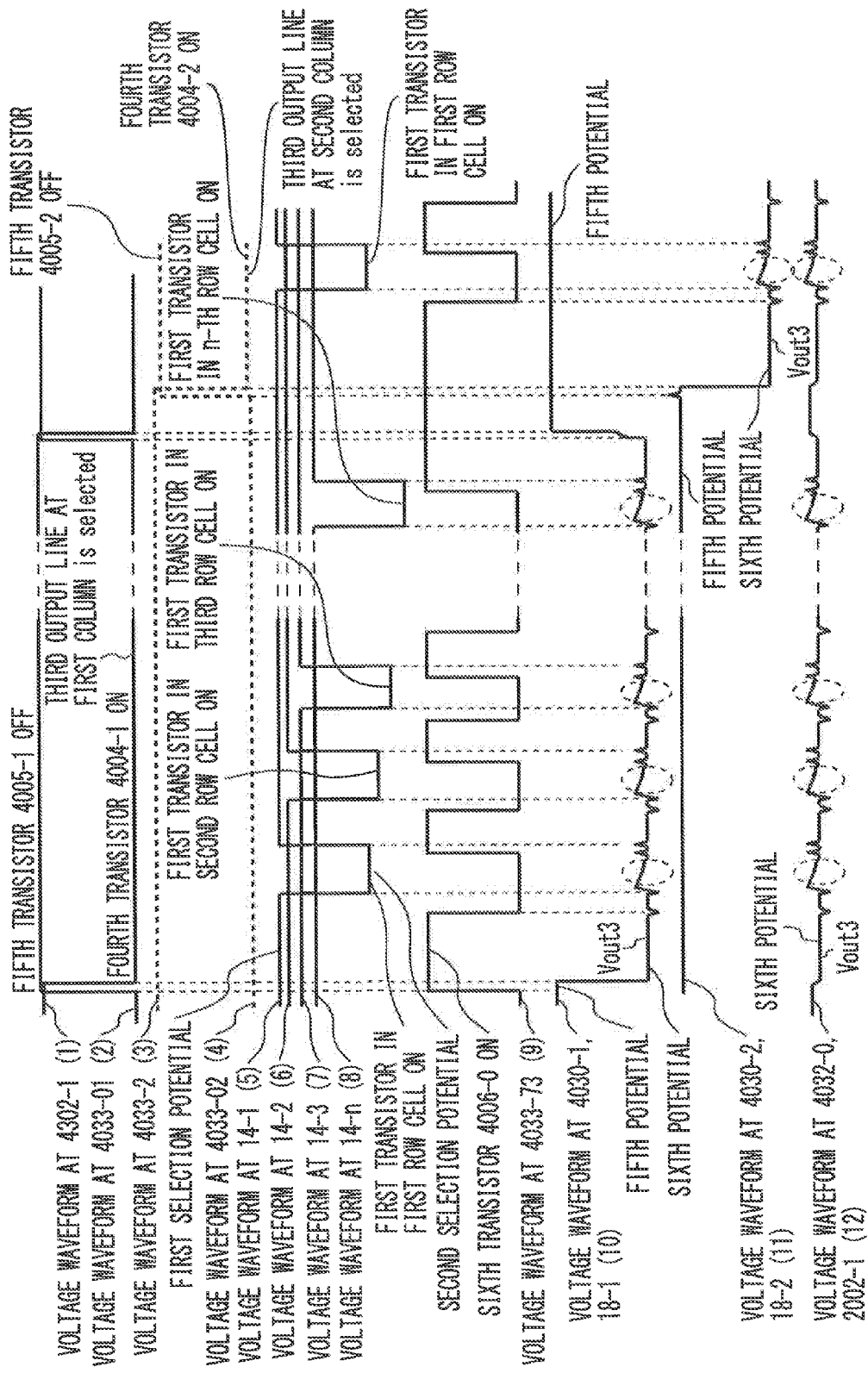
FIG. 22 illustrates an example of an operating waveform of the electrical signal sense control circuit of FIG. 21.

FIG. 22 illustrates an example of voltage waveforms related to the electrical signal sense control circuit 4030, the circuit diagram of which is illustrated in FIG. 21.

The polarities of the voltage waveforms apply if the fourth transistors 4004-1, 4004-2, 4004-3, . . . , 4004-$m$ are p-channel field-effect transistors, the fifth transistors 4005-1, 4005-2, 4005-3, . . . , 4005-$m$ are also p-channel field-effect transistors, and the sixth transistor 4006-0 is an n-channel field-effect transistor. The first transistor 10 in the photoelectrical conversion cell C1 is a p-channel field-effect transistor.

Waveforms (1), (2), (3), and (4) represent voltage pulses that are applied to the gates of the pairs of fifth transistors and fourth transistors (4005-1 and 4004-1), (4005-2 and 4004-2), . . . to control the on and off operations thereof.

Waveform (1) denotes a voltage waveform that is applied to the gate of the fourth transistor 4004-1 (via a terminal 4033-1) to drive the fourth transistor 4004-1 from off to on.

Waveform (2) denotes a voltage waveform that is applied to the gate of the fifth transistor 4005-1 (a terminal 4033-01) to drive the fourth transistor 4005-1 from on to off.

These voltages are supplied to control the potential of the third output lines 18-1, 18-2, 18-3, . . . , 18-$m$ in the photoelectric conversion array R1C.

Waveforms (1) and (2) are supplied in time sequence that ensures a phase in which both the fourth and the fifth transistors are off before one of the fourth and fifth transistors turns on. More specifically, after the fifth transistor 4005-1 turns off in waveform (2), the fourth transistor 4004-1 turns on in waveform (1). Next, after the fourth transistor 4004-1 turns off, the fifth transistor 4005-1 turns on.

The sixth transistor 4006-0 having one output connected to the sixth potential supply means 6003 is turned on so that the sixth potential is applied to the third output line 18-1 when the fourth transistor 4004-1 turns on. To this end, a voltage pulse denoted by waveform (9) is applied to the gate of the sixth transistor 4006-0 (via terminal 4033-63).

In the phase in which the fourth transistor 4004-1 remains on, the first selection lines 14-1, 14-2, 14-3, . . . , 14-$n$ are respectively successively driven from the first selection potential→the second selection potential→the first selection potential as illustrated in waveforms (5), (6), (7), and (8). In this way, the electrical signals of the photoelectrical conversion cells C1 at the intersections of the third output line 18-1 and the first selection lines 14-1, 14-2, 14-3, . . . , 14-$n$ are successively read via a path of the third output line 18-1→the terminal 4030-1→the one output of the fourth transistor 4004-1→the other output→the terminal 4032. The read electrical signals are successively input to the sense amplifier via the terminal 2002-1 of the sense amplifier.

Waveform (10) is then a voltage waveform of the third output line 18-1 (and the terminal 4030-1 connected to the third output line 18-1). Waveform (12) is then a waveform of the sense amplifier input 2002-1 (also a waveform of the terminal 4032-0). Broken circles in FIG. 22 denote time phases in which the electrical signal is sensed. Waveform (10), i.e., the fifth potential of the third output line 18-1 is not transferred to the sense amplifier input since the fifth transistor 4005-1 is in an off state.

The above discussions of the waveforms are related to those at nodes of circuits when the fourth transistor 4004-1 turns on. In a phase represented by waveforms (3) and (4), when the fourth transistors 4004-2 at the next column turn on, the first selection lines 14-1, 14-2, 14-3, . . . , 14-$n$ are successively driven to the first selection potential, to the second selection potential, and then to the first selection potential, and the electrical signals of the photoelectrical conversion cells C1 at the intersections of the third output line 18-2 and the first selection lines 14-1, 14-2, 14-3, . . . , 14-$n$ are successively read. A voltage change of the third output line 18-2 is denoted by waveform (11).

Similarly, in a phase in which the fourth transistor 4004-$j$ at the j-th column (not illustrated) turns on, the first selection lines 14-1, 14-2, 14-3, . . . , 14-$n$ are successively driven to the first selection potential, to the second selection potential, and then to the first selection potential, and the electrical signals of the photoelectrical conversion cells C1 at the intersections of the third output line 18-$j$ and the first selection lines 14-1, 14-2, 14-3, . . . , 14-$n$ are successively read.

The sense circuit input is reset to the sixth potential between the electrical signal reading operations by causing the sixth transistor 4006-0 to turn on when the electrical signal is not read (all the first selection lines 14-1, 14-2, 14-3, . . . , 14-$n$ are at the first potential). The output of the sense amplifier 2002 with the reference potential input 2002-2 supplied with the sixth potential is at zero or a constant potential while no electrical signal is input.

In a phase after the electrical signal is read with one of the first selection lines 14-1, 14-2, 14-3, . . . , 14-$n$ at the second selection potential and the sixth transistor 4006-0 is turned on, the internal cell potential of the selected photoelectrical conversion cell C1 can be reset. The cell internal potential can be fast settled by setting the sixth potential to a value closer to the first selection potential side than ((the second selection potential)−Vth1−Vbe (or Vd)).

EMBODIMENTS

A structure example Alstr of the photoelectrical conversion cell A1 of the present invention is described below. More specifically, the photoelectric conversion cell Alstr includes, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of the second semiconductor region, a seventh semiconductor region having a seventh surface and the conductivity type opposite to the first conductivity type, and spaced apart from the second semiconductor region, on or in the first surface of the first semiconductor region, an eighth semiconductor region having an eighth surface and the opposite conductivity type, and spaced apart from the second and seventh semiconductor regions and opposed to the seventh semiconductor region along the first surface, on or in the first surface of the first semiconductor region, and a first gate insulating film having at least part thereof provided on or in the first surface interposed between the seventh semiconductor region and the eighth semiconductor region, and a first gate that bridges between the seventh semiconductor region and the eighth semiconductor region on the first gate insulating film.

The third semiconductor regions, each excluding one third semiconductor region, is electrically connected to one of the second semiconductor regions not provided therewithin.

The second semiconductor region not electrically connected to the third semiconductor region forms a main photoelectric conversion junction with the first semiconductor region.

The one third semiconductor region not connected to the second semiconductor region is electrically connected to the seventh semiconductor region.

The eighth semiconductor region serves as the first cell output section of the photoelectric conversion cell.

The first gate serves as the first cell selection section.

Figure 23:
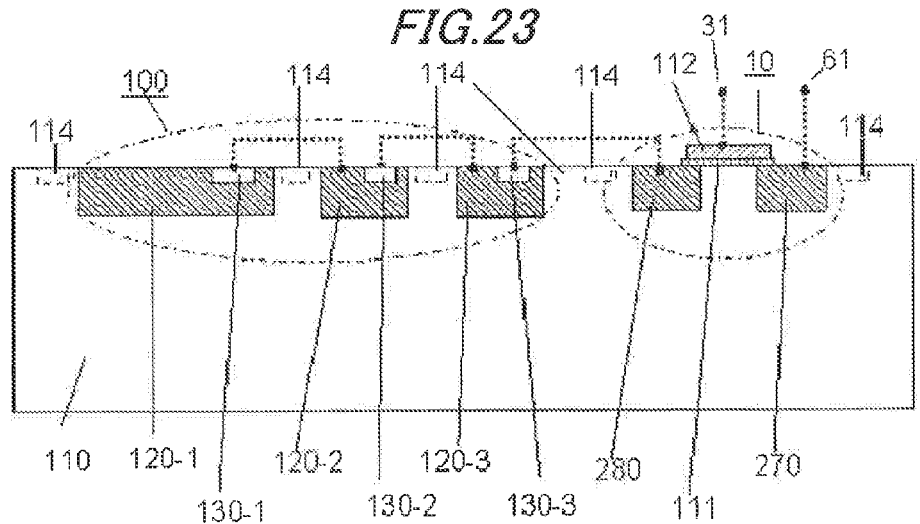
FIG. 23 is an example of a sectional view of the photoelectric conversion cell A1 of the present invention.

FIG. 23 is a sectional view of the structure example and electrical connection of the photoelectric conversion cell Alstr. FIG. 23 illustrates the first semiconductor region 110, second semiconductor regions 120-1, 120-2, and 120-3, and third semiconductor regions 130-1, 130-2, and 130-3. A photoelectric conversion element 100 includes the first semiconductor region 110, the second semiconductor regions 120-1, 120-2, and 120-3, and the third semiconductor regions 130-1, 130-2, and 130-3.

Internal connections between the semiconductor regions are diagrammatically denoted by broken lines. As illustrated, the second semiconductor region 120-2 is connected to the third semiconductor region 130-1 other than the third semiconductor region 130-2 provided in the second semiconductor region 120-2. The second semiconductor region 120-3 is connected to the third semiconductor region 130-2 other than the third semiconductor region 130-3 provided in the second semiconductor region 120-3. The third semiconductor region 130-3 is connected to an eighth semiconductor region 280. A seventh semiconductor region 270 serves as a first cell output section of the photoelectrical conversion cell A1. A connection 61 diagrammatically illustrates a connection to the first output line 15 to construct the photoelectrical conversion array R1A. A first insulating film 111 is formed on a portion of a first surface of the first semiconductor region 110 interposed between the seventh semiconductor region 270 and the eighth semiconductor region 280 and surfaces of the seventh semiconductor region 270 and the eighth semiconductor region 280 adjacent to the first surface. Via the first insulating film 111, a first gate 112 induces or extinguishes a channel on or in the first surface of the first semiconductor region 110 between the seventh semiconductor region 270 and the eighth semiconductor region 280 by a voltage change. A first transistor 10 includes the seventh semiconductor region 270, the eighth semiconductor region 280, the first surface interposed between the seventh semiconductor region 270 and the eighth semiconductor region 280, the first insulating film 111, and the first gate 112. The first gate 112 serves as the first cell selction section of the photoelectric conversion cell A1.

A connection 31 diagrammatically illustrates a connection to the first selection line 14 when the photoelectrical conversion array R1A is constructed.

Figure 24:
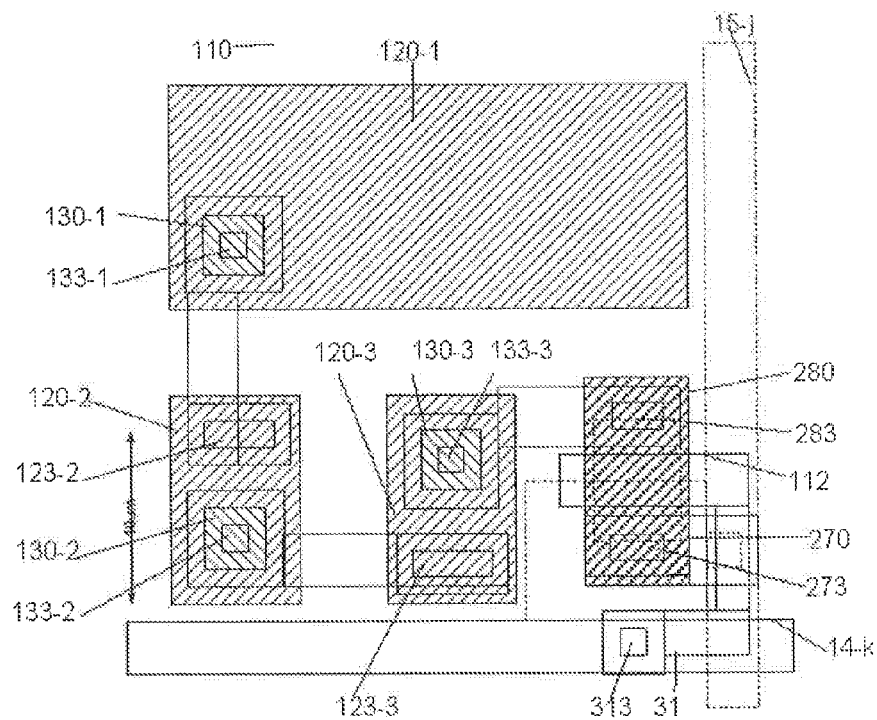
FIG. 24 is an example of a plan view of the photoelectric conversion cell A1 of the present invention.

The first semiconductor region 110 having the structure of FIG. 23 may be of n-type or p-type. In one embodiment, the following combination is possible if the structure of FIG. 24 is implemented using silicon semiconductor.

The first semiconductor region 110 is an n-type silicon substrate of 1 to 10 Ωcm. The first semiconductor region 110 may be implemented as a high-resistance n-type epitaxial layer (10 to 20 μm thick) on a low-resistance n-type Si substrate in order to increase long wavelength sensitivity, to prevent light information mixing between adjacent cells, and to control noise.

The second semiconductor regions 120-1, 120-2, and 120-3 may be manufactured of p-type silicon having a surface impurity concentration of 1E18-1E19 (atoms/cc).

The third semiconductor regions 130-1, 130-2, and 130-3 may have a thickness smaller than the depth of the second semiconductor regions 120-1, 120-2, and 120-3 respectively accommodating the third semiconductor regions 130-1, 130-2, and 130-3. The third semiconductor regions 130-1, 130-2, and 130-3 are n-type silicon having a surface impurity concentration of 1E19-1E21 (atoms/cc) higher than that of the second semiconductor regions 120-1, 120-2, and 120-3 respectively accommodating the third semiconductor regions 130-1, 130-2, and 130-3.

The seventh semiconductor region 270 and the eighth semiconductor region 280 are manufactured of p-type silicon having a surface impurity concentration of 1E19-1E20 (atoms/cc).

The first insulating film 111 is a silicon dioxide film having a thickness ranging from 30 to 40 nm, and the first gate 112 is manufactured of p-type polycrystal silicon.

FIG. 24 is a plane view of the photoelectric conversion cell Alstr. In FIG. 24, elements having the same reference numerals as those in FIG. 23 are identical in structure and function. The surface of the first semiconductor region 110 of FIG. 24 is covered with a semiconductor region 114 to prevent surface leakage current. Contact holes not illustrated in FIG. 23 are illustrated in FIG. 24. Contact holes 123-2 and 123-3 are contact holes for interconnection that are respectively opened in insulating films provided on the second semiconductor regions 120-2 and 120-3. Contact holes 133-1, 133-2, and 133-3 are contact holes for interconnection that are respectively opened in insulating films provided on the third semiconductor regions 130-1, 130-2, and 130-3. Contact holes 273 and 283 are contact holes for interconnection that are respectively opened in insulating films provided on the seventh semiconductor region 270 and the eighth semiconductor region 280. Contact hole 313 is a contact hole opened in an insulating film provided on a first gate extension portion. The connections diagrammatically denoted by broken lines in FIG. 23 are illustrated but without reference numeral in FIG. 24. It is noted that dimension (channel width) of the seventh semiconductor region 270 and the eighth semiconductor region 280 may be set to be larger than that in FIG. 24 in order to increase the electrical signal reading speed or the reset speed of the cell.

Figure 25:
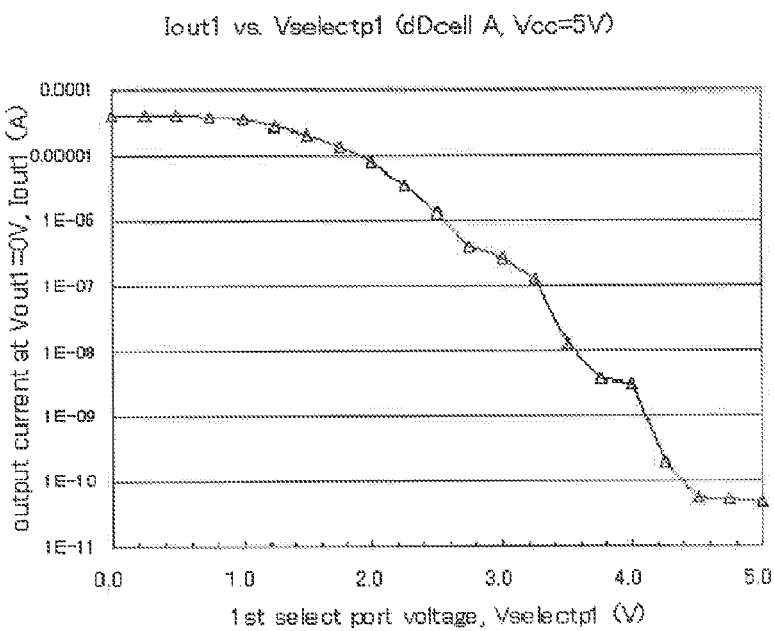
FIG. 25 illustrates electrical characteristics of a prototype of the photoelectric conversion cell A1 of the present invention (with the abscissa representing a first selection voltage, and the ordinate representing an electrical signal current obtained from a first output section).

In FIG. 25, the first selection line 14 used to construct an array is labeled 14-$k$, and the first output line 15 used to construct the array is labeled 15-$j$.

The photoelectric conversion cell Alstr shown in FIG. 24 is manufactured by modifying one dose level in ion implantation and one pair of drive-in temperature and time in diffusion process out of a set of processes of a standard CMOS to form the second semiconductor regions 120-1, 120-2, and 120-3.

FIG. 25 illustrates current vs. potential of the first selection section characteristics of the first cell output section of above fabricated photoelectric conversion cell Alstr under weak light irradiation. It has been recognized that the first cell output section outputs a current about 380000 times as high as a photocurrent of a photodiode formed by the second semiconductor region 120-1 and the first semiconductor region 110. In the photoelectric conversion cell Alstr, the first selection potential is set to be Vcc (5 V), and the second selection potential is set to be Vss (0V). In such a case, there is no large change in the signal current Iout1 read from the first output line 15 (kept at 0V) until a potential of the first cell selection section Vselectp1 becomes at least 1 V higher than the second selection potential. A current from the photoelectric conversion cell Alstr is blocked until the potential of the first cell selection section remains at about 0.5 V lower than the first selection potential. A dark current of the photoelectric conversion cell Alstr is at a level of 1E-11A. Since illumination used in this experiment is darker than normal indoor illuminance by order of magnitude, the upper limit of the output current is not the one plotted in FIG. 25. If illuminance is increased, the output current increases by one order of magnitude. The photoelectric conversion cell Alstr of the present invention can thus provide a dynamic range of seven orders of magnitude. The upper limit of the output current is determined by the channel width of the first transistor 10.

An operation of applying to the first selection line 14 a voltage pulse that transitions from the first selection potential to the second selection potential resulted in a transient current about 400000 times as high as a discharge current of charge stored in the junction capacitance between the second semiconductor region 120-1 and the first semiconductor region 110. Even if the charge stored in the junction is small, a signal current large enough to be discriminated from the noise can be read.

As illustrated, Vout1 represents the first cell output voltage, the ordinate Iout1 represents a DC current read from the first cell output section with the first cell output voltage Vout1 at 0 V, and the abscissa 1st select port voltage, i.e., Vselectp1 represents a first cell selection voltage. These voltages are represented in voltage as the potential of the first cell output and the potential of the first cell selection section with respect to one power supply potential Vss of the photoelectric conversion cell (fixed to 0 V at the measurement). The other power supply voltage Vcc used in the measurement is set to be Vss+5 V.

A structure example of B2$str$ of the photoelectric conversion cell B2 of the present invention described below. More specifically, the photoelectric conversion cell B2$str$ includes, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of the second semiconductor region, a fourth semiconductor region having a fourth surface and the opposite conductivity type, and spaced apart from the one or plural second semiconductor regions on or in the first surface of the first semiconductor region, fifth and sixth semiconductor regions having the first conductivity type, and spaced apart from each other on or in the fourth surface of the fourth semiconductor region, a fourth gate insulating film having at least part thereof provided on or in the fourth surface of the fourth semiconductor region interposed between the fifth semiconductor region and the sixth semiconductor region, and a fourth gate that bridges between the fifth semiconductor region and the sixth semiconductor region on the fourth gate insulating film, a seventh semiconductor region having a seventh surface and the conductivity type opposite to the first conductivity type, and spaced apart from the second and fourth semiconductor regions on or in the first surface of the first semiconductor region, an eighth semiconductor region having an eighth surface and the opposite conductivity type, and spaced apart from the second, fourth, and seventh semiconductor regions and opposed to the seventh semiconductor region along the first surface on or in the first surface of the first semiconductor region, and a first gate insulating film having at least part thereof arrange on or in the first surface interposed between the seventh semiconductor region and the eighth semiconductor region, and a first gate that bridges between the seventh semiconductor region and the eight semiconductor region on the first gate insulating film.

The third semiconductor regions, each excluding one third semiconductor region, are electrically connected to one of the second semiconductor regions not arranged therewithin.

The second semiconductor region not electrically connected to the third semiconductor region forms a main photoelectric conversion junction with the first semiconductor region.

The one third semiconductor region not connected to the second semiconductor region is electrically connected to the fifth semiconductor region.

The sixth semiconductor region is electrically connected to the eighth semiconductor region.

The seventh semiconductor region serves as the second cell output section of the photoelectric conversion cell, the first gate serves as the first cell selection section, and the fourth gate serves as the second cell selection section.

In the photoelectric conversion cell B2*str*, the fourth semiconductor region can be arranged in continuous formation with the eighth semiconductor region.

In the photoelectric conversion cell B2*str*, the eighth semiconductor region and the sixth semiconductor region can be in contact with each other at an impurity concentration portion of a level equal to or higher than 2E19 atoms/cc for electrical connection.

The "electrical connected" state between two regions in the present invention means that the two regions are connected to each other via a resistance value that does not affect the operation of each region. Typically, a conductive film is arranged on an insulating film serving as passivation on two regions, and two contact holes are opened on the insulating film on the two regions. The conductive film is provided to be in contact through the contact holes on or in the surfaces of the regions. If the two regions are capacitance coupled with each other via the conductor film on the insulating film without the contact hole, the two regions are considered as being AC coupled.

If the eighth semiconductor region and the sixth semiconductor region are in contact with each other via a high impurity concentration portion of 2E19 atoms/cc or higher, a low-resistance junction that makes unnecessary the arrangement of a conductive film to electrically connect the two regions may be formed.

Figure 26:
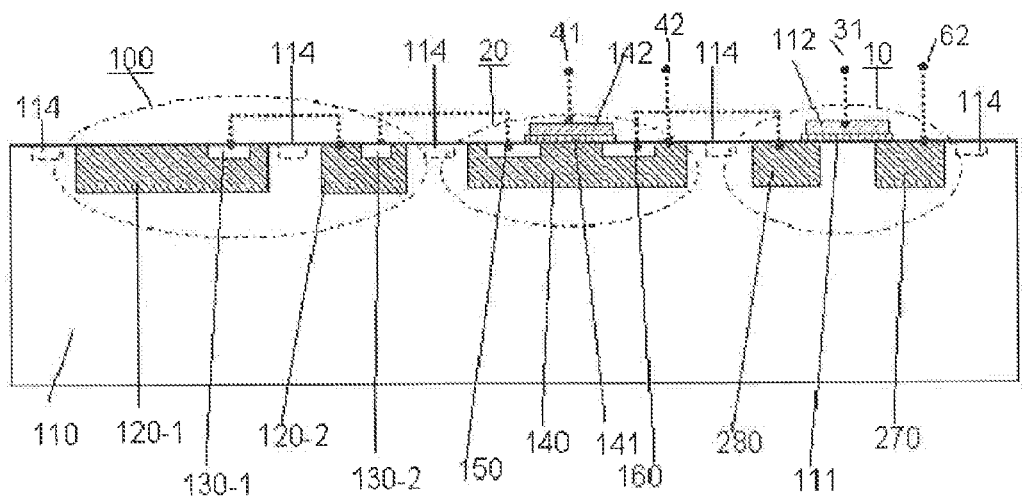
FIG. 26 is an example of a sectional view of the photoelectric conversion cell B2 of the present invention.

FIG. 26 is a sectional view of the structure and electrical connection of the photoelectric conversion cell B2*str*. As FIG. 23, FIG. 26 illustrates the first semiconductor region 110, the second semiconductor regions 120-1, and 120-2, and the third semiconductor regions 130-1, and 130-2. The photoelectric conversion element 100 of the photoelectrical conversion cell B2 includes the first semiconductor region 110, the second semiconductor regions 120-1, and 120-2, and the third semiconductor regions 130-1, and 130-2. Also illustrated are the seventh semiconductor region 270, the eighth semiconductor region 280, the first insulating film 111, and the first gate 112. The first insulating film 111 is formed on a portion of the first surface of the first semiconductor region 110 interposed between the seventh semiconductor region 270 and the eighth semiconductor region 280 and surfaces of the seventh semiconductor region 270 and the eighth semiconductor region 280 adjacent to the first surface. Via the first insulating film 111, a first gate 112 induces or extinguishes a channel on or in the first surface of the first semiconductor region 110 between the seventh semiconductor region 270 and the eighth semiconductor region 280 in response to its voltage change. The first transistor 10 includes the seventh semiconductor region 270, the eighth semiconductor region 280, the first surface interposed between the seventh semiconductor region 270 and the eighth semiconductor region 280, the first insulating film 111, and the first gate 112. Also illustrated are a fourth semiconductor region 140, a fifth semiconductor region 150, a sixth semiconductor region 160, a fourth insulating film 141 provided on a fourth surface of the fourth semiconductor region, and a fourth gate 142 provided on the fourth insulating film. The fourth insulating film 141 is formed on a portion of the fourth surface of the fourth semiconductor region 140 interposed between the fifth semiconductor region 150 and the sixth semiconductor region 160 and surfaces of the fifth semiconductor region 150 and the sixth semiconductor region 160 adjacent to the first surface. Via the fourth insulating film 141, the fourth gate 142 induces or extinguishes a channel on or in the fourth surface of the fourth semiconductor region 140 between the fifth semiconductor region 150 and the sixth semiconductor region 160 in response to its voltage change. A second transistor 20 includes the fifth semiconductor region 150, the sixth semiconductor region 160, the fourth surface of the fourth semiconductor region 140 interposed between the fifth semiconductor region 150 and the sixth semiconductor region 160, the fourth insulating film 141, and the fourth gate 142.

Internal connections between the semiconductor regions are diagrammatically denoted by broken lines. As illustrated, the second semiconductor region 120-2 is connected to the third semiconductor region 130-1 other than the third semiconductor region 130-2 arranged in the second semiconductor region 120-2. The third semiconductor region 130-2 is connected to the fifth semiconductor region 150. The sixth semiconductor region 160 is connected to the eighth semiconductor region 280. The seventh semiconductor region 270 serves as a second cell output of the photoelectrical conversion cell B2. A connection 62 diagrammatically illustrates a connection to the second output line 17 to construct the photoelectrical conversion array R1B2. The first gate 112 serves as a first cell selection section of the photoelectrical conversion cell B2. A connection 31 diagrammatically illustrates a connection to the first selection line 14 to construct the photoelectrical conversion array R1B2. The fourth gate 142 serves as a second cell selection section of the photoelectrical conversion cell B2. A connection 41 diagrammatically illustrates a connection to the second selection line 16 to construct the photoelectrical conversion array R1B2. A connection 42 diagrammatically illustrates a connection to the fourth bias potential of the fourth semiconductor region 140.

Figure 27:
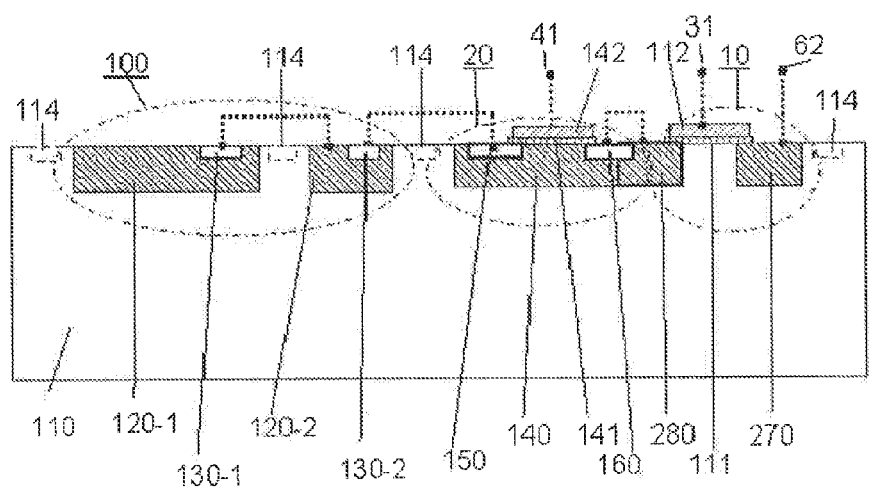
FIG. 27 is another example of the sectional view of the photoelectric conversion cell B2 of the present invention.

FIG. 27 is a sectional view of the structure and electrical connection of the photoelectric conversion cell B2*str* of FIG. 26, wherein the fourth semiconductor region 140 is arranged to be in contact with the eighth semiconductor region 280. With this arrangement, the interconnection line of the fourth bias potential to the fourth semiconductor region 140 becomes unnecessary, an area used between the fourth semiconductor region 140 and the eighth semiconductor region 280 is reduced, and the area of the photoelectric conversion cell B2*str* is also reduced.

As also illustrated, the sixth semiconductor region 160 can be arranged to be in contact with the eighth semiconductor region 280. The area of the photoelectric conversion cell B2*str* is even more reduced. If the impurity concentration in the contact portion between the sixth semiconductor region 160 and the eighth semiconductor region 280 is 2E19 atoms/cc or higher, contact resistance becomes smaller. As a result, an interconnection via a metal film (diagrammatically denoted by broken line) becomes unnecessary.

The example of structure B1*str* of the photoelectrical conversion cell B1 of the present invention is described below. More specifically, the photoelectric conversion cell B1*str* includes, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of the second semiconductor region, a seventh semiconductor region having a seventh surface and the conductivity type opposite to the first conductivity type, and spaced apart from the second semiconductor region on or in the first surface of the first semiconductor region, an eighth semiconductor region having an eighth surface and the opposite conductivity type, and spaced apart from the seventh semiconductor region and opposed to the seventh semiconductor region on or in the first surface of the first semiconductor region, a first gate insulating film having at least part thereof provided on or in the first surface interposed between the seventh semiconductor region and the eighth semiconductor region, and a first gate that bridges between the seventh semiconductor region and the eighth semiconductor region on the first gate insulating film, a ninth semiconductor region having a ninth surface and the conductivity type opposite to the first conductivity type, and spaced apart from the second, seventh, and eighth semiconductor regions on or in the first surface of the first semiconductor region, a tenth semiconductor region having a tenth surface and the opposite conductivity type, and spaced apart from the second, eighth, and ninth semiconductor regions and opposed to the ninth semiconductor region on or in the first surface of the first semiconductor region, and a second gate insulating film having at least part thereof arranged on or in the first surface interposed between the ninth semiconductor region and the tenth semiconductor region, and a second gate that bridges between the ninth semiconductor region and the tenth semiconductor region on the second gate insulating film.

The third semiconductor regions, each excluding one third semiconductor region, is electrically connected to one of the second semiconductor regions not provided therewithin.

The second semiconductor region not electrically connected to the third semiconductor region forms a main photoelectric conversion junction with the first semiconductor region.

The excluded one third semiconductor region not connected to the second semiconductor region is electrically connected to the eighth semiconductor region.

The seventh semiconductor region is electrically connected to the tenth semiconductor region.

The ninth semiconductor region serves as the second output section of the photoelectric conversion cell.

The first gate serves as the first cell selection section and the second gate serves as the second cell selection section.

Figure 28:
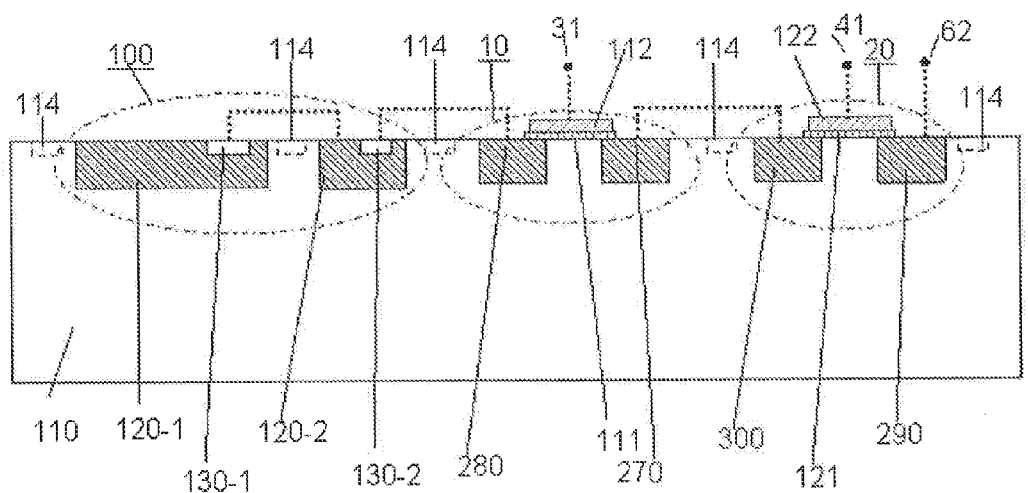
FIG. 28 is an example of a sectional view of the photoelectric conversion cell B1 of the present invention.

FIG. 28 is a sectional view of the structure and electrical connection of the photoelectric conversion cell B1*str*. As FIG. 23, FIG. 28 illustrates the first semiconductor region 110, the second semiconductor regions 120-1, and 120-2, and the third semiconductor regions 130-1, and 130-2. The photoelectric conversion element 100 of the photoelectrical conversion cell B2 includes the first semiconductor region 110, the second semiconductor regions 120-1, and 120-2, and the third semiconductor regions 130-1, and 130-2. Also illustrated are the seventh semiconductor region 270, the eighth semiconductor region 280, the first insulating film 111, and the first gate 112. The first insulating film 111 is formed on a portion of the first surface of the first semiconductor region 110 interposed between the seventh semiconductor region 270 and the eighth semiconductor region 280 and surfaces of the seventh semiconductor region 270 and the eighth semiconductor region 280 adjacent to the first surface. Via the first insulating film 111, the first gate 112 induces or extinguishes a channel on or in the first surface of the first semiconductor region 110 between the seventh semiconductor region 270 and the eighth semiconductor region 280 in response to its voltage change. The first transistor 10 includes the seventh semiconductor region 270, the eighth semiconductor region 280, the first surface interposed between the seventh semiconductor region 270 and the eighth semiconductor region 280, the first insulating film 111, and the first gate 112. Also illustrated are a ninth semiconductor region 290, a tenth semiconductor region 300, a second insulating film 121 arranged on the first surface of the first semiconductor region, and a second gate 122 arranged on the second insulating film. The second insulating film 121 is formed on a portion of the first surface of the first semiconductor region 110 interposed between the ninth semiconductor region 290 and the tenth semiconductor region 300 and surfaces of the ninth semiconductor region 290 and the tenth semiconductor region 300 adjacent to the first surface. Via the second insulating film 121, the second gate 122 induces or extinguishes a channel on or in the first surface of the first semiconductor region 110 between the ninth semiconductor region 290 and the tenth semiconductor region 300 in response to its voltage change. A second transistor 20 includes the ninth semiconductor region 290, the tenth semiconductor region 300, the first surface of the first semiconductor region 110 interposed between the ninth semiconductor region 290 and the tenth semiconductor region 300, the second insulating film 121, and the second gate 122.

Internal connections between the semiconductor regions are diagrammatically denoted by broken lines. As illustrated, the second semiconductor region 120-2 is connected to the third semiconductor region 130-1 other than the third semiconductor region 130-2 provided in the second semiconductor region 120-2. The third semiconductor region 130-2 is connected to the eighth semiconductor region 280. The seventh semiconductor region 270 is connected to the tenth semiconductor region 300. The ninth semiconductor region 290 serves as a second cell output section of the photoelectrical conversion cell B1. A connection 62 diagrammatically illustrates a connection to the second output line 17 to construct the photoelectrical conversion array R1B1. The first gate 112 serves as a first cell selection section of the photoelectrical conversion cell B1. A connection 31 diagrammatically illustrates a connection to the first selection line 14 to construct the photoelectrical conversion array R1B1. The second gate 122 serves as a second cell selection section of the photoelectrical conversion cell B1. A connection 41 diagrammatically illustrates a connection to the second selection line 16 to construct the photoelectrical conversion array R1B1.

It is noted that the seventh semiconductor region 270 and the tenth semiconductor region 300 may be arranged to be contact with each other rather than being spaced apart in order to reduce the area of the photoelectrical conversion cell B1.

The structural example C1str of the photoelectrical conversion cell C1 of the present is described below.

More specifically, the photoelectric conversion cell C1str includes, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of the second semiconductor region, an eleventh semiconductor region having an eleventh surface and the opposite conductivity type, and spaced apart from the one or plural second semiconductor regions on or in the first surface of the first semiconductor region, a twelfth semiconductor region having a twelfth surface and the first conductivity type, and provided on or in the eleventh surface of the eleventh semiconductor region, a seventh semiconductor region having a seventh surface and the opposite conductivity type, and spaced apart from the one or plural second semiconductor regions on or in the first surface of the first semiconductor region, an eighth semiconductor region having an eighth surface and the opposite conductivity type, and spaced apart from the one or plural second semiconductor regions, the seventh semiconductor region, and the eleventh semiconductor region, and opposed to the seventh semiconductor region along the first surface, on or in the first surface of the first semiconductor region, and a first gate insulating film having at least part thereof provided on or in the first surface interposed between the seventh semiconductor region and the eighth semiconductor region, and a first gate that bridges between the seventh semiconductor region and the eight semiconductor region on the first gate insulating film.

The second semiconductor regions, each excluding at least one second semiconductor region, are electrically connected to one of the third semiconductor regions not provided therewithin.

The third semiconductor regions, each excluding at least one third semiconductor region, are electrically connected to one of the second semiconductor regions not provided therewithin.

The one third semiconductor region is electrically connected to the eighth semiconductor region.

The seventh semiconductor region is electrically connected to the eleventh semiconductor region.

The first gate serves as the first cell selection section.

The twelfth semiconductor region serves as the third cell selection section.

The seventh semiconductor region and the eleventh semiconductor region can be arranged to be in contact with each other to reduce the cell area.

Figure 29:
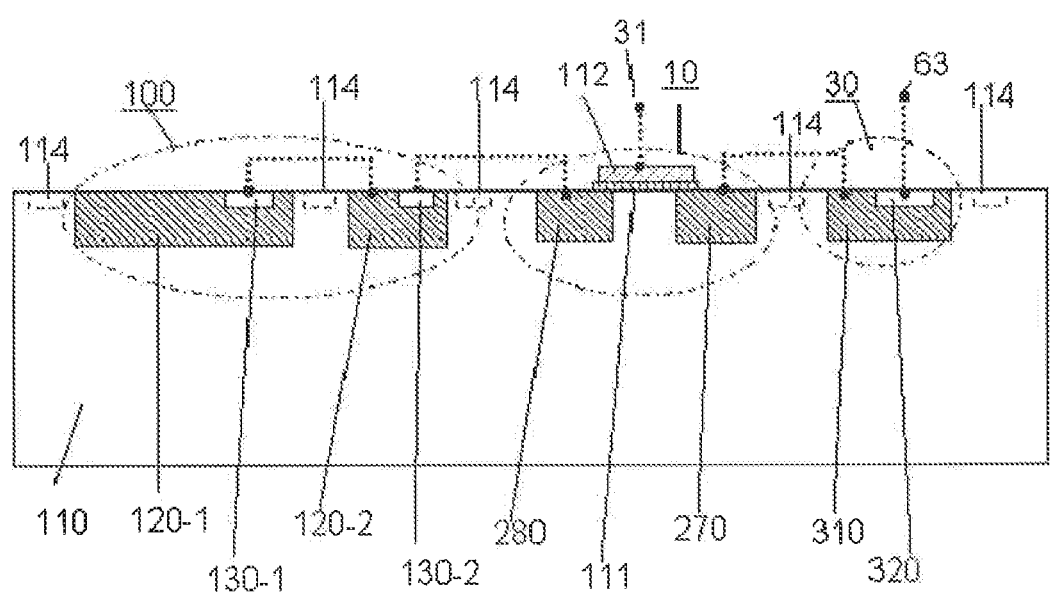
FIG. 29 is an example of a sectional view of the photoelectric conversion cell C1 of the present invention.

FIG. 29 is a sectional view of the structure and electrical connection of the photoelectric conversion cell C1str. As FIG. 23, FIG. 29 illustrates the first semiconductor region 110, the second semiconductor regions 120-1, and 120-2, and the third semiconductor regions 130-1, and 130-2. The photoelectric conversion element 100 of the photoelectrical conversion cell C1 includes the first semiconductor region 110, the second semiconductor regions 120-1, and 120-2, and the third semiconductor regions 130-1, and 130-2. Also illustrated are the seventh semiconductor region 270, the eighth semiconductor region 280, the first insulating film 111, and the first gate 112. The first insulating film 111 is formed on a portion of the first surface of the first semiconductor region 110 interposed between the seventh semiconductor region 270 and the eighth semiconductor region 280 and surfaces of the seventh semiconductor region 270 and the eighth semiconductor region 280 adjacent to the first surface. Via the first insulating film 111, the first gate 112 induces or extinguishes a channel on or in the first surface of the first semiconductor region 110 between the seventh semiconductor region 270 and the eighth semiconductor region 280 in response to its voltage change. The first transistor 10 includes the seventh semiconductor region 270, the eighth semiconductor region 280, the first surface interposed between the seventh semiconductor region 270 and the eighth semiconductor region 280, the first insulating film 111, and the first gate 112. Also illustrated are an eleventh semiconductor region 310 and a twelfth semiconductor region 320. A third element 30 includes the eleventh semiconductor region 310, the twelfth semiconductor region 320 and the first semiconductor region 110.

Internal connections between the semiconductor regions are diagrammatically denoted by broken lines. As illustrated, the second semiconductor region 120-2 is connected to the third semiconductor region 130-1 other than the third semiconductor region 130-2 provided in the second semiconductor region 120-2. The third semiconductor region 130-2 is connected to the eighth semiconductor region 280. The seventh semiconductor region 270 is connected to the eleventh semiconductor region 310. The first gate 112 serves as a first cell selection section of the photoelectrical conversion cell C1. A connection 31 diagrammatically illustrates a connection to the first selection line 14 to construct the photoelectrical conversion array R1C.

The twelfth semiconductor region 320 serves as a third cell output section of the photoelectrical conversion cell C1. Rectifying property of a junction formed between the twelfth semiconductor region 320 and the eleventh semiconductor region 310 is used to select the photoelectrical conversion cell C1. When the third cell output section is at the fifth output potential, the junction is reverse biased, and no current is read from the photoelectrical conversion cell C1. When the third cell output section is at the sixth output potential, the junction is forward biased and a signal current is read from the photoelectrical conversion cell C1. Impurity concentration levels of the respective semiconductor regions can be set so that when read, the current to be read is amplified through an operation of a bipolar transistor having the first semiconductor region 110 serving as a collector, the eleventh semiconductor region 310 serving as a base, and the twelfth semiconductor region 320 serving as an emitter. A connection 63 diagrammatically illustrates a connection to the third output line 18 to construct the photoelectric conversion array R1C.

The seventh semiconductor region 270 and the eleventh semiconductor region 310 can be arranged to be in contact with each other with no separation therebetween to reduce the cell area.

INDUSTRIAL APPLICABILITY

According to the present invention, high-sensitivity and wide-dynamic range photoelectric conversion cells and arrays are manufactured using nearly standard MOSLSI manufacturing process. Even if silicon is used for semiconductor, an array having a (near) infrared ray sensitivity is obtained. The cells and arrays may find applications in the field of monitoring cameras for safety purposes at low costs.

REFERENCE NUMERALS

10: First transistor
11: First output section of a first transistor
12: Second output section of the first transistor
13: Third control section of the first transistor
14, 14-k: First selection line
15, 15-j: First output line
16: Second selection line
17: Second output line
18: Third output line
20: Second transistor
24: Fourth output section of a second transistor
25: Fifth output section of the second transistor
26: Sixth control section of the second transistor
30: Third element
31: Connection to the first selection line for array connection (diagrammatic notation)
41: Connection to the second selection line for array connection (diagrammatic notation)
42: Connection to fourth bias voltage (diagrammatic notation)
36: Third output section of a third element
37: Seventh input section of the third element
38: Eighth output section of the third element
61: Connection to the first output line to form array (diagrammatic notation)
62: Connection to the second output line to from the array (diagrammatic notation)
63: Connection to the third output line to form the array (diagrammatic notation)
100: Photoelectric conversion element
101: First electrical signal output section of the photoelectric conversion element
102: Second electrical signal output section of the photoelectric conversion element
110: First semiconductor region
111: First insulating film
112: First gate
114: Higher-impurity concentration region
120: Second semiconductor region
123: Contact hole
130: Third semiconductor region
133: Contact hole
140: Fourth semiconductor region
141: Fourth insulating film
142: Fourth gate
150: Fifth semiconductor region
160: Sixth semiconductor region
270: Seventh semiconductor region
273: Contact hole
280: Eighth semiconductor region
283: Contact hole
310: Eleventh semiconductor region
320: Twelfth semiconductor region
313: Contact hole
1000: Photoelectric conversion cell
1002: Photoelectric conversion cell
2000: Sense amplifier
2001: Sense amplifier
2002: Sense amplifier with reference input
2010: First cell bias
2030: Third cell bias
3000: Switch circuit
3001: Switch circuit
3003: Shift register circuit
4004: Fourth transistor
4005: Fifth transistor
4006: Sixth transistor
4010: Reset circuit
4011: Reset circuit
4020: Reset circuit
4030: Electrical signal sense control circuit
4034: Connection circuit
4035: Non-selected output potential setting circuit
4036: Non-selected output potential setting circuit
5003: Fifth potential supply means
6001: Reset potential supply means
6003: Sixth potential supply means

The invention claimed is:

1. A photoelectric conversion cell comprising, at least,
a photoelectric conversion element having an amplification function, and
a first transistor,
wherein the photoelectric conversion element includes a first electrical signal output section and a second electrical signal output section,
wherein the first transistor includes a first output section, a second output section, and a third control section that controls a current flowing between the first output section and the second output section or resistance between the first output section and the second output section,
wherein the second electrical signal output section of the photoelectric conversion element has to the first electrical signal output section a potential difference polarity that permits conduction of an electrical signal current from or to the first electrical signal output section and another potential difference polarity that permits less conduction of the electrical signal current from or to the first electrical signal output section,
wherein the current flowing between the first output section and the second output section or the resistance between the first output section and the second output section is mainly controlled by a voltage or a current between the third control section and the second output section,
wherein the second electrical signal output section is connected to the second output section, and the first output section serves as a first cell output section,
wherein the third control section serves as a first cell selection section, and
wherein an electrical signal of the photoelectric conversion cell is read from the first cell output section by driving the first cell selection section to a potential direction of the potential difference polarity that permits conduction of the electrical signal current, and the electrical signal of the photoelectric conversion cell is blocked from the first cell output section by driving the first cell selection section to a direction opposite to the potential direction of the potential difference polarity that permits conduction of the electrical signal current.

2. A photoelectric conversion cell comprising, at least,
a photoelectric conversion element having an amplification function,
a first transistor, and
a second transistor,
wherein the photoelectric conversion element includes a first electrical signal output section and a second electrical signal output section,
wherein the first transistor includes a first output section, a second output section, and a third control section that controls a current flowing between the first output section and the second output section or resistance between the first output section and the second output section, wherein the second transistor includes a fourth output section, a fifth output section, and a sixth control section that controls a current flowing between the fourth output section and the fifth output section or resistance between the fourth output section and the fifth output section, wherein the second electrical signal output section of the photoelectric conversion element has to the first electrical signal output section a potential difference polarity that permits conduction of an electrical signal current from or to the first electrical signal output section and another potential difference polarity that permits less conduction of the electrical signal current from or to the first electrical signal output section, wherein the current flowing between the first output section and the second output section in the first transistor or the resistance between the first output section and the second output section in the first transistor is mainly controlled by a voltage or a current between the third control section and the second output section, wherein the second electrical signal output section is connected to the second output section of the first transistor, wherein the fifth output section of the second transistor is connected to the first output section of the first transistor, wherein the fourth output section of the second transistor serves as a second cell output section, wherein the third control section of the first transistor serves as a first cell selection section, wherein the sixth control section of the second transistor serves as a second cell selection section, wherein the second cell selection section is driven to a potential direction in which the second transistor becomes conductive, wherein an electrical signal of the photoelectric conversion cell is read from the second cell output section by driving the first cell selection section to a potential direction of the potential difference polarity that permits conduction of the electrical signal current, and wherein the electrical signal of the photoelectric conversion cell is blocked from the second cell output section by driving the first cell selection section to a direction opposite to the potential direction of the potential difference polarity that permits conduction of the electrical signal current, or the electrical signal of the photoelectric conversion cell is blocked from the second cell output section regardless of the potential of the first cell selection section by driving the second cell selection section in a potential direction that causes the second transistor to be non-conductive.

3. A photoelectric conversion cell comprising, at least, a photoelectric conversion element having an amplification function, a first transistor, and a second transistor, wherein the photoelectric conversion element includes a first electrical signal output section and a second electrical signal output section, wherein the first transistor includes a first output section, a second output section, and a third control section that controls a current flowing between the first output section and the second output section or resistance between the first output section and the second output section, wherein the second transistor includes a fourth output section, a fifth output section, and a sixth control section that controls a current flowing between the fourth output section and the fifth output section or resistance between the fourth output section and the fifth output section, wherein the second electrical signal output section of the photoelectric conversion element has to the first electrical signal output section a potential difference polarity that permits conduction of an electrical signal current from or to the first electrical signal output section and another potential difference polarity property that permits less conduction of the electrical signal current from or to the first electrical signal output section, wherein the current flowing between the first output section and the second output section in the first transistor or the resistance between the first output section and the second output section in the first transistor is mainly controlled by a voltage or a current between the third control section and the second output section, wherein the second electrical signal output section is connected to the fourth output section of the second transistor, wherein the second output section of the first transistor is connected to the fifth output section of the second transistor, wherein the first output section of the first transistor serves as a second cell output section, wherein the third control section of the first transistor serves as a first cell selection section, wherein the sixth control section of the second transistor serves as a second cell selection section, wherein the second cell selection section is driven to a potential direction in which the second transistor becomes conductive, wherein an electrical signal of the photoelectric conversion cell is read from the second cell output section by driving the first cell selection section to a potential direction of the potential difference polarity that permits conduction of the electrical signal current, and wherein the electrical signal of the photoelectric conversion cell is blocked from the second cell output section by driving the first cell selection section to a direction opposite to the potential direction of the potential difference polarity that permits conduction of the electrical signal current, or the electrical signal of the photoelectric conversion cell is blocked from the second cell output section regardless of the potential of the first cell selection section by driving the second cell selection section to a potential direction that causes the second transistor to be non-conductive.

4. A photoelectric conversion cell comprising, at least, a photoelectric conversion element having an amplification function, a first transistor, and a third element, wherein the photoelectric conversion element includes a first electrical signal output section and a second electrical signal output section, wherein the first transistor includes a first output section, a second output section, and a third control section that controls a current flowing between the first output section and the second output section or resistance between the first output section and the second output section, wherein the third element includes, at least, a seventh input section, and an eighth output section, wherein the second electrical signal output section of the photoelectric conversion element has to the first electrical signal output section a potential difference polarity that permits conduction of an electrical signal current from or to the first electrical signal output section and another potential difference polarity that permits less conduction of the electrical signal current from or to the first electrical signal output section, wherein the current flowing between the first output section and the second output section in the first transistor or the resistance between the first output section and the second output section in the first transistor is mainly controlled by a voltage or a current between the third control section and the second output section, wherein the second electrical signal output section is connected to the second output section of the first transistor, wherein the first output section of the first transistor is connected to the seventh input section of the third element, wherein the eighth output section of the third element serves as a third cell output section, wherein the third control section of the first transistor serves as a first cell selection section, wherein an electrical signal of the photoelectric conversion cell is read from the third cell output section by driving the third cell output section in a potential direction in which the third element becomes conductive, and by driving the first cell selection section in a potential direction of the potential difference polarity that permits conduction of the electrical signal current, and wherein the electrical signal of the photoelectric conversion cell is blocked from the third cell output section by driving the first cell selection section in a direction opposite to the potential direction of the potential difference polarity that permits conduction of the electrical signal current, or the electrical signal of the photoelectric conversion cell is blocked from the third cell output section regardless of the potential of the first cell selection section by driving the third cell output section in a potential direction that causes the third element to be non-conductive.

5. The photoelectric conversion cell according to one of claims 1, 2, 3, and 4, wherein the photoelectric conversion element having the amplification function comprises, at least, a first semiconductor region having a first surface and a first conductivity type, one or plural second semiconductor regions, each having a second surface, and a conductivity type opposite to the first conductivity type, and provided on or in the first surface of the first semiconductor region, and one or plural third semiconductor regions, each having a third surface and the first conductivity type, each third semiconductor region provided on or in the second surface of each of the one or plural second semiconductor regions, wherein if the number of second semiconductor regions is plural, each of the second semiconductor regions, excluding at least one second semiconductor region, is electrically connected to one of the one or plural third semiconductor regions that is not provided therewithin, wherein if the number of third semiconductor regions is plural, each of the third semiconductor regions, excluding at least one third semiconductor region, is electrically connected to one of the one or plural second semiconductor regions on or in which the each of the third semiconductor regions is not provided, and wherein the first semiconductor region serves as the first electrical signal output section, and the excluded one third semiconductor region serves as the second electrical signal output section.

6. The photoelectric conversion cell according to one of claims 1, 2, 3, and 4, wherein the photoelectric conversion element having the amplification function, comprises, at least, a first semiconductor region having a first surface and a first conductivity type, a second semiconductor region having a second surface, and a conductivity type opposite to the first conductivity type, and provided on or in the first surface of the first semiconductor region, a third semiconductor region having a third surface and the first conductivity type, and provided on or in the second surface of the second semiconductor region, and a channel formation region that bridges between the first semiconductor region and the third semiconductor region in the second semiconductor region, wherein the first semiconductor region serves as the first electrical signal output section and the third semiconductor region servers as the second electrical signal output section.

7. The photoelectric conversion cell according to claim 1, comprising, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of each of the one or plural second semiconductor regions, a seventh semiconductor region having a seventh surface and the conductivity type opposite to the first conductivity type, and spaced apart from the one or plural second semiconductor regions, on or in the first surface of the first semiconductor region, an eighth semiconductor region having an eighth surface and the opposite conductivity type, and spaced apart from the second and seventh semiconductor regions and opposed to the seventh semiconductor region along the first surface, on or in the first surface of the first semiconductor region, and a first gate insulating film having at least part thereof arrange on or in the first surface interposed between the seventh semiconductor region and the eighth semiconductor region, and a first gate that bridges between the seventh semiconductor region and the eighth semiconductor region on the first gate insulating film, wherein the one or plural third semiconductor regions, each excluding one third semiconductor region, is electrically connected to one of the one or plural second semiconductor regions not provided therewithin, wherein one of the one or plural second semiconductor regions not electrically connected to the third semiconductor region forms a main photoelectric conversion junction with the first semiconductor region, wherein the one third semiconductor region not connected to the second semiconductor region is electrically connected to the seventh semiconductor region, wherein the eighth semiconductor region serves as the first cell output section of the photoelectric conversion cell, and wherein the first gate serves as the first cell selection section.

8. The photoelectric conversion cell according to claim 2, comprising, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of each of the one or plural second semiconductor regions, a seventh semiconductor region having a seventh surface and the conductivity type opposite to the first conductivity type, and spaced apart from the one or plural second semiconductor regions on or in the first surface of the first semiconductor region, an eighth semiconductor region having an eighth surface and the opposite conductivity type, and spaced apart from the seventh semiconductor region and opposed to the seventh semiconductor region on or in the first surface of the first semiconductor region, a first gate insulating film having at least part thereof formed on or in the first surface interposed between the seventh semiconductor region and the eighth semiconductor region, and a first gate that bridges between the seventh semiconductor region and the eighth semiconductor region on the first gate insulating film, a ninth semiconductor region having a ninth surface and the conductivity type opposite to the first conductivity type, and spaced apart from the second, seventh, and eighth semiconductor regions on or in the first surface of the first semiconductor region, a tenth semiconductor region having a tenth surface and the opposite conductivity type, and spaced apart from the second, eighth, and ninth semiconductor regions and opposed to the ninth semiconductor region on or in the first surface of the first semiconductor region, and a second gate insulating film having at least part thereof formed on or in the first surface interposed between the ninth semiconductor region and the tenth semiconductor region, and a second gate that bridges between the ninth semiconductor region and the tenth semiconductor region on the second gate insulating film, wherein the one or plural third semiconductor regions, each excluding one third semiconductor region, is electrically connected to one of the one or plural second semiconductor regions not provided therewithin, wherein one of the one or plural second semiconductor regions not electrically connected to the third semiconductor region forms a main photoelectric conversion junction with the first semiconductor region, wherein the excluded one third semiconductor region not connected to the second semiconductor region is electrically connected to the eighth semiconductor region, wherein the seventh semiconductor region is electrically connected to the tenth semiconductor region, wherein the ninth semiconductor region serves as the second output section of the photoelectric conversion cell, and wherein the first gate serves as the first cell selection section and the second gate serves as the second cell selection section.

9. The photoelectric conversion cell according to claim 3, comprising, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of each of the one or plural second semiconductor regions, a fourth semiconductor region having a fourth surface and the opposite conductivity type, and spaced apart from the one or plural second semiconductor regions on or in the first surface of the first semiconductor region, fifth and sixth semiconductor regions having the first conductivity type, and spaced apart from each other on or in the fourth surface of the fourth semiconductor region, a fourth gate insulating film having at least part thereof formed on or in the fourth surface of the fourth semiconductor region interposed between the fifth semiconductor region and the sixth semiconductor region, and a fourth gate that bridges between the fifth semiconductor region and the sixth semiconductor region on the fourth gate insulating film, a seventh semiconductor region having a seventh surface and the conductivity type opposite to the first conductivity type, and spaced apart from the second and fourth semiconductor regions on or in the first surface of the first semiconductor region, an eighth semiconductor region having an eighth surface and the opposite conductivity type, and spaced apart from the second, fourth, and seventh semiconductor regions and opposed to the seventh semiconductor region along the first surface on or in the first surface of the first semiconductor region, and a first gate insulating film having at least part thereof formed on or in the first surface interposed between the seventh semiconductor region and the eighth semiconductor region, and a first gate that bridges between the seventh semiconductor region and the eight semiconductor region on the first gate insulating film, wherein the one or plural third semiconductor regions, each excluding one third semiconductor region, is electrically connected to one of the one or plural second semiconductor regions not provided therewithin, wherein one of the one or plural second semiconductor regions not electrically connected to the third semiconductor region forms a main photoelectric conversion junction with the first semiconductor region, wherein the one third semiconductor region not connected to the second semiconductor region is electrically connected to the fifth semiconductor region, wherein the sixth semiconductor region is electrically connected to the eighth semiconductor region, and wherein the seventh semiconductor region serves as the second cell output section of the photoelectric conversion cell, the first gate serves as the first cell selection section, and the fourth gate serves as the second cell selection section.

10. The photoelectric conversion cell according to claim 9, wherein the fourth semiconductor region is in continuous formation with the eighth semiconductor region.

11. The photoelectric conversion cell according to claim 9, wherein the eighth semiconductor region and the sixth semiconductor region are in contact with each other via an impurity concentration portion of a level equal to or higher than 2E19 atoms/cc.

12. The photoelectric conversion cell according to claim 4, comprising, at least, a first semiconductor region having a first surface and a first conductivity type, one or plural second semiconductor regions, each having a second surface, and a conductivity type opposite to the first conductivity type, and provided on or in the first surface of the first semiconductor region, one or plural third semiconductor regions, each having a third surface and the first conductivity type, each third semiconductor region provided on and/or in the second surface of each of the one or plural second semiconductor regions, an eleventh semiconductor region having an eleventh surface and the opposite conductivity type, and spaced apart from the one or plural second semiconductor regions on or in the first surface of the first semiconductor region, a twelfth semiconductor region having a twelfth surface and the first conductivity type, and provided on or in the eleventh surface of the eleventh semiconductor region, a seventh semiconductor region having a seventh surface and the opposite conductivity type, and spaced apart from the one or plural second semiconductor regions on or in the first surface of the first semiconductor region, an eighth semiconductor region having an eighth surface and the opposite conductivity type, and spaced apart from the one or plural second semiconductor regions, the seventh semiconductor region, and the eleventh semiconductor region, and opposed to the seventh semiconductor region along the first surface, on or in the first surface of the first semiconductor region, and a first gate insulating film having at least part thereof formed on or in the first surface interposed between the seventh semiconductor region and the eighth semiconductor region, and a first gate that bridges between the seventh semiconductor region and the eight semiconductor region on the first gate insulating film, wherein the one or plural second semiconductor regions, each excluding at least one second semiconductor region, is electrically connected to one of the one or plural third semiconductor regions not provided therewithin, wherein the one or plural third semiconductor regions, each excluding at least one third semiconductor region, is electrically connected to one of the one or plural second semiconductor regions not provided therewithin, wherein the one third semiconductor region is electrically connected to the eighth semiconductor region, wherein the seventh semiconductor region is electrically connected to the eleventh semiconductor region, wherein the first gate serves as the first cell selection section, and wherein the twelfth semiconductor region serves as the third cell selection section.

13. The photoelectric conversion cell according to claim 12, wherein the seventh semiconductor region is in contact with the eleventh semiconductor region.

14. A photoelectric conversion array comprising, at least, a plurality of first selection lines extending in a first direction, a plurality of first output lines extending in a second direction intersecting the first direction, and a plurality of photoelectric conversion cells according to claim 1, wherein each of the photoelectric conversion cells includes the first cell selection section and the first cell output section, wherein the plurality of photoelectric conversion cells are arranged in the first direction and the second direction, wherein first cell selection sections of the plurality of photoelectric conversion cells arranged in a row in the first direction are respectively connected to one of the plurality of first selection lines, and wherein first cell output sections of the plurality of photoelectric conversion cells arranged in a column in the second direction are respectively connected to one of the plurality of first output lines.

15. A photoelectric conversion array comprising, at least, a plurality of first selection lines extending in a first direction, a plurality of second selection lines extending in a second direction intersecting the first direction, at least one second output line, and a plurality of photoelectric conversion cells according to claim 2, wherein each of the photoelectric conversion cells includes the first cell selection section, the second cell selection section, and the second cell output section, wherein the plurality of photoelectric conversion cells are arranged in the first direction and the second direction, wherein first cell selection sections of the plurality of photoelectric conversion cells arranged in a row in the first direction are respectively connected to one of the plurality of first selection lines, wherein second cell selection sections of the plurality of photoelectric conversion cells arranged in a column in the second direction are respectively connected to one of the plurality of second selection lines, and wherein second output sections of the photoelectric conversion cell are respectively connected to one of the at least one second output line.

16. A photoelectric conversion array comprising, at least, a plurality of first selection lines extending in a first direction, a plurality of second selection lines extending in a second direction intersecting the first direction, at least one second output line, and a plurality of photoelectric conversion cells according to claim 3, wherein each of the photoelectric conversion cells includes the first cell selection section, the second cell selection section, and the second cell output section, wherein the plurality of photoelectric conversion cells are arranged in the first direction and the second direction, wherein first cell selection sections of the plurality of photoelectric conversion cells arranged in a row in the first direction are respectively connected to one of the plurality of first selection lines, wherein second cell selection section of the plurality of photoelectric conversion cells arranged in a column in the second direction are respectively connected to one of the plurality of second selection lines, and wherein second output sections of the photoelectric conversion cell are respectively connected to one of the at least one second output line.

17. A photoelectric conversion array comprising, at least, a plurality of first selection lines extending in a first direction, a plurality of third output lines extending in a second direction intersecting the first direction, and a plurality of photoelectric conversion cells according to claim 4, wherein each of the photoelectric conversion cells includes the first cell selection section and the third cell output section, wherein the plurality of photoelectric conversion cells are arranged in the first direction and the second direction, wherein first cell selection sections of the plurality of photoelectric conversion cells arranged in a row in the first direction are respectively connected to one of the plurality of first selection lines, and wherein third cell output sections of the plurality of photoelectric conversion cells arranged in a column in the second direction are respectively connected to one of the plurality of third output lines.

18. A reset circuit comprising a plurality of sixth transistors, wherein the sixth transistor is a field-effect transistor and includes two outputs (a source and a drain), and a gate, wherein one of the outputs is connected to one of the plurality of first output lines of the photoelectric conversion array according to claim 14, and the other output is supplied with a reset potential, wherein a control potential to cause the sixth transistor to turn off is applied to the gate of the sixth transistor at least when one of the first selection lines is transitioned from a first selection potential to a second selection potential, and wherein the first selection potential is a potential that blocks the electrical signal of the photoelectric conversion cell from the first cell output section, and the second selection potential is a potential that has a potential difference polarity in a direction that permits the electrical signal current of the photoelectric conversion element to flow easier than with the first selection potential.

19. A reset circuit comprising a plurality of fourth transistors and a single sixth transistor, wherein each of the fourth transistors is a field-effect transistor and includes two outputs (a source and a drain), and a gate, and the sixth transistor is a field-effect transistor and includes two outputs (a source and a drain), and a gate, wherein one of the outputs of each of the plurality of fourth transistors is connected to one of the plurality of first output lines of the photoelectric conversion array according to claim 14, and the other output of each of the plurality of fourth transistors is connected to an input of a sense amplifier, wherein one of the outputs of the sixth transistor is connected to the other output of each of the plurality of fourth transistors, wherein the other output of the sixth transistor is supplied with a reset voltage, wherein a control voltage pulse to successively turn off, on, and then off again the plurality of fourth transistors is successively applied to the gates of the fourth transistors, and wherein a control potential to cause the sixth transistor to turn off is applied to the gate of the sixth transistor at least when the fourth transistor is transitioned from off to on.

20. A reset circuit comprising at least one sixth transistor that is a field-effect transistor and includes two outputs (a source and a drain), and a gate, wherein one of the outputs of the at least one sixth transistor is connected to the at least one second output line of the photoelectric conversion array according to one of claims 15 and 16, and the other output of the at least one sixth transistor is supplied with a reset potential, wherein a control potential that turns off the sixth transistor is applied to the gate of the sixth transistor when one of the first selection lines transitions from a first selection potential to a second selection potential with at least the second selection line at a fourth selection potential in the photoelectric conversion array, or when one of the second selection lines transitions from a third selection potential to the fourth selection potential with the first selection line at the second selection potential in the photoelectric conversion array, wherein the first selection potential is a potential that blocks the electrical signal of the photoelectric conversion cell from the second cell output section, and the second selection potential is a potential that has a potential difference polarity in a direction that permits the electrical signal current of the photoelectric conversion element to flow easier than with the first selection potential, and wherein the third selection potential is a potential that causes the second transistor to be non-conductive, and the fourth selection potential is a potential that is in a direction that causes the second transistor to be conductive.

21. An electrical signal sense control circuit, comprising
a connection circuit,
a non-selected output potential setting circuit, and
a selected output potential setting circuit, wherein the connection circuit is arranged between the plurality of third output lines of the photoelectric conversion array according to claim 17 and an input of a sense amplifier, wherein the connection circuit becomes a low resistance between one third output line selected from among the plurality of third output lines and the input of the sense amplifier and a high resistance between each of the other third output lines and the input of the sense amplifier, wherein the non-selected output potential setting circuit is arranged between the plurality of third output lines and fifth potential supply means, wherein the non-selected output potential setting circuit becomes a high resistance between the one third output line selected from among the plurality of third output lines and the fifth potential supply means, and supplies a fifth potential to a third output line not selected, wherein the selected output potential setting circuit is arranged between the connection circuit at the sense amplifier side and sixth potential supply means, wherein the selected output potential setting circuit becomes a high resistance at least when one of the plurality of first selection lines of the photoelectric conversion array transitions from a first selection potential to a second selection potential, and wherein the first selection potential is a potential that blocks the electrical signal of the photoelectric conversion cell from the third cell output section, and the second selection potential is a potential that has a potential difference polarity in a direction that permits the electrical signal current of the photoelectric conversion element to flow easier than with the first selection potential.

22. An electrical signal sense control circuit, comprising
a connection circuit,
a non-selected output potential setting circuit, and
a selected output potential setting circuit, wherein the connection circuit is arranged between the plurality of first output lines of the photoelectric conversion array according to claim 14 and an input of a sense amplifier, wherein the connection circuit becomes a low resistance between one first output line selected from among the plurality of first output lines and the input of the sense amplifier and a high resistance between each of the other first output lines and the input of the sense amplifier, wherein the non-selected output potential setting circuit is arranged between the plurality of first output lines and fifth potential supply means, wherein the non-selected output potential setting circuit becomes a high resistance between the one first output line selected from among the plurality of first output lines and the fifth potential supply means, and supplies a fifth potential to a first output line not selected, wherein the selected output potential setting circuit is arranged between the connection circuit at the sense amplifier side and sixth potential supply means, wherein the selected output potential setting circuit becomes a high resistance at least when one of the plurality of first selection lines of the photoelectric conversion array transitions from a first selection potential to a second selection potential, and wherein the first selection potential is a potential that blocks the electrical signal of the photoelectric conversion cell from the first cell output section, and the second selection potential is a potential that has a potential difference polarity in a direction that permits the electrical signal current of the photoelectric conversion element to flow easier than with the first selection potential.

23. The electrical signal sense control circuit according to one of claims 21 and 22, wherein the connection circuit comprises a plurality of fourth transistors, wherein each of the plurality of fourth transistors is a field-effect transistor, and has two outputs (a source and a drain) with one of the two outputs being connected to each of the plurality of third output lines or each of the plurality of first output lines, and with the other output being connected to an input of a sense amplifier, wherein the non-selected output potential setting circuit includes a plurality of fifth transistors, wherein each of the plurality of fifth transistors has two outputs with one of the two outputs being connected to each of the plurality of third output lines and the other output being connected to fifth potential supply means, wherein the selected output potential setting circuit includes a sixth transistor, and wherein the sixth transistor is a field-effect transistor and has two outputs (a source and a drain), with one of the two outputs being connected to sixth potential supply means and the other of the two outputs being connected to the other of the outputs of each of the plurality of fourth transistors.

* * * * *